（12) United States Patent
Nienhuys et al.

(10) Patent No.: US 11,984,236 B2
(45) Date of Patent: May 14, 2024

(54) RADIATION SYSTEM

(71) Applicant: ASML NETHERLANDS B.V., Veldhoven (NL)

(72) Inventors: Han-Kwang Nienhuys, Veldhoven (NL); Rilpho Ludovicus Donker, Eindhoven (NL); Gosse Charles De Vries, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 657 days.

(21) Appl. No.: 16/743,025

(22) Filed: Jan. 15, 2020

(65) Prior Publication Data

US 2020/0152345 A1    May 14, 2020

Related U.S. Application Data

(63) Continuation of application No. 15/549,132, filed as application No. PCT/EP2016/053216 on Feb. 16, 2016, now Pat. No. 10,580,546.

(30) Foreign Application Priority Data

Mar. 2, 2015 (EP) .................................. 15157192
May 22, 2015 (EP) .................................. 15168832
Oct. 14, 2015 (EP) .................................. 15189676

(51) Int. Cl.
*G03F 7/00* (2006.01)
*G02B 5/02* (2006.01)
(Continued)

(52) U.S. Cl.
CPC ........... *G21K 1/067* (2013.01); *G02B 5/0221* (2013.01); *G02B 5/0268* (2013.01);
(Continued)

(58) Field of Classification Search
CPC ............ G21K 1/067; G21K 2201/064; G02B 5/0221; G02B 5/0268; G02B 5/0284;
(Continued)

(56) References Cited

U.S. PATENT DOCUMENTS 2,804,801 A    9/1957    Mihalakis
3,063,339 A    11/1962   Mihalakis et al.
(Continued)

FOREIGN PATENT DOCUMENTS

DE    10 2012 204 142    3/2013
DE    10 2012 210 256    6/2013
(Continued)

OTHER PUBLICATIONS

English translation of DE102013223808, published Dec. 11, 2014. (Year: 2014).*
(Continued)

*Primary Examiner* — Christina A Riddle
(74) *Attorney, Agent, or Firm* — Pillsbury Winthrop Shaw Pittman, LLP

(57) ABSTRACT

A radiation system includes a beam splitting apparatus configured to split a main radiation beam into a plurality of branch radiation beams and a radiation alteration device arranged to receive an input radiation beam and output a modified radiation beam, wherein the radiation alteration device is configured to provide an output modified radiation beam which has an increased etendue, when compared to the received input radiation beam, wherein the radiation alteration device is arranged such that the input radiation beam which is received by the radiation alteration device is a main radiation beam and the radiation alteration device is configured to provide a modified main radiation beam to the beam splitting apparatus, or wherein the radiation alteration device is arranged such that the input radiation beam which is
(Continued)

received by the radiation alteration device is a branch radiation beam output from the beam splitting apparatus.

20 Claims, 29 Drawing Sheets

(51) Int. Cl.
G21K 1/06 (2006.01)
H01S 3/23 (2006.01)
H05G 2/00 (2006.01)

(52) U.S. Cl.
CPC ......... G02B 5/0284 (2013.01); G03F 7/7005 (2013.01); G03F 7/70075 (2013.01); G03F 7/70991 (2013.01); G03F 7/70191 (2013.01); G21K 2201/064 (2013.01); H01S 3/2308 (2013.01); H05G 2/008 (2013.01)

(58) Field of Classification Search
CPC .. G02B 5/0891; G02B 5/1861; G02B 5/0215; H01S 3/2308; H05G 2/008; G03F 7/7005; G03F 7/70075; G03F 7/70991; G03F 7/70191; G03F 7/2002; G03F 7/2008; G03F 7/201; G03F 7/70; G03F 7/70008; G03F 7/70025; G03F 7/70033; G03F 7/70058; G03F 7/70083; G03F 7/70091; G03F 7/70108; G03F 7/70116; G03F 7/70125; G03F 7/70141; G03F 7/7015–70183; G03F 7/702; G03F 7/70208; G03F 7/7055; G03F 7/70558; G03F 7/70575; G03F 7/70583; G03F 7/70941; G03F 7/7095; G03F 7/70958
USPC .......... 355/18, 30, 52–55, 67–77; 250/492.1, 250/492.2, 492.22, 492.23, 493.1, 494.1, 250/503.1, 504 R, 505.1
See application file for complete search history.

(56) References Cited

U.S. PATENT DOCUMENTS

| 4,241,980 | A | 12/1980 | Mihalakis et al. |
| 5,320,918 | A | 6/1994 | Raab et al. |
| 5,439,781 | A | 8/1995 | MacDoweli et al. |
| 6,034,817 | A | 3/2000 | Mihalakis |
| 6,498,351 | B1 * | 12/2002 | Kruizinga ............... G03F 7/702 250/492.1 |
| 6,927,887 | B2 * | 8/2005 | Naulleau ............ G03F 7/70158 359/223.1 |
| 7,023,953 | B2 | 4/2006 | Komatsuda |
| 7,054,068 | B2 | 5/2006 | Yoshida et al. |
| 7,326,948 | B2 | 2/2008 | Botma |
| 7,329,886 | B2 | 2/2008 | Singer et al. |
| 7,800,734 | B2 * | 9/2010 | Komatsuda ........ G02B 19/0095 355/53 |
| 7,948,678 | B1 | 5/2011 | Poulsen |
| 8,579,492 | B2 | 11/2013 | Epstein et al. |
| 9,134,613 | B2 | 9/2015 | Schneider et al. |
| 9,835,950 | B2 | 12/2017 | Eurlings et al. |
| 2003/0002022 | A1 * | 1/2003 | Schultz .................. G03F 7/702 355/71 |
| 2003/0058553 | A1 | 3/2003 | Epstein et al. |
| 2004/0256575 | A1 | 12/2004 | Singer et al. |
| 2004/0263811 | A1 | 12/2004 | Minnaert-Janssen et al. |
| 2005/0206869 | A1 * | 9/2005 | Voorma .............. G03F 7/70558 355/53 |
| 2007/0090278 | A1 | 4/2007 | Botma |
| 2008/0138013 | A1 | 6/2008 | Parriaux |
| 2008/0193721 | A1 | 8/2008 | Ukelis |
| 2009/0289205 | A1 | 11/2009 | Moriya et al. |
| 2010/0053785 | A1 | 3/2010 | Nishi |
| 2010/0103676 | A1 | 4/2010 | Noeth |
| 2011/0242515 | A1 | 10/2011 | Ceglio et al. |
| 2012/0262688 | A1 | 10/2012 | De Vries et al. |
| 2012/0262690 | A1 | 10/2012 | De Boeij et al. |
| 2014/0043595 | A1 | 2/2014 | Ceglio et al. |
| 2014/0362361 | A1 | 12/2014 | Patra |
| 2015/0124233 | A1 | 5/2015 | Patra |
| 2015/0370180 | A1 | 12/2015 | Del Puerto et al. |
| 2017/0016594 | A1 | 1/2017 | Di Trapani et al. |

FOREIGN PATENT DOCUMENTS

| DE | 10 2013 202 949 | 5/2014 | |
| DE | 10 2013 223 808 | 12/2014 | |
| DE | 102013223808 A1 * | 12/2014 | ........... G02B 5/0891 |
| EP | 10 627 667 | 12/1994 | |
| EP | 0403561 | 4/1995 | |
| EP | 1 058 156 | 12/2000 | |
| GB | 2217036 | 10/1989 | |
| JP | H06235797 | 8/1994 | |
| JP | 2000221406 | 8/2000 | |
| JP | 2005235999 | 9/2005 | |
| JP | 2010062281 | 3/2010 | |
| JP | 2012227526 | 11/2012 | |
| NL | 2013014 | 12/2014 | |
| TW | 201131315 | 9/2011 | |
| TW | 201432392 | 8/2014 | |
| WO | 2014/139815 | 9/2014 | |
| WO | WO-2014139815 A1 * | 9/2014 | ......... G03F 7/70033 |
| WO | 2014/202585 | 12/2014 | |

OTHER PUBLICATIONS

Taiwanese Office Action issued in corresponding Taiwanese Patent Application No. 105106205, dated Nov. 25, 2019.
International Search Report and Written Opinion mailed Sep. 15, 2016 in corresponding International Patent Application No. PCT/EP2016/053216.
Chinese Office Action issued in corresponding Chinese PCT Patent Application No. 201680013084.X, dated Jun. 19, 2019.
Japanese Office Action issued in corresponding Japanese Patent Application No. 2017-541094, dated Nov. 29, 2019.

* cited by examiner

RADIATION SYSTEM

This application is a continuation of co-pending U.S. patent application Ser. No. 15/549,132, filed on Aug. 4, 2017, which is the U.S. national phase entry of PCT patent application no. PCT/EP2016/053216, filed on Feb. 16, 2016, which claims priority to European patent application nos. EP 15157192.4, filed on Mar. 2, 2015, EP 15168832.2, filed on May 22, 2015, and EP 15189676.8, filed on Oct. 14, 2015, each of the foregoing applications is incorporated herein in its entirety by reference.

FIELD

The present description relates to a radiation system. In particular, but not exclusively, the radiation system may form part of a lithographic system comprising at least one lithographic apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

A lithographic apparatus may be provided with EUV radiation from a radiation system. It is an object of an embodiment of the present invention to obviate or mitigate at least one problem of prior art techniques.

SUMMARY

According a first aspect of the invention there is provided a radiation system comprising a beam splitting apparatus configured to receive a main radiation beam and split the main radiation beam into a plurality of branch radiation beams and a radiation alteration device arranged to receive an input radiation beam and output a modified radiation beam, wherein the radiation alteration device is configured to provide an output modified radiation beam which has an increased etendue, when compared to the received input radiation beam, wherein the radiation alteration device is arranged such that the input radiation beam which is received by the radiation alteration device is a main radiation beam and the radiation alteration device is configured to provide a modified main radiation beam to the beam splitting apparatus, or wherein the radiation alteration device is arranged such that the input radiation beam which is received by the radiation alteration device is a branch radiation beam output from the beam splitting apparatus.

The radiation alteration device may act as an optical diffuser and may diffuse the input radiation beam. The radiation alteration device may be positioned upstream or downstream of the beam splitting apparatus. That is, the radiation alteration device may alter a radiation beam prior to providing the main radiation beam to a beam splitting apparatus or the radiation alteration device may alter a branch radiation beam which is formed at the beam splitting apparatus. Some embodiments may include more than one radiation alteration device. For example, a first radiation alteration device may be arranged to alter a radiation beam prior to providing the radiation beam to the beam splitting apparatus and a second radiation alteration device may be arranged to alter a branch radiation beam which is formed at the beam splitting apparatus. Some embodiments may include a radiation alteration device for each branch radiation beam.

The radiation alteration device may be configured to increase the etendue of the radiation beam such that the modified radiation beam which is output from the radiation alteration device has an etendue which is greater than at least 10 times the etendue of the input radiation beam which is received by the radiation alteration device.

The radiation alteration device may be configured to increase the etendue of the EUV radiation beam such that the modified radiation beam which is output from the radiation alteration device has an etendue which is greater than at least $1 \times 10^4$ times the etendue of the input radiation beam which is received by the radiation alteration device.

The beam splitting apparatus may comprise a plurality of reflective facets, each reflective facet being arranged to receive a portion of the main radiation beam and reflect the portion of the main radiation beam so as to form a branch radiation beam.

The radiation alteration device may be configured to increase the spatial homogeneity of the intensity profile of the output modified radiation beam, when compared to the input received radiation beam.

The radiation system may further comprise one or more focusing optics configured to form an image of the output modified radiation beam in a far field plane.

The radiation alteration device may be arranged such that the input radiation beam which is received by the radiation alteration device is a branch radiation beam output from the beam splitting apparatus and wherein the one or more focusing optics are configured to form an image of the output modified main radiation beam in a far field plane which is situated inside a lithographic apparatus.

The radiation alteration device may be arranged such that the input radiation beam which is received by the radiation alteration device is a main radiation beam and the radiation alteration device is configured to provide a modified main radiation beam to the beam splitting apparatus and wherein the one or more focusing optics are configured to form an image of the output modified main radiation beam in a far field plane which is situated at or near to the beam splitting apparatus.

The radiation alteration device may comprise a tube having a first opening arranged to receive the input radiation beam and a second opening arranged to output the modified radiation beam, wherein the tube is defined by a substantially reflective internal surface, and wherein the internal surface is arranged so as to cause the radiation beam which enters the tube through the first opening to undergo multiple successive reflections at the internal surface, thereby modifying the radiation beam before the modified radiation beam exits the tube through the second opening.

The radiation alteration device may comprise a plurality of reflective facets each arranged to receive and reflect a portion of the input radiation beam, so as to form a plurality of sub-beams reflected from the plurality of reflective facets and wherein the plurality of reflective facets are arranged to direct the sub-beams to form the output modified radiation beam.

The radiation alteration device may comprise a first diffusing element comprising a first roughened reflective surface, a second diffusing element comprising a second roughened reflective surface and one or more actuators configured to move the first and/or second diffusing elements so as to cause movement of the first and/or the second roughened reflective surfaces, wherein the first roughened reflective surface is configured to receive the input radiation beam and reflect the radiation beam so as to be incident on the second roughened reflective surface and wherein the second roughened reflective surface is arranged to reflect the radiation beam received from the first roughened reflective surface so as to form the output modified radiation beam.

The radiation alteration device may comprise a continuously undulating reflective surface arranged to receive and reflect the input radiation beam, wherein the shape of the continuously undulating reflective surface follows a substantially periodic pattern.

The radiation system may further comprise a radiation source configured to emit EUV radiation, wherein the main radiation beam comprises at least a portion of the EUV radiation emitted by the radiation source.

The radiation source may comprise at least one free electron laser.

The radiation system may further comprise beam expanding optics configured to expand the cross-section of the main radiation beam, prior to providing the main radiation beam to the beam splitting apparatus.

The radiation system may further comprise directing optics configured to direct at least one of the branch radiation beams to a respective lithographic apparatus.

The radiation system may comprise a plurality of radiation alteration devices and wherein each of the plurality of radiation alteration devices is arranged such that an input radiation beam which is received by each of the radiation alteration devices is one of the branch radiation beams output from the beam splitting apparatus.

According to a second aspect of the invention there is provided a radiation system comprising a radiation source configured to emit EUV radiation and a radiation alteration device comprising a tube having a first opening arranged to receive an EUV radiation beam and a second opening arranged to output the EUV radiation beam, wherein the EUV radiation beam which enters the radiation alteration device comprises at least a portion of the EUV radiation emitted by the radiation source, wherein the tube is defined by an internal surface which is substantially reflective to EUV radiation, and wherein the internal surface is arranged so as to cause the EUV radiation beam which enters the tube through the first opening to undergo multiple successive reflections at the internal surface, thereby modifying the EUV radiation beam before the EUV radiation beam exits the tube through the second opening.

The radiation alteration device advantageously modifies the EUV radiation beam. The EUV radiation beam, which is output from the radiation alteration device, may, for example, be provided to a lithographic apparatus. The radiation alteration device may modify the EUV radiation beam such that the radiation beam which is output from the radiation alteration device provides advantageous effects when provided to a lithographic apparatus. Alternatively, the EUV radiation beam which is output from the radiation alteration device may be provided to a beam splitting apparatus which is configured to split the EUV radiation beam into a plurality of branch radiation beams.

The tube may include a bend.

The bend may advantageously increase the range of grazing angles at which the EUV radiation is incident on the internal surface of the tube. The bend may be a stepped bend or may be a continuous bend such that the tube is curved.

A bend angle of the bend in the tube may be less than about 5 degrees.

The amount of radiation which is absorbed during reflection of the EUV radiation at the internal surface may increase with increases in the grazing angle with which the EUV radiation is incident on the internal surface. Restricting the bend angle to less than about 5 degrees may advantageously limit the grazing angle with which the EUV radiation is incident on the internal surface and may therefore limit the amount of radiation which is absorbed during reflection of the EUV radiation at the internal surface.

The bend in the tube may be configured such that there is no direct line of sight through the radiation alteration device.

The cross-sectional shape of the internal surface of the tube may be a polygon.

The cross-sectional shape of the internal surface of the tube may be a rectangle.

The cross-sectional shape of the internal surface of the tube may be a square.

The cross-sectional shape of the internal surface of the tube may be a hexagon.

The tube may comprise a first section and a second section arranged to receive EUV radiation from the first section, wherein the first and second sections are arranged to form a gap between the first and second sections through which gas may enter or leave the tube.

Gas which enters and leaves the tube may advantageously serve to clean contamination from the internal surface of the tube.

The first and second sections may be arranged such that EUV radiation which enters the tube through the first opening does not exit the tube through the gap.

Preventing radiation from exiting the tube through the gap prevents loss of radiation from the EUV radiation beam through the gap.

The radiation system may further comprise a gas supply configured to inject gas into the tube through the gap.

The gas supply may be configured to inject hydrogen into the tube through the gap.

The radiation system may further comprise an actuator operable to actuate the tube so as to cause the tube to undergo an oscillatory motion.

Forcing the tube to undergo an oscillatory motion advantageously causes temporal scrambling of the radiation which is output from the radiation alteration device.

The actuator may be operable to actuate the tube so as to cause the tube to undergo an oscillatory motion having a frequency which is greater than about 1 kHz.

The radiation system may further comprise one or more optical elements arranged to receive EUV radiation emitted from the radiation source and direct the EUV radiation beam, formed of at least a portion of the EUV radiation emitted by the radiation source, to enter the radiation alteration device through the first opening of the radiation alteration device.

The one or more optical elements may include at least one focusing optic configured to alter the divergence of the EUV radiation beam such that the EUV radiation beam which enters the radiation alteration device has a non-zero divergence.

Altering the divergence of the EUV radiation beam such that the EUV radiation beam enters the radiation alteration device having a non-zero divergence ensures that at least some of the EUV radiation is incident on the internal surface of the radiation alteration device and undergoes reflection at the internal surface. The EUV radiation beam may enter the radiation alteration device having a positive divergence such that the EUV radiation diverges towards the internal surface. Alternatively, the EUV radiation beam may enter the radiation alteration device having a negative divergence such that the radiation beam is focused to a focal point which is situated inside the radiation alteration device. The EUV radiation beam may then have a positive divergence after the focal point such that the EUV radiation diverges towards the internal surface.

The radiation alteration device may have a length L between the first and second openings, the second opening may have a diameter D and the at least one focusing optic may be configured to alter the divergence of the EUV radiation beam such that the EUV radiation beam is provided to the radiation alteration device with a half divergence $\theta$. The radiation alteration device and the at least one focusing optic may be configured such that B$\theta$D is greater than or equal to about 10.

Configuring the radiation alteration device and the at least one focusing optic such that B$\theta$D is greater than or equal to about 10 may advantageously ensure that the homogeneity of a spatial intensity profile of the EUV radiation beam is increased by a desirable amount for using the modified EUV radiation beam in a lithographic apparatus.

A half divergence of the EUV radiation beam may be less than about 100 milliradians.

A half divergence of the EUV radiation beam may be less than about 10 milliradians.

The at least one focusing optic may be configured to focus the EUV radiation beam to a focal point such that the EUV radiation beam is provided to the radiation alteration device with a positive divergence.

The tube may define an optical axis which extends along the cross-sectional center of the tube and extends into and out of the tube through the first and second openings. The at least one focusing optic may be configured to focus the EUV radiation beam to a focal point which does not lie on the optical axis.

Focusing the EUV radiation beam to a focal point which does not lie on the optical axis may advantageously increase the range of grazing angles at which EUV radiation is incident on the internal surface.

A line extending from the focal point to a position on the optical axis, at which the optical axis passes through the first opening, may form an off-axis angle with the optical axis. The off-axis angle may be approximately the same as or greater than a half-divergence of the EUV radiation beam.

The radiation alteration device may be configured to increase the etendue of the EUV radiation beam such that the EUV radiation beam which exits the radiation alteration device through the second opening of the radiation alteration device has an etendue which is greater than the etendue of the EUV radiation beam which enters the first opening of the radiation alteration device.

The radiation alteration device may be configured to increase the etendue of the EUV radiation beam such that the EUV radiation beam which exits the radiation alteration device through the second opening of the radiation alteration device has an etendue which is greater than at least 10 times the etendue of the EUV radiation beam which enters the first opening of the radiation alteration device.

The radiation alteration device may be configured to increase the etendue of the EUV radiation beam such that the EUV radiation beam which exits the radiation alteration device through the second opening of the radiation alteration device has an etendue which is greater than at least $1\times10^4$ times the etendue of the EUV radiation beam which enters the first opening of the radiation alteration device.

The radiation alteration device may be configured to provide a mapping of rays which form the EUV radiation beam from a first plane situated downstream of the first opening of the radiation alteration device to a second plane situated upstream of the second opening of the radiation alteration device, wherein the mapping serves to substantially scramble the cross-sectional position of the rays between the first plane and the second plane.

The radiation alteration device may be configured to reduce the spatial coherence of the EUV radiation beam.

Reducing the spatial coherence of the EUV radiation beam may advantageously prevent interference patterns (e.g. a speckle pattern) from forming in the EUV radiation beam.

The at least one focusing optic and the radiation alteration device may be configured such that different portions of the EUV radiation beam propagate along optical paths through the radiation alteration device having different path lengths, and wherein the range of different path lengths along which different portions of the EUV radiation beam propagate is greater than the coherence length of the EUV radiation beam.

The radiation alteration device may be configured to increase the spatial homogeneity of the intensity profile of the EUV radiation beam, such that the EUV radiation beam which exits the radiation alteration device through the second opening has a spatial intensity distribution which is more homogenous than the spatial intensity profile of the EUV radiation beam which enters the first opening of the radiation alteration device.

The radiation system may further comprise a beam splitting apparatus configured to receive the EUV radiation beam which exits the second opening of the radiation alteration device and split the EUV radiation beam into a plurality of branch radiation beams.

The beam splitting apparatus may comprise a plurality of reflective facets arranged to receive different portions of the cross-section of the EUV radiation beam which exits the second opening of the radiation alteration device and reflect the different portions of the cross-section in different directions.

The radiation system may further comprise at least one focusing optic configured to magnify the radiation beam which exits the second opening of the radiation alteration device onto the beam splitting apparatus, the magnification being such that the divergence of the radiation beam which is incident on the beam splitting apparatus is less than the divergence of the radiation beam which is output from the second opening of the radiation alteration device.

The radiation source may comprise at least one free electron laser operable to emit EUV radiation.

The radiation source may comprise a first free electron laser, a second free electron laser and a beam combination apparatus configured to combine EUV radiation emitted from the first free electron laser with radiation emitted from the second free electron laser to form a combined radiation beam, the combined radiation beam having a cross-section which includes a first portion formed from radiation emitted from the first free electron laser and a second portion formed from radiation emitted from the second free electron laser.

The radiation alteration device may be configured to receive the combined radiation beam and spatially scramble the combined radiation beam to form a scrambled combined radiation beam, the spatial scrambling being such that the spatially scrambled combined radiation beam includes overlap between radiation emitted from the first free electron laser and radiation emitted from the second free electron laser.

The spatial scrambling may be such that a variation in the power of radiation emitted by one or more of the first and second free electron lasers does not cause a substantial variation in a spatial distribution of power in the scrambled combined radiation beam which exits the radiation alteration device.

The radiation system may further comprise a beam splitting apparatus configured to receive a main radiation beam, wherein the main radiation beam comprises at least a portion of the EUV radiation emitted from the radiation source and wherein the beam splitting apparatus comprises a plurality of reflective facets arranged to receive different portions of the cross-section of the main radiation beam and reflect the different portions of the cross-section in different directions so as to form a plurality of branch radiation beams. The radiation alteration device may be arranged to receive one of the branch radiation beams through the first opening of the radiation alteration device.

The reflective facets may be arranged to receive different sectors of the cross-section of the main radiation beam and reflect the different sectors in different directions so as to split the main radiation beam into the plurality of branch radiation beams.

The radiation system may further comprise at least one focusing optic configured to focus the EUV radiation beam which exits the radiation alteration device to an intermediate focus.

The at least one focusing optic may be configured to focus the EUV radiation beam so as to form an image of the second opening of the radiation alteration device on a far-field plane disposed downstream of the intermediate focus.

The at least one focusing optic may comprise a first focusing optic configured to form an image of the second opening of the radiation alteration device at an image plane and a second focusing optic configured to form an image of the image plane on the far-field plane.

The first focusing optic may have a positive focusing power.

The second focusing optic may have a positive focusing power.

The first focusing optic and/or the second focusing optic may comprise a first reflective element and a second reflective element.

The first focusing optic and/or the second focusing optic may comprise a Wolter telescope.

The Wolter telescope may comprise a type-III Wolter telescope.

According to a third aspect of the invention there is provided a radiation system comprising a radiation source configured to emit EUV radiation and a radiation alteration device arranged to receive an EUV radiation beam comprising at least a portion of the EUV radiation emitted by the radiation source wherein the radiation alteration device comprises a plurality of reflective facets each arranged to receive and reflect a portion of the EUV radiation beam, so as to form a plurality of sub-beams reflected from the plurality of reflective facets and wherein the plurality of reflective facets are arranged to direct the sub-beams to form a modified EUV radiation beam, wherein the radiation alteration device is configured to provide the modified radiation beam to at least one lithographic apparatus.

The radiation alteration device advantageously modifies the EUV radiation beam. The EUV radiation beam which is output from the radiation alteration device may, for example, be provided to a lithographic apparatus. The radiation alteration device may modify the EUV radiation beam such that the radiation beam which is output from the radiation alteration device provides advantageous effects when provided to a lithographic apparatus. Alternatively, the EUV radiation beam which is output from the radiation alteration device may be provided to a beam splitting apparatus which is configured to split the EUV radiation beam into a plurality of branch radiation beams.

The modified EUV radiation beam which is formed by the radiation alteration may be equivalent to radiation emitted from a plurality of point sources. When viewed in a far-field location, the modified EUV radiation beam may be equivalent to radiation emitted from a planar high-etendue light source. The modified EUV radiation beam advantageously has a higher etendue than the etendue of the EUV radiation beam which is incident on the radiation alteration device. The radiation alteration device also serves to increase the homogeneity of a spatial intensity profile of the EUV radiation beam. That is, the spatial intensity profile of the modified EUV radiation beam in a far field location is more homogenous than the spatial intensity profile of the EUV radiation beam which is incident on the radiation alteration device.

The reflective facets may be configured to focus the sub-beams.

The reflective facets may comprise concave reflective surfaces.

The plurality of reflective facets may be arranged to focus the sub-beams to a plurality of focal points.

The plurality of focal points may lie in a plane of focal points.

The plurality of reflective facets may generally lie in a plane and the plane of focal points may be substantially parallel with the plane in which the reflective facets generally lie.

Each sub-beam may have an optical axis and the plane of focal points may be substantially perpendicular to the optical axes of the sub-beams.

The focal points may be substantially uniformly spaced in the plane of focal points.

Each of the reflective facets may have a focal length which is greater than a length of the radiation alteration device.

Each of the reflective facets may have a generally rectangular cross-section.

Each of the reflective facets may have a generally hexagonal cross-section.

The reflective facets may be arranged in a honeycomb lattice.

The reflective facets may be configured to direct the sub-beams such that the sub-beams overlap with each other in a far field plane.

The reflective facets may be configured to direct the sub-beams such that the sub-beams illuminated substantially the same area in the far field plane.

The reflective facets may have a concave shape.

The reflective facets may have a convex shape.

The radiation alteration device may comprise 16 or more reflective facets.

The radiation alteration device may comprise 64 or more reflective facets.

The radiation system may further comprise a beam splitting apparatus configured to receive the EUV radiation beam and split the EUV radiation beam into a plurality of branch radiation beams.

The beam splitting apparatus may be configured to split the EUV radiation emitted from the radiation source into a plurality of branch radiation beams and the radiation alteration device may be configured to receive and modify a branch radiation beam.

The radiation alteration device may be arranged to receive and modify the radiation emitted from the radiation source and provide the modified EUV radiation beam to the beam splitting apparatus.

The radiation system may further comprise a beam expanding optics configured to receive the EUV radiation beam from the radiation source, expand the cross-section of the radiation beam and provide the expanded radiation beam to the radiation alteration device.

The radiation system may further comprise directing optics, the directing optics being configured to receive a branch radiation beam from the beam splitting apparatus and direct the branch radiation beam to a lithographic apparatus.

According to a fourth aspect of the invention there is provided a radiation alteration device comprising a first diffusing element comprising a first roughened reflective surface, a second diffusing element comprising a second roughened reflective surface, and one or more actuators configured to move the first and/or second diffusing elements so as to cause movement of the first and/or the second roughened reflective surfaces, wherein the first roughened reflective surface is configured to receive a radiation beam and reflect the radiation beam so as to be incident on the second roughened reflective surface and wherein the second roughened reflective surface is arranged to reflect the radiation beam received from the first roughened reflective surface so as to form a modified radiation beam.

The one or more actuators may be configured to rotate the first and/or the second diffusing elements so as to cause rotation of the first and/or the second roughened reflective surfaces.

The one or more actuators may be configured to cause the first and/or the second roughened reflective surfaces to move at a speed of about 1 meter per second or more.

The second roughened reflective surface may be arranged approximately perpendicular to the first roughened reflective surface.

The first and/or the second roughened reflective surfaces may be arranged to receive radiation at a grazing incidence angle of about 5 degrees or less.

The first and/or the second roughened reflective surfaces may include indentations which cause the roughened reflective surface to deviate from a flat plane.

A maximum angle which the first and/or the second roughened reflective surfaces form with the flat plane, may be less than or equal to about 10 milliradians.

The first and second roughened reflective surfaces may each serve to introduce an angular spread into the radiation beam.

According to a fifth aspect of the invention there is provided a radiation alteration device comprising a continuously undulating reflective surface, wherein the shape of the continuously undulating reflective surface follows a substantially periodic pattern.

The shape of the continuously undulating reflective surface may follow a substantially periodic pattern in two perpendicular directions.

A unit cell of the periodic undulating reflective surface may comprise: a first portion having a substantially convex shape; a second portion having a substantially concave shape; a third portion having a substantially saddle shape; and a fourth portion having a substantially saddle shape.

The unit cell may comprise a single period of the periodic pattern in a first direction and a single period of the periodic pattern in a second direction perpendicular to the first direction.

The reflective surface may be shaped such within at least one of the first, second, third and fourth portions, the curvature of the reflective surface is substantially the same throughout the respective portion.

The reflective surface may be shaped such that within at least one of the first, second, third and fourth portions, the curvature of the reflective surface is different at different positions in the respective portion.

The reflective surface may be configured to receive a radiation beam and reflect the radiation beam so as to form a modified radiation beam and wherein, the reflective surface is shaped such that the modified radiation beam has an intensity distribution in a far field plane, the intensity distribution comprising an intensity maximum, wherein the intensity distribution decreases with increasing radial distance from the intensity maximum.

According to a sixth aspect of the invention there is provided a radiation system comprising a radiation source configured to emit EUV radiation, and a radiation alteration device according to the fifth or sixth aspect configured to receive a radiation beam comprising at least a portion of the EUV radiation emitted by the radiation source.

According to a seventh aspect of the invention there is provided a radiation system comprising a radiation source configured to emit EUV radiation, a first radiation alteration device configured to receive a main radiation beam and output a modified main radiation beam, wherein the main radiation beam comprises at least a portion of the EUV radiation emitted from the radiation source, a beam splitting apparatus comprising a plurality of reflective facets arranged to receive different portions of the cross-section of the main radiation beam and reflect the different portions of the cross-section in different directions so as to form a plurality of branch radiation beams and a second radiation alteration device configured to receive a branch radiation beam and output a modified branch radiation beam, wherein the first and second radiation alteration devices each comprise: a tube having a first opening arranged to receive EUV radiation and a second opening arranged to output EUV radiation and wherein the tube is defined by an internal surface which is substantially reflective to EUV radiation, and wherein the internal surface is arranged so as to cause the EUV radiation which enters the tube through the first opening to undergo multiple successive reflections at the internal surface, thereby modifying the EUV radiation before the EUV radiation exits the tube through the second opening; or a plurality of reflective facets each arranged to receive and reflect a portion of the EUV radiation, so as to form a plurality of sub-beams reflected from the plurality of reflective facets and wherein the plurality of reflective facets are arranged to direct the sub-beams to form a modified EUV radiation, or a first diffusing element comprising a first roughened reflective surface, a second diffusing element comprising a second roughened reflective surface and one or more actuators configured to move the first and/or second diffusing elements so as to cause movement of the first and/or the second roughened reflective surfaces, wherein the first roughened reflective surface is configured to receive an EUV radiation beam and reflect the EUV radiation beam so as to be incident on the second roughened reflective surface and wherein the second roughened reflective surface is arranged to reflect the EUV radiation beam received from the first roughened reflective surface so as to form a modified radiation beam.

The first and/or the second radiation alteration devices may include any of the features of the radiation alteration device according to any of the other aspects.

According to an eighth aspect of the invention there is provided a lithographic system comprising a radiation system according to any of the first to third aspects or the sixth or seventh aspects and a lithographic apparatus arranged to receive at least a portion of the EUV radiation beam which exits a radiation alteration device.

The lithographic apparatus may include an illumination system configured to condition at least a portion of the EUV radiation beam which exits the radiation alteration device, the illumination system including a facet mirror. The radiation system may comprise at least one focusing optic configured to focus the EUV radiation beam which is provided to the lithographic apparatus so as to form an image of the radiation beam output from the radiation alteration device onto the facet mirror, wherein the facet mirror comprises a plurality of reflective facets.

According to a ninth aspect of the invention there is provided a radiation alteration device suitable for use in a radiation system according to any of the first to third aspects or the fifth or sixth aspects or a lithographic system according to the eighth aspect.

According to a tenth aspect of the invention there is provided a beam splitting apparatus suitable for receiving a main radiation beam, the beam splitting apparatus comprising a plurality of reflective facets, wherein the reflective facets are arranged to receive different sectors of the cross-section of the main radiation beam and reflect the different sectors in different directions so as to split the main radiation beam into a plurality of branch radiation beams.

The beam splitting apparatus may further comprise one or more optical elements configured to combine branch radiation beams which correspond to radially opposite sectors of the main radiation beam so as to form a combined branch radiation beam.

The beam splitting apparatus may further comprise one or more focusing optics configured to receive the main radiation beam and expand the main radiation beam to form an annular ring of radiation, wherein the reflective facets are arranged to receive different sectors of the annular ring of radiation.

According to an eleventh aspect of the invention there is provided a beam splitting apparatus suitable for receiving a main radiation beam, the beam splitting apparatus comprising a plurality of groups of reflective facets, wherein each group of reflective facets comprises reflective facets arranged to receive different portions of the main radiation beam and reflect the different received portions to form a branch radiation beam comprising a combination of the different reflected portions, the plurality of groups of reflective facets thereby each forming a different branch radiation beam.

The beam splitting apparatus may be configured to receive a main radiation beam propagating substantially along a beam axis and wherein the reflective facets which form a group of reflective facets are situated at substantially the same location along the beam axis.

The groups of reflective facets may be situated at substantially the same location along the beam axis.

The reflective facets from different groups of reflective facets may be arranged adjacent to each other.

The adjacent reflective facets may be in contact with each other.

The beam splitting apparatus may be configured to receive a main radiation beam propagating substantially along a beam axis and wherein a plurality of reflective facets which form a group of reflective facets are separated from each other in a direction substantially perpendicular to the beam axis.

Each reflective facet of a group of reflective facets may comprise a reflective surface having substantially the same orientation.

The plurality of groups of reflective facets may comprise a first group of reflective facets and a second group of reflective facets wherein the arrangement of the second group of reflective facets is substantially the same as a rotation of the first group of reflective facets.

Each group of reflective facets may comprise an arrangement of reflective facets which is substantially the same as a rotation of an arrangement of reflective facets which forms another of the groups of reflective facets.

The beam splitting apparatus may be configured to receive a main radiation beam propagating substantially along a beam axis and wherein the rotation is a rotation substantially about the beam axis.

According to a twelfth aspect of the invention there is provided an optical system comprising a beam splitting apparatus according to the seventh aspect and a radiation alteration device configured to receive a branch radiation beam formed by the beam splitting apparatus, wherein the radiation alteration device comprises: a tube having a first opening arranged to receive the branch radiation beam and a second opening arranged to output the branch radiation beam, wherein the tube is defined by an internal surface which is substantially reflective, and wherein the internal surface is arranged so as to cause the branch radiation beam which enters the tube through the first opening to undergo multiple successive reflections at the internal surface, thereby modifying the branch radiation beam before the branch radiation beam exits the tube through the second opening; or a plurality of reflective facets each arranged to receive and reflect a portion of the branch radiation beam, so as to form a plurality of sub-beams reflected from the plurality of reflective facets and wherein the plurality of reflective facets are arranged to direct the sub-beams to form a modified branch radiation beam, or a first diffusing element comprising a first roughened reflective surface, a second diffusing element comprising a second roughened reflective surface and one or more actuators configured to move the first and/or second diffusing elements so as to cause movement of the first and/or the second roughened reflective surfaces, wherein the first roughened reflective surface is configured to receive an EUV radiation beam and reflect the EUV radiation beam so as to be incident on the second roughened reflective surface and wherein the second roughened reflective surface is arranged to reflect the EUV radiation beam received from the first roughened reflective surface so as to form a modified radiation beam.

According to a thirteenth aspect of the invention there is provided a method of modifying an EUV radiation beam, the method comprising emitting EUV radiation from a radiation source, forming an EUV radiation beam comprising at least a portion of the EUV radiation emitted by the radiation source, directing the EUV radiation beam to enter a radiation alteration device comprising a tube having a first opening arranged to receive the EUV radiation beam and a second opening arranged to output the EUV radiation beam, wherein the tube is defined by an internal surface which is substantially reflective to EUV radiation, and wherein the internal surface is arranged so as to cause the EUV radiation beam which enters the tube through the first opening to undergo multiple successive reflections at the internal surface, thereby modifying the EUV radiation beam before the EUV radiation beam exits the tube through the second opening.

According to a fourteenth aspect of the invention there is provided a method of modifying an EUV radiation beam, the method comprising emitting EUV radiation from a radiation source, forming an EUV radiation beam comprising at least a portion of the EUV radiation emitted by the radiation source, directing the EUV radiation beam to be incident on a radiation alteration device comprising a plurality of reflective facets each arranged to receive and reflect a portion of the EUV radiation beam, so as to form a plurality of sub-beams reflected from the plurality of reflective facets and wherein the plurality of reflective facets are arranged to direct the sub-beams to form a modified EUV radiation beam and providing the modified EUV radiation beam to a lithographic apparatus.

According to a fifteenth aspect of the invention there is provided a method of modifying a radiation beam, the method comprising reflecting the radiation beam at a first diffusing element comprising a first roughened reflective surface, reflecting the radiation beam, which is reflected at the first diffusing element, at a second diffusing element comprising a second roughened reflective surface and moving the first and/or second diffusing elements so as to cause movement of the first and/or second roughened reflective surfaces.

According to a sixteenth aspect of the invention there is provided a method of forming a roughened reflective surface the method comprising forming indentations in a surface of a substrate, wherein the indentations cause the surface of the substrate to vary from a flat plane and disposing a reflective coating on the surface of the substrate.

Forming indentations in the surface of the substrate may comprise abrasive blasting of the surface of the substrate.

The method may further comprise electropolishing the surface of the substrate prior to disposing the reflective coating on the surface of the substrate.

The method may further comprise electropolishing the reflective coating.

According to a seventeenth aspect of the invention there is provided a method of forming a roughened reflective surface the method comprising forming a patterned substrate, deforming a metal sheet using the patterned substrate, deforming a surface of a substrate using the metal sheet as a mandrel and disposing a reflective coating on the deformed surface of the substrate.

The patterned substrate may comprise a plurality of protrusions extending out of an otherwise substantially flat surface.

Deforming a metal sheet using the patterned substrate may comprise performing a hydraulic forming process.

Deforming a surface of a substrate using the metal sheet as a mandrel, may comprise performing an electroforming process.

The substrate may be formed from metal.

The metal may comprise at least one of nickel, copper and aluminum.

The reflective coating may comprise at least one of ruthenium and molybdenum.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings, in which.

DETAILED DESCRIPTION

Figure 1:
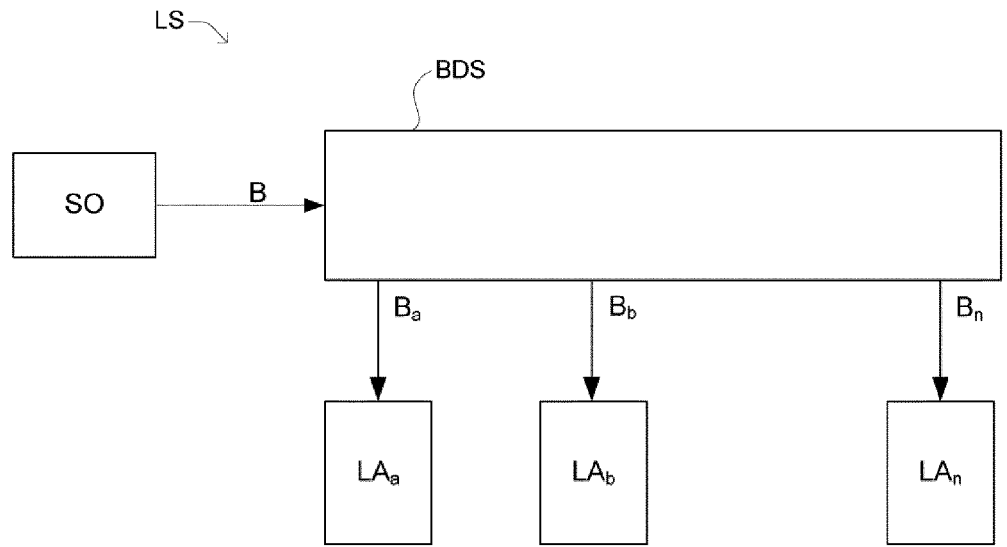
FIG. 1 is a schematic illustration of a lithographic system comprising a free electron laser according to an embodiment of the invention.

FIG. 1 shows a lithographic system LS according to one embodiment of the invention. The lithographic system LS comprises a radiation source SO, a beam delivery system BDS and a plurality of lithographic apparatus $LA_a$-$LA_n$ (e.g. eight lithographic apparatus). The radiation source SO is configured to generate an extreme ultraviolet (EUV) radiation beam B (which may be referred to as a main beam). The radiation source SO and the beam delivery system BDS may together be considered to form a radiation system, the radiation system being configured to provide radiation to one or more lithographic apparatus $LA_a$-$LA_n$.

The beam delivery system BDS comprises beam splitting optics and may optionally also comprise beam expanding optics and/or beam shaping optics. The main radiation beam B is split into a plurality of radiation beams $B_a$-$B_n$ (which may be referred to as branch beams), each of which is directed to a different one of the lithographic apparatus $LA_a$-$LA_n$, by the beam delivery system BDS.

In an embodiment, the branch radiation beams $B_a$-$B_n$ are each directed through a respective attenuator (not shown in FIG. 1). Each attenuator may be arranged to adjust the intensity of a respective branch radiation beam $B_a$-$B_n$ before the branch radiation beam $B_a$-$B_n$ passes into its corresponding lithographic apparatus $LA_a$-$LA_n$.

The radiation source SO, beam delivery system BDS and lithographic apparatus $LA_a$-$LA_n$ may all be constructed and arranged such that they can be isolated from the external environment. A vacuum may be provided in at least part of the radiation source SO, beam delivery system BDS and lithographic apparatuses $LA_a$-$LA_n$ so as to reduce the absorption of EUV radiation. Different parts of the lithographic system LS may be provided with vacuums at different pressures (i.e. held at different pressures which are below atmospheric pressure).

Figure 2:
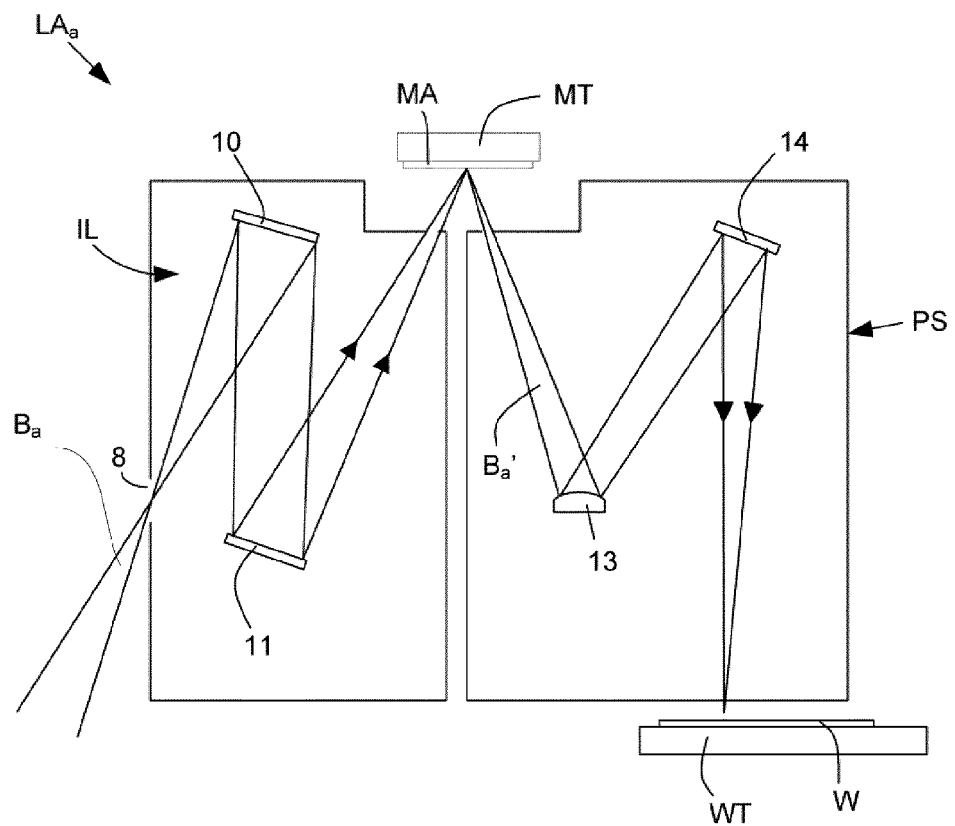
FIG. 2 is a schematic illustration of a lithographic apparatus that forms part of the lithographic system of FIG. 1.

Referring to FIG. 2, a lithographic apparatus $LA_a$ comprises an illumination system IL, a support structure MT configured to support a patterning device MA (e.g. a mask), a projection system PS and a substrate table WT configured to support a substrate W. The illumination system IL is configured to condition the branch radiation beam $B_a$ that is received by that lithographic apparatus $LA_a$ before it is incident upon the patterning device MA. The projection system PS is configured to project the radiation beam $B_a'$ (now patterned by the patterning device MA) onto the substrate W. The substrate W may include previously formed patterns. Where this is the case, the lithographic apparatus aligns the patterned radiation beam $B_a'$ with a pattern previously formed on the substrate W.

The branch radiation beam $B_a$ that is received by the lithographic apparatus $LA_a$ passes into the illumination system IL from the beam delivery system BDS though an opening 8 in an enclosing structure of the illumination system IL. Optionally, the branch radiation beam $B_a$ may be focused to form an intermediate focus at or near to the opening 8.

The illumination system IL may include a field facet mirror 10 and a pupil facet mirror 11. The field facet mirror 10 and pupil facet mirror 11 together provide the radiation beam $B_a$ with a desired cross-sectional shape and a desired angular distribution. The radiation beam $B_a$ passes from the illumination system IL and is incident upon the patterning device MA held by the support structure MT. The patterning device MA reflects and patterns the radiation beam to form a patterned beam $B_a'$. The illumination system IL may include other mirrors or devices in addition to or instead of the field facet mirror 10 and pupil facet mirror 11. The illumination system IL may, for example, include an array of independently moveable mirrors. The independently moveable mirrors may, for example, measure less than 1 mm across. The independently moveable mirrors may, for example, be microelectromechanical systems (MEMS) devices.

Following redirection (e.g. reflection) from the patterning device MA the patterned radiation beam $B_a'$ enters the projection system PS. The projection system PS comprises a plurality of mirrors 13, 14 which are configured to project the radiation beam $B_a'$ onto a substrate W held by the substrate table WT. The projection system PS may apply a reduction factor to the radiation beam, forming an image with features that are smaller than corresponding features on the patterning device MA. A reduction factor of 4 may, for example, be applied. Although the projection system PS has two mirrors in FIG. 2, the projection system may include any number of mirrors (e.g. six mirrors).

The lithographic apparatus $LA_a$ is operable to impart a radiation beam $B_a$ with a pattern in its cross-section and project the patterned radiation beam onto a target portion of a substrate thereby exposing a target portion of the substrate to the patterned radiation. The lithographic apparatus $LA_a$ may, for example, be used in a scan mode, wherein the support structure MT and the substrate table WT are scanned synchronously while a pattern imparted to the radiation beam $B_a'$ is projected onto a substrate W (i.e. a dynamic exposure). The velocity and direction of the substrate table WT relative to the support structure MT may be determined by the demagnification and image reversal characteristics of the projection system PS.

Referring again to FIG. 1, the radiation source SO is configured to generate an EUV radiation beam B with sufficient power to supply each of the lithographic apparatus $LA_a$-$LA_n$. As noted above, the radiation source SO may comprise a free electron laser.

Figure 3:
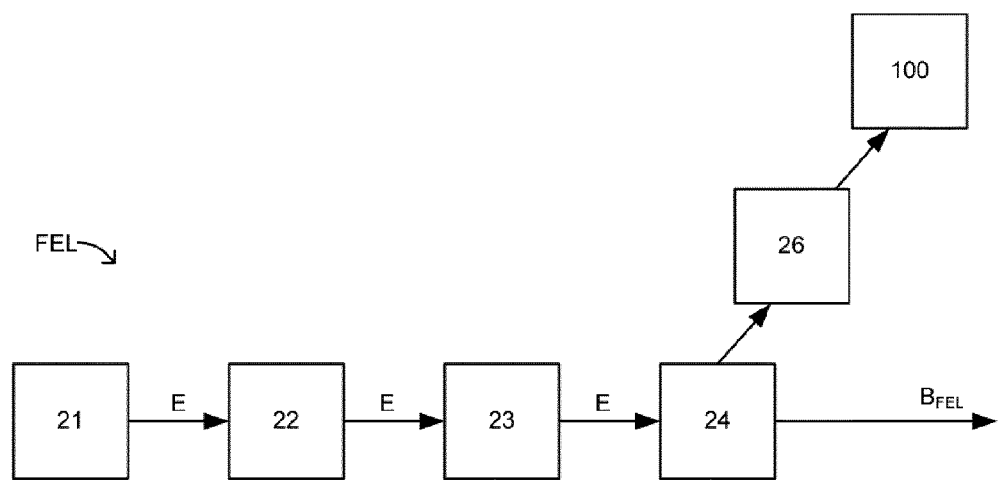
FIG. 3 is a schematic illustration of a free electron laser that forms part of the lithographic system of FIG. 1.

FIG. 3 is a schematic depiction of a free electron laser FEL comprising an injector 21, a linear accelerator 22, a bunch compressor 23, an undulator 24, an electron decelerator 26 and a beam dump 100.

The injector 21 is arranged to produce a bunched electron beam E and comprises an electron source (for example a thermionic cathode or a photo-cathode) and an accelerating electric field. Electrons in the electron beam E are further accelerated by the linear accelerator 22. In an example, the linear accelerator 22 may comprise a plurality of radio frequency cavities, which are axially spaced along a common axis, and one or more radio frequency power sources, which are operable to control electromagnetic fields along the common axis as bunches of electrons pass between them so as to accelerate each bunch of electrons. The cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Alternatively, the cavities may be conventionally conducting (i.e. not superconducting), and may be formed from, for example, copper. Other types of linear accelerators may be used such as, for example, laser wakefield accelerators or inverse free electron laser accelerators.

Optionally, the electron beam E passes through a bunch compressor 23, disposed between the linear accelerator 22 and the undulator 24. The bunch compressor 23 is configured to spatially compress existing bunches of electrons in the electron beam E. One type of bunch compressor 23 comprises a radiation field directed transverse to the electron beam E. An electron in the electron beam E interacts with the radiation and bunches with other electrons nearby. Another type of bunch compressor 23 comprises a magnetic chicane, wherein the length of a path followed by an electron as it passes through the chicane is dependent upon its energy. This type of bunch compressor may be used to compress bunches of electrons which have been accelerated in a linear accelerator 22 by a plurality of resonant cavities.

The electron beam E then passes through the undulator 24. Generally, the undulator 24 comprises a plurality of modules (not shown). Each module comprises a periodic magnet structure, which is operable to produce a periodic magnetic field and is arranged so as to guide the relativistic electron beam E produced by the injector 21 and linear accelerator 22 along a periodic path within that module. The periodic magnetic field produced by each undulator module causes the electrons to follow an oscillating path about a central axis. As a result, within each undulator module, the electrons radiate electromagnetic radiation generally in the direction of the central axis of that undulator module.

The path followed by the electrons may be sinusoidal and planar, with the electrons periodically traversing the central axis. Alternatively, the path may be helical, with the electrons rotating about the central axis. The type of oscillating path may affect the polarization of radiation emitted by the free electron laser. For example, a free electron laser which causes the electrons to propagate along a helical path may emit elliptically polarized radiation.

As electrons move through each undulator module, they interact with the electric field of the radiation, exchanging energy with the radiation. In general the amount of energy exchanged between the electrons and the radiation will oscillate rapidly unless conditions are close to a resonance condition. Under resonance conditions, the interaction between the electrons and the radiation causes the electrons to bunch together into microbunches, modulated at the wavelength of radiation within the undulator, and coherent emission of radiation along the central axis is stimulated. The resonance condition may be given by:

$$\lambda_{em} = \frac{\lambda_u}{2\gamma^2}\left(1 + \frac{K^2}{A}\right), \tag{1}$$

where $\lambda_{em}$ is the wavelength of the radiation, $\lambda_u$ is the undulator period for the undulator module that the electrons are propagating through, γ is the Lorentz factor of the electrons and K is the undulator parameter. A is dependent upon the geometry of the undulator 24: for a helical undulator that produces circularly polarized radiation A=1, for a planar undulator A=2, and for a helical undulator which produces elliptically polarized radiation (that is neither circularly polarized nor linearly polarized) 1<A<2. In practice, each bunch of electrons will have a spread of energies although this spread may be minimized as far as possible (by producing an electron beam E with low emittance). The undulator parameter K is typically approximately 1 and is given by:

$$K = \frac{q\lambda_u B_0}{2\pi mc}, \quad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through each undulator module. The free electron laser FEL may operate in self-amplified spontaneous emission (SASE) mode. Operation in SASE mode may require a low energy spread of the electron bunches in the electron beam E before it enters each undulator module. Alternatively, the free electron laser FEL may comprise a seed radiation source, which may be amplified by stimulated emission within the undulator 24. The free electron laser FEL may operate as a recirculating amplifier free electron laser (RAFEL), wherein a portion of the radiation generated by the free electron laser FEL is used to seed further generation of radiation.

Electrons moving through the undulator 24 may cause the amplitude of radiation to increase, i.e. the free electron laser FEL may have a non-zero gain. Maximum gain may be achieved when the resonance condition is met or when conditions are close to but slightly off resonance.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period $\lambda_u$ may vary along the length of the undulator 24 in order to keep bunches of electrons at or close to resonance as they are guided though the undulator 24. The tapering may be achieved by varying the amplitude of the periodic magnetic field and/or the undulator period $\lambda_u$ within each undulator module and/or from module to module. Additionally or alternatively tapering may be achieved by varying the helicity of the undulator 24 (by varying the parameter A) within each undulator module and/or from module to module.

Radiation produced within the undulator 24 is output as a radiation beam $B_{FEL}$.

After leaving the undulator 24, the electron beam E is absorbed by a dump 100. The dump 100 may comprise a sufficient quantity of material to absorb the electron beam E. The material may have a threshold energy for induction of radioactivity. Electrons entering the dump 100 with an energy below the threshold energy may produce only gamma ray showers but will not induce any significant level of radioactivity. The material may have a high threshold energy for induction of radioactivity by electron impact. For example, the beam dump may comprise aluminum (Al), which has a threshold energy of around 17 MeV. It may be desirable to reduce the energy of electrons in the electron beam E before they enter the dump 100. This removes, or at least reduces, the need to remove and dispose of radioactive waste from the dump 100. This is advantageous since the removal of radioactive waste requires the free electron laser FEL to be shut down periodically and the disposal of radioactive waste can be costly and can have serious environmental implications.

The energy of electrons in the electron beam E may be reduced before they enter the dump 100 by directing the electron beam E through a decelerator 26 disposed between the undulator 24 and the beam dump 100.

In an embodiment the electron beam E which exits the undulator 24 may be decelerated by passing the electrons back through the linear accelerator 22 with a phase difference of 180 degrees relative to the electron beam produced by the injector 21. The RF fields in the linear accelerator therefore serve to decelerate the electrons which are output from the undulator 24 and to accelerate electrons output from the injector 21. As the electrons decelerate in the linear accelerator 22 some of their energy is transferred to the RF fields in the linear accelerator 22. Energy from the decelerating electrons is therefore recovered by the linear accelerator 22 and may be used to accelerate the electron beam E output from the injector 21. Such an arrangement is known as an energy recovery linear accelerator (ERL).

In some embodiments of a lithographic system LS the radiation source SO may comprise a single free electron laser FEL. In such embodiments the main beam B which is emitted from the radiation source SO may be a laser beam $B_{FEL}$ which is emitted from the free electron laser FEL. In other embodiments, a lithographic system LS may comprise a plurality of free electron lasers. A plurality of laser beams $B_{FEL}$ emitted from the free electron lasers may be combined to form a single main beam B comprising radiation emitted from the plurality of free electron lasers FEL.

Figure 4:
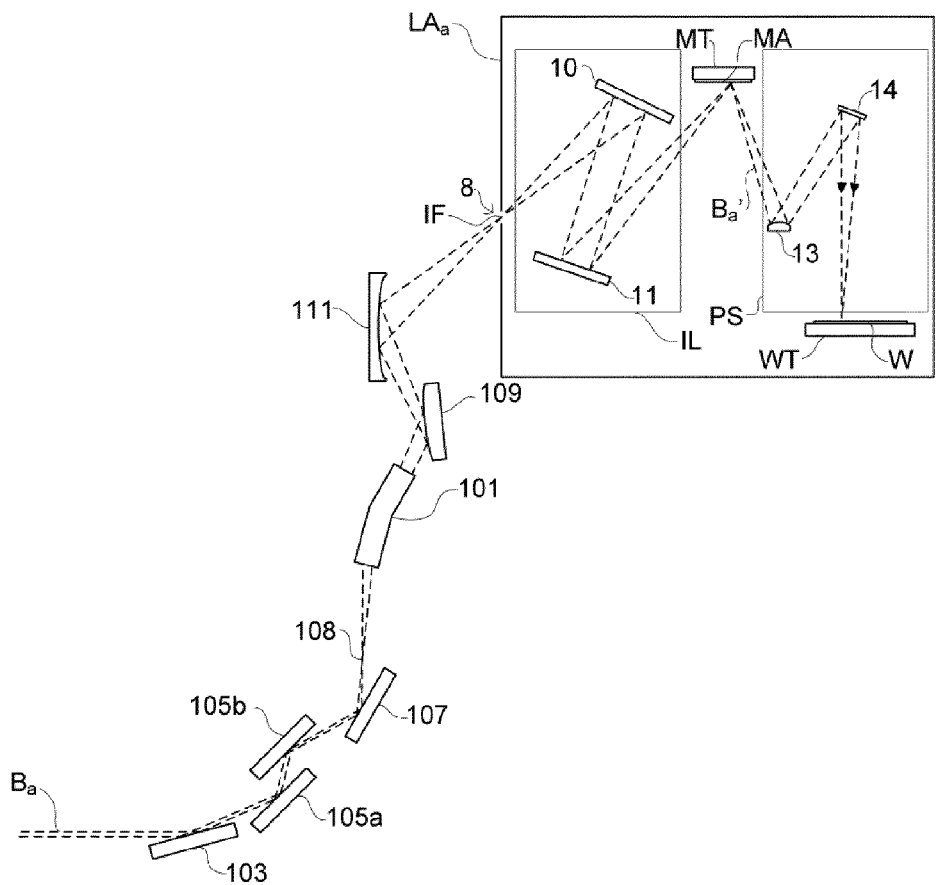
FIG. 4 is a schematic illustration of a portion of a lithographic system according to an embodiment of the invention.

FIG. 4 is a schematic illustration of a portion of a lithographic system LS according to an embodiment of the invention. The portion of the lithographic system LS which is shown in FIG. 4 comprises a plurality of optical elements configured to direct a branch radiation beam $B_a$ to a lithographic apparatus $LA_a$. The plurality of optical elements includes a first mirror 103, a first variable attenuation mirror 105a, a second variable attenuation mirror 105b, a first focusing optic 107, a radiation alteration device 101, a second focusing optic 109 and a third focusing optic 111. The plurality of optical elements which are shown in FIG. 4 may form part of the beam delivery system BDS which is shown schematically in FIG. 1. The beam delivery system BDS may however comprise more components than are shown in FIG. 4. For example, the beam delivery system BDS may further comprise beam splitting optics and may optionally also comprise beam expanding optics and/or beam shaping optics which are not shown in FIG. 4.

The first mirror 103 receives the branch radiation beam $B_a$ and directs the branch radiation beam $B_a$ to be incident on the first attenuation mirror 105a which subsequently directs the branch radiation beam $B_a$ to be incident on the second attenuation mirror 105b. The orientation of the first and second attenuation mirrors 105a, 105b are adjustable so as to vary the angle of incidence with which the branch radiation beam $B_a$ is incident on the first and second variable attenuation mirrors 105a, 105b. The reflectivity of the variable attenuation mirrors 105a, 105b is a function of the angle of incidence of the branch radiation beam $B_a$ on the variable attenuation mirrors 105a, 105b. Varying the angle of incidence with which the branch radiation beam $B_a$ is incident on the variable attenuation mirrors 105a, 105b therefore varies the fraction of the branch radiation beam $B_a$ which is reflected at the variable attenuation mirrors. The orientation of the variable attenuation mirrors 105a, 105b may therefore be controlled in order to control the fraction of the branch radiation beam $B_a$ which is reflected at the variable attenuation mirrors, thereby controlling the intensity of the branch radiation beam $B_a$ which is provided to the lithographic apparatus $LA_a$. The orientation of the variable attenuation mirrors may be controlled by one or more actuators (not shown). The one or more actuators may, for example, be controlled in response to a measurement of the intensity of the branch radiation beam $B_a$ so as to form a feedback system which is operable to provide a branch radiation beam $B_a$ having a desired intensity.

The branch radiation beam $B_a$ which is reflected from the second variable attenuation mirror 105b is incident on the first focusing optic 107. The first focusing optic 107 is configured to focus the branch radiation beam $B_a$ to a focal point 108 before the branch radiation beam $B_a$ enters the radiation alteration device 101. Focusing the branch radiation beam $B_a$ to a focal point 108 before the branch radiation beam 108 enters the radiation alteration device 101 results in the branch radiation beam $B_a$ having a positive divergence as it enters the radiation alteration device 101.

In alternative embodiments the focal point 108 may be positioned inside the radiation alteration device 101. In such embodiments the branch radiation beam $B_a$ may enter the radiation alteration device having a negative divergence. However the divergence of the branch radiation beam $B_a$ may become positive after the focal point 108 such that the branch radiation beam $B_a$ has a positive divergence in the radiation alteration device.

The radiation alteration device 101 is configured to modify one or more properties of the branch radiation beam $B_a$ and will be described in further detail below. The modified branch radiation beam $B_a$ which is output from the radiation alteration device 101 is incident on the second 109 and third 111 focusing optics before the branch radiation beam $B_a$ is provided to the lithographic apparatus $LA_a$. The second and third focusing optics 109, 111 are configured to focus the branch radiation beam $B_a$ to an intermediate focus IF. The intermediate focus IF is situated at an opening 8 in an enclosing structure of the lithographic apparatus $LA_a$. As was described above with reference to FIG. 2 the lithographic apparatus $LA_a$ comprises an illumination system IL, a support structure MT configured to support a patterning device MA (e.g. a mask), a projection system PS and a substrate table WT configured to support a substrate W.

As was described above the branch radiation beam $B_a$ comprises at least a portion of the EUV radiation which is emitted from a free electron laser FEL which forms part of the radiation source SO. A radiation beam which is output from a free electron laser FEL is typically a coherent, well collimated radiation beam having a relatively small etendue. In some embodiments the etendue of a radiation beam which is emitted from a free electron laser FEL may be sufficiently small that the radiation beam is considered to be diffraction limited.

The etendue of a radiation beam in free space (i.e. a medium with a refractive index of 1) at an infinitesimal surface element dS in an optical system is given by the product of the area of the surface dS, the solid angle dΩ subtended by radiation crossing (or emitted by) the surface element and the cosine of the angle between the normal to the surface element and the direction of the radiation crossing that point. In general, the etendue of a radiation beam at an extended surface S is given by integrating over the solid angle subtended by radiation crossing (or emitted by) each surface element (to account for the fact that light may cross each point on the surface at a range of angles) and integrating over the surface (to sum the contributions from all such surface elements). For a light source operable to produce a well collimated radiation beam, as is produced by a free electron laser FEL, the etendue of the light source may be estimated by the product of the area of the light source and the solid angle into which light is emitted. Further, for such a light source the solid angle into which light is emitted is given by (using small angle approximations) $\pi\theta^2$, where $\theta$ is the half divergence of the light source. Therefore, the etendue of such a light source is given by $G=\pi A\theta^2$, where A is the area of the light source. A radiation beam which is emitted from a free electron laser FEL may, for example, have a divergence which is less than about 500 μrad (in some embodiments the divergence may be less than about 100 μrad) and may have a diameter of around 50 μm to 100 μm at its beam waist, as it leaves the undulator 24. In an embodiment in which the beam waist diameter is 50 μm and the beam divergence is 100 μrad the etendue of the radiation beam is around $1.5\times10^{-11}$ mm².

In some embodiments a free electron laser FEL may emit a radiation beam which has a Gaussian-like intensity profile. The etendue of a radiation beam having a Gaussian intensity profile is approximately equal to the wavelength of the radiation beam squared. In some embodiments a free electron laser FEL may emit an EUV radiation beam having a wavelength of approximately 13.5 nm and having a Gaussian intensity profile. In such an embodiment the etendue of the radiation beam is approximately $1.8\times10^{-16}$ m². In practice the intensity profile of a radiation beam which is emitted from a free electron laser FEL may not be perfectly Gaussian. Consequently, the etendue of a radiation beam which is emitted from a free electron laser FEL may in practice be approximately 2 or 3 times greater than the square of the wavelength of the radiation beam.

The etendue of a radiation beam cannot decrease as it propagates through an optical system. The etendue of a radiation beam may remain constant as it propagates through an optical system in free space and undergoes reflections and refractions. However, as a radiation beam propagates through an optical system which spreads out radiation, for example by scattering and/or diffraction, its etendue will increase. The higher the quality of the optical elements (for example mirrors and lenses) in the optical system, the smaller the increase in etendue will be.

The optical elements which form the optical path of a branch radiation beam $B_a$ from a free electron laser FEL to a lithographic apparatus $LA_a$ are typically of a high quality such that they result in only relatively small increases in the etendue. If the branch radiation beam $B_a$ only passes via optical elements which do not significantly increase the etendue of the branch radiation beam $B_a$ then the etendue of the branch radiation beam $B_a$ which is focused at the intermediate focus IF will be relatively small and the branch radiation beam $B_a$ will be focused to a small point at the intermediate focus IF. As was described above with reference to FIG. 2, the branch radiation beam $B_a$ which is focused at the intermediate focus IF enters the illumination system IL of the lithographic apparatus $LA_a$ and is incident on a field facet mirror 10 and a pupil facet mirror 11. The field facet mirror 10 and the pupil facet mirror 11 each comprise a plurality of reflective facets which each reflect a portion of the branch radiation beam $B_a$. The portions of the branch radiation beam $B_a$ which are reflected at the field facets and pupil facets may be referred to as sub-beams.

The field facets which form the field facet mirror 10 may focus the sub-beams which are received by the field facets onto the pupil facets which form the pupil facet mirror 11. The spot size of each sub-beam which is incident on a pupil facet of the pupil facet mirror 11 depends in part on the etendue of the branch radiation beam $B_a$. A branch radiation beam $B_a$ having a small etendue may cause the spot sizes of the sub-beams of the branch radiation beam $B_a$ which are incident on the pupil facets to be relatively small. A relatively small spot size on a pupil facet causes the sub-beam to be incident on a pupil facet with a relatively high irradiance. A high irradiance on a pupil facet may damage the pupil facet.

It may therefore be desirable to increase the spot sizes of the sub-beams which are incident on the pupil facets so as to decrease the irradiance on the pupil facets and decrease the likelihood of damage being caused to the pupil facets. As was described above the spot sizes of the sub-beams which are incident on the pupil facets may be increased by increasing the etendue of the branch radiation beam $B_a$. As will be described in further detail below the radiation alteration device 101 may be configured to increase the etendue of the branch radiation beam $B_a$ thereby causing the spot sizes of the sub-beams on the pupil facets to be increased.

As was mentioned above, a radiation beam which is emitted from a free electron laser FEL is typically a coherent radiation beam. When a spatially coherent radiation beam is reflected, for example, at one or more optical elements of the plurality of optical elements shown in FIG. 4, then small path length differences may be introduced between different portions of the radiation beam, thereby introducing phase differences between different portions of the radiation beam. Phase differences between different portions of the radiation beam may cause different portions of the radiation beam to interfere with each, thereby forming interference patterns. For example, interference between different portions of a radiation beam may lead to the occurrence of a so-called speckle pattern. In a lithographic apparatus a radiation beam exhibiting a speckle pattern may disadvantageously cause different portions of a substrate W to be exposed to different doses of radiation. It may therefore be desirable to reduce the spatial coherence of the branch radiation beam $B_a$ so as to reduce any disadvantageous effects which result from interference between different portions of the branch radiation beam $B_a$. As will be described in further detail below the radiation alteration device 101 may be configured to reduce the spatial coherence of the branch radiation beam $B_a$ so as to prevent the occurrence of a speckle pattern in the branch radiation beam $B_a$.

Figure 5:
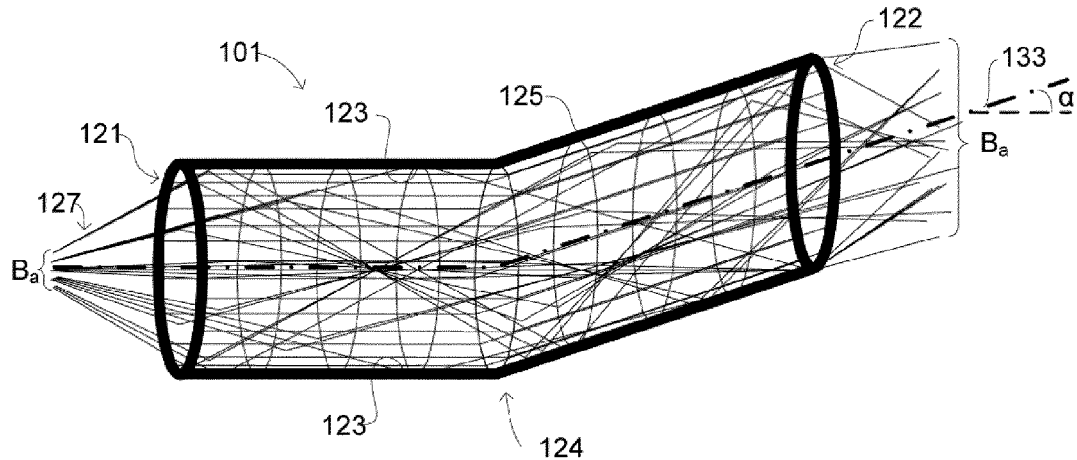
FIG. 5 is a schematic illustration of an embodiment of a radiation alteration device.

FIG. 5 is a schematic illustration of an embodiment of the radiation alteration device 101. The radiation alteration device 101 comprises a tube 125 having a first opening 121 and a second opening 122. The first opening 121 is arranged to receive the branch radiation beam $B_a$ and the second opening 122 is arranged to output the branch radiation beam $B_a$. The tube 125 is defined by an internal surface 123 of the radiation alteration device 101. The internal surface 123 is substantially reflective to EUV radiation and is arranged to cause the branch radiation beam $B_a$ which enters the tube 125 through the first opening 121 to undergo multiple successive reflections at the internal surface 123. The multiple successive reflections serve to modify the branch radiation beam $B_a$ before the branch radiation beam $B_a$ exits the tube 125 through the second opening 122.

The path of the branch radiation beam $B_a$ through the radiation alteration device 101 is represented in FIG. 5 with a series of rays 127 which are shown propagating through the radiation alteration device 101. Since the branch radiation beam $B_a$ is focused to a focal point 108 prior to entering the radiation alteration device 101, the rays 127 which form the branch radiation beam $B_a$ are diverging from each other as the branch radiation beam $B_a$ enters the radiation alteration device 101. That is, the branch radiation beam $B_a$ has a positive divergence as it enters the radiation alteration device 101. The positive divergence of the branch radiation beam $B_a$ means that the rays 127 of the branch radiation beam $B_a$ are incident on the internal surface 123 of the radiation alteration device at different positions and are subsequently reflected along different paths. The rays 127 which form the branch radiation beam $B_a$ therefore propagate along substantially different paths through the radiation alteration device 101 such that the rays 127 are spatially scrambled by the radiation alteration device 101.

In the embodiment which is shown in FIG. 5 the tube 125 includes a bend 124. The bend 124 has a bend angle $\alpha$. The bend angle $\alpha$ is measured relative to an axis 133 which extends along the cross-sectional center of the tube 125. The bend angle $\alpha$ is the angle by which the axis 133 deviates in the bend 124. In the embodiment which is shown in FIG. 5 the direction in which the axis 133 extends undergoes a step change at the bend 124 of the tube 125. In other embodiments a tube 125 may include a continuous bend in which the direction in which the axis 133 extends undergoes a continuous transition in the bend such that the tube 125 includes a curve. Some embodiments of a radiation alteration device may include more than one bend. Other embodiments of a radiation alteration device may not include any bends.

As was described above the radiation alteration device 101 causes rays 127 of the branch radiation beam $B_a$ to be spatially scrambled. The radiation alteration device 101 may be considered to provide a mapping of the rays 127 which form the branch radiation beam between the first opening 121 of a radiation alteration device 101 and the second opening 122 of the radiation alteration device.

Figure 6:
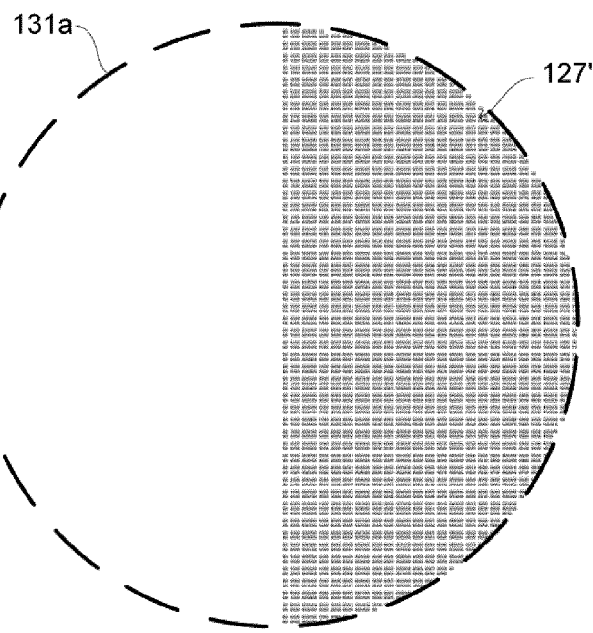
FIG. 6 is a schematic representation of radiation which may be input to the radiation alteration device of FIG. 5.

FIG. 6 is a schematic illustration of the cross-sectional position of a subset 127' of the rays 127 which form a branch radiation beam $B_a$ at the first opening 121 of the radiation alteration device 101. In order to illustrate the spatial scrambling of the rays 127 which is caused by the radiation alteration device only a subset 127' of rays is shown in FIG. 6. The subset 127' of rays represents a half segment of the rays 127 which form the branch radiation beam $B_a$. In practice the branch radiation beam $B_a$ may extend over approximately twice the area which is indicated by the rays 127 which are shown in FIG. 6. The full extent of the cross-section of the branch radiation beam at the first opening 121 of the radiation alteration device 101 is indicated in FIG. 6 with a dashed circle 131a.

Figure 7:
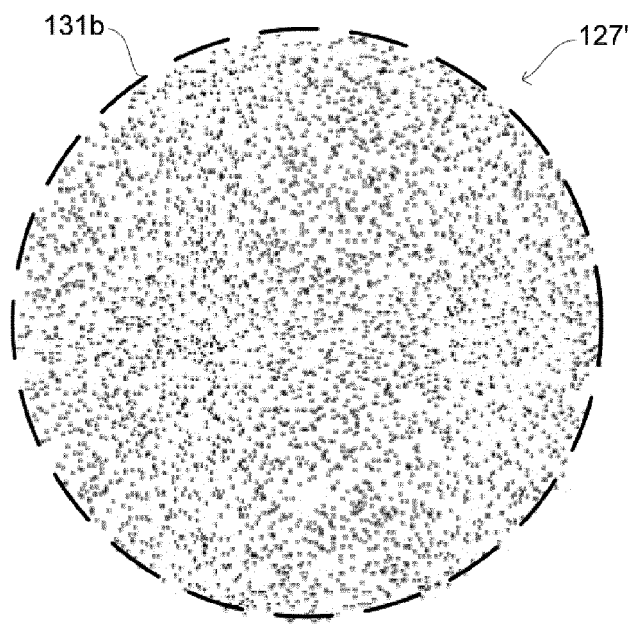
FIG. 7 is a schematic representation of radiation which may be output from the radiation alteration device of FIG. 5.

FIG. 7 is a schematic illustration of the cross-sectional position of the subset 127' of rays of FIG. 6 at the second opening 122 of the radiation alteration device 101. The full extent of the cross-section of the branch radiation beam $B_a$ at the second opening 122 of the radiation alteration device 101 is indicated in FIG. 7 with a dashed circle 131b. FIG. 7 is representative of the mapping of rays between the first opening 121 and the second opening 122. It can be seen from FIG. 7 that the subset 127' of rays which form a half segment of the branch radiation beam $B_a$ at the first opening 121 are redistributed across the full extent of the cross-section of the branch radiation beam $B_a$ at the second opening 122. That is, the cross-sectional position of the subset 127' of rays is spatially scrambled by the radiation alteration device 101.

The mapping of rays 127 between the first opening 121 and the second opening 122 which is shown in FIGS. 6 and 7 is presented merely as an illustrative example of a mapping of rays which may be caused by a radiation alteration device. The example mapping which is illustrated in FIGS. 6 and 7 may not, for example, correspond exactly with the mapping which results from the embodiment of a radiation alteration device 101 which is shown in FIG. 5. Different embodiments of a radiation alteration device may result in different mappings and different degrees of spatial scrambling.

Spatially scrambling the rays which form the branch radiation beam $B_a$ advantageously increases the spatial homogeneity of the spatial intensity profile of the branch radiation beam $B_a$. That is, the spatial intensity profile of the branch radiation beam $B_a$ which exits the radiation alteration device 101 through the second opening 122 of the radiation alteration device 101 is more homogenous than the spatial intensity profile of the branch radiation $B_a$ which enters the radiation alteration device 101 through the first opening 121.

In general, the intensity of a branch radiation beam $B_a$ may vary at different positions in a cross-section through the branch radiation beam $B_a$. For example, the branch radiation beam $B_a$ may have a substantially Gaussian-like spatial intensity profile. The spatial intensity profile of the branch radiation beam before the radiation alteration device 101 may therefore, in general, be considered to be non-homogenous. As was described above the branch radiation beam $B_a$ enters the lithographic apparatus $LA_a$ and is incident on the field facet mirror 10 and the pupil facet mirror 11 in the illumination system IL.

The field facet mirror 10 and the pupil facet mirror 11 together serve to condition the branch radiation beam $B_a$ before it is incident upon a patterning device MA. In particular, the field facet mirror 10 and the pupil facet mirror 11 may be configured to provide a radiation beam having a desired angular and spatial intensity profile. In order to achieve this the field facets which form the field facet mirror 10 and the pupil facets which form the pupil facet mirror 11 are orientated so as to direct different portions of the intensity profile of the branch radiation beam $B_a$ in different directions, so as to form a radiation beam having a desired angular and spatial intensity profile. The orientation of the field facets and pupil facets is based upon receiving a branch radiation beam $B_a$ having a known spatial intensity profile at the field facet mirror 10. For example, each facet may be orientated according to a known intensity of radiation which will be incident on that facet.

If the branch radiation beam $B_a$ which is provided to the lithographic apparatus $LA_a$ has a non-homogenous spatial intensity profile at the field facet mirror 10 (e.g. if no radiation alteration device 101 is provided before the lithographic apparatus $LA_a$) then the intensity of radiation which is incident on each field facet of the field facet mirror 11 is sensitive to changes in the pointing direction of the branch radiation beam $B_a$. For example, a change in the pointing direction of the branch radiation beam $B_a$ will result in a change in the portion of the intensity profile which is incident on each field facet. If the branch radiation beam $B_a$ which is incident on the field facet mirror 10 has a non-homogenous spatial intensity profile then a change in the portion of the intensity profile which is incident on each field facet will result in a change in the intensity of radiation which is incident on each field facet. A change in the intensity of radiation which is incident on each field facet will further result in a change in the angular and spatial intensity profile of the radiation beam which is incident on a patterning device MA. In particular, the angular and spatial intensity profile of the radiation beam which is incident on a patterning device MA may deviate from a desired angular and spatial intensity profile.

In the embodiment which is shown in FIG. 4 the branch radiation beam $B_a$ which is provided to the lithographic apparatus $LA_a$ has passed through the radiation alteration device 101. As was described above, by spatially scrambling the rays 127 which form the branch radiation beam $B_a$, the radiation alteration device serves to increase the homogeneity of the spatial intensity profile of the branch radiation beam $B_a$. Consequently, the branch radiation beam $B_a$ which is provided to the lithographic apparatus and which is incident on the field facet mirror 10 may have a relatively homogenous spatial intensity profile.

In embodiments in which the branch radiation beam $B_a$ which is incident on the field facet mirror 10 has a relatively homogenous spatial intensity profile, the different portions of the intensity profile which are incident on each of the field facets of the field facet mirror 10 have similar intensities. Accordingly a change in the pointing direction of the branch radiation beam $B_a$ (which causes a change in the portion of the cross-section of the radiation beam which is incident on each field facet) will result in only small changes in the intensity of radiation which is incident on each field facet. Consequently the angular and spatial intensity profile of the radiation beam which is incident on a patterning device MA is less sensitive to the pointing direction of the branch radiation beam $B_a$ in embodiments in which the spatial intensity profile of the branch radiation beam $B_a$ which is incident on the field facet mirror 10 is relatively homogenous (when compared to embodiments in which the spatial intensity profile is relatively in homogenous).

The pointing direction of the branch radiation beam $B_a$ which is provided to the lithographic apparatus $LA_a$ is a function of the pointing direction of a radiation beam which is emitted by a free electron laser FEL (which forms part of the radiation source SO), and the position and orientation of the optical elements at which the branch radiation beam $B_a$ is reflected on its optical path to the lithographic apparatus $LA_a$. Both the pointing direction of a radiation beam which is emitted from a free electron laser FEL and the orientation of optical elements at which the branch radiation beam $B_a$ is reflected may vary over time. For example, the pointing direction of a radiation beam which is emitted by a free electron laser FEL depends on the periodic path through the undulator 23 along which the electron beam E is guided by a periodic magnetic field in the undulator 23. The periodic magnetic field in the undulator 23 may change over time (e.g. due to changes in the magnetism of one or more magnets which generate the periodic magnetic field), thereby causing a change in the path of the electron beam E through the undulator 23 and a corresponding change in the pointing direction of the radiation beam emitted by the free electron laser FEL. Additionally or alternatively the position and/or orientation of the optical elements at which the branch radiation beam $B_a$ is reflected on its optical path to the lithographic apparatus $LA_a$ may vary over time, thereby causing a change in the beam pointing of the branch radiation beam $B_a$. It is therefore desirable to reduce the sensitivity of the intensity profile of the radiation beam which is incident on a patterning device MA in the lithographic apparatus $LA_a$ to variations in the pointing direction of the branch radiation beam $B_a$.

As was described above, providing a radiation alteration device 101 in the optical path of the branch radiation beam $B_a$ advantageously increases the homogeneity of the spatial intensity profile of the branch radiation beam $B_a$ which is incident on the field facet mirror. Providing a radiation alteration device 101 therefore reduces the sensitivity of the spatial intensity profile of the branch radiation beam $B_a$ which is incident on the field facet mirror 10, to changes in the pointing direction of the branch radiation beam $B_a$. Accordingly the sensitivity of the spatial and angular intensity profile of the radiation beam which is incident on a patterning device MA is advantageously reduced.

In order to sufficiently increase the homogeneity of a branch radiation beam $B_a$ it may be desirable to configure a radiation alteration device such that the quantity BUD is greater than or equal to about 10, where L is the length of the radiation alteration device (i.e. the length between the first and second openings), B is the half-divergence (in radians) of the branch radiation beam $B_a$ which enters the radiation alteration device and D is the diameter of the second opening of the radiation alteration device. Configuring a radiation alteration device such that the quantity θL/D is greater than or equal to about 10 may ensure that the rays 127 which form the branch radiation beam $B_a$ undergo a sufficient number of reflections at the internal surface of the radiation alteration device so as to bring about a desirable increase in the homogeneity of the branch radiation beam $B_a$.

The spatial intensity profile of a modified branch radiation beam $B_a$ which is output from the radiation alteration device may be relatively homogenous at the second opening 122 of the radiation alteration device but may be less homogenous at some locations further downstream of the radiation alteration (a downstream direction corresponds with the general direction of propagation of the branch radiation beam $B_a$ and an upstream direction corresponds with a reverse of the downstream direction). In order to increase the homogeneity of the radiation beam which is incident on the field facet mirror 10, the second and third focusing optics 109, 111 may be configured to form an image of the second opening 122 of the radiation alteration device 101 at the field facet mirror 10. Embodiments of focusing schemes which may be used to form an image at the field facet mirror 10 are described further below with reference to FIGS. 12A and 12B.

As was described above, different rays 127 which are input to the radiation alteration device 101 through the first opening 121 of the radiation alteration device 101 propagate along different paths through the radiation alteration device 101. The different paths through the radiation alteration device 101 may have different lengths and consequently path length differences are introduced between the different rays 127 which are output from the second opening 122 of the radiation alteration device 101. As was described above the branch radiation beam $B_a$ which enters the radiation alteration device may be a coherent radiation beam. The introduction of path length differences between different rays 127 of the branch radiation beam $B_a$ may cause a reduction in the spatial coherence of the branch radiation beam $B_a$. Reducing the spatial coherence of the branch radiation beam $B_a$ may advantageously reduce the likelihood of interference between different portions of the branch radiation beam $B_a$ resulting in the formation of an interference pattern such as a speckle pattern. The radiation alteration device 101 may therefore advantageously reduce the likelihood of a speckle pattern forming in a lithographic apparatus $LA_a$ (when compared to a lithographic system in which no radiation alteration device is provided).

The spatial coherence of the branch radiation beam $B_a$ may be reduced to an extent which prevents the formation of interference patterns (e.g. a speckle pattern) if the range of different path lengths along which different rays 127 of the branch radiation beam $B_a$ propagate, is greater than the coherence length of the branch radiation beam $B_a$. The coherence length of the branch radiation beam $B_a$ (which comprises EUV radiation) may be of the order of about 1 μm. The range of different path lengths along which different rays 127 of the branch radiation beam $B_a$ may be of the order of approximately $L\theta^2$ where L is the length of the radiation alteration device and θ is the half-divergence (in radians) of the branch radiation beam $B_a$ which enters the radiation alteration device. It may therefore be desirable to configure a radiation alteration device and/or one or more focusing elements which determine the divergence of the branch radiation beam $B_a$, such that $L\theta^2$ is much greater than the coherence length of the branch radiation beam $B_a$.

The different paths along which different rays 127 of the branch radiation beam propagate through the radiation alteration device 101 may additionally serve to scramble the polarization state of the branch radiation beam $B_a$. In general, it is desirable to expose a substrate W in a lithographic apparatus to radiation which does not have a preferential polarization direction. For example, a substrate W may be exposed to radiation which is circularly polarized or which is unpolarized. However, it may be undesirable to expose a substrate W to radiation which is linearly polarized or which is elliptically polarized since a linear or elliptical polarization state has a preferential polarization direction.

A radiation beam which is emitted from a free electron laser FEL is typically a polarized radiation beam. The radiation beam which is emitted from a free electron laser FEL may be linearly, elliptically or circularly polarized depending on the configuration of the undulator 23 from which the radiation beam is emitted. For example, a free electron laser FEL having an undulator which causes electrons to propagate along a helical path may emit circularly polarized radiation and a free electron laser FEL having an undulator which causes electrons to propagate along a planar path may emit linearly polarized radiation.

As has been described above, the optical path of a branch radiation beam $B_a$ from a free electron laser FEL to a lithographic apparatus $LA_a$ may include multiple reflections at a variety of different optical elements. One or more of the reflections which a branch radiation beam $B_a$ undergoes may alter the polarization state of the branch radiation beam $B_a$. For example, reflection of the branch radiation beam $B_a$ may cause a phase retardance between orthogonally polarized components of the branch radiation beam $B_a$. Introducing a phase retardance to a circularly polarized radiation beam or a linearly polarized radiation beam typically converts the circular or linear polarization state to an elliptically polarized state. Consequently, a branch radiation beam $B_a$ which is emitted from a free electron laser FEL typically becomes elliptically polarized as it propagates along its optical path to a lithographic apparatus $LA_a$. In the absence of a radiation alteration device 101, a branch radiation beam $B_a$ may therefore be undesirably provided to a lithographic apparatus $LA_a$ with an elliptical polarization state which has a preferential polarization direction.

As has been described above the radiation alteration device 101 causes different rays 127 to undergo different paths through the radiation alteration device 101 and to undergo reflections at different grazing angles in the radiation alteration device 101. Consequently, the rays 127 which are output from the radiation alteration device 101 have different polarization states. Taken as a whole the modified branch radiation beam $B_a$ which is output from the radiation alteration device 101 does not therefore have a preferential polarization direction. Advantageously this results in the exposure of a substrate W in a lithographic apparatus $LA_a$ to radiation which does not have a preferential polarization direction.

In addition to the spatial scrambling of rays 127 which form the branch radiation beam $B_a$ which is caused by the radiation alteration device 101, the radiation alteration device also serves to significantly increase the etendue of the branch radiation beam $B_a$. That is, the etendue of the branch radiation beam $B_a$ which exits the radiation alteration device 101 through the second opening 122 is greater than the etendue of the branch radiation beam $B_a$ which enters the radiation alteration device 101 through the first opening 121.

Figure 8A:
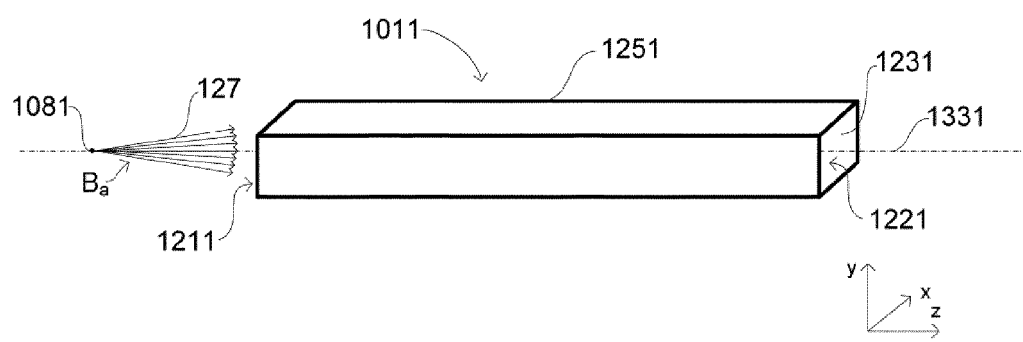
FIGS. 8A, 8B and 8C are schematic illustrations of an alternative embodiment of a radiation alteration device and the effect that the radiation alteration device has on radiation passing through the radiation alteration device.

In order to aid understanding of the increase in the etendue of the branch radiation beam $B_a$, which is caused by a radiation alteration device 101, a description is given below of the effect of a simple radiation alteration device. FIG. 8A is a schematic illustration of an embodiment of a radiation alteration device 1011 shown in perspective view. Also shown in FIG. 8A is a cartesian coordinate system which is used consistently throughout the Figures. The radiation alteration device 1011 comprises a tube 1251 having a first opening 1211 arranged to receive a branch radiation beam $B_a$ and a second opening 1221 arranged to output the radiation beam $B_a$ after modification of the branch radiation beam $B_a$ by the radiation alteration device 1011. The tube 1251 is defined by an internal surface 1231 which is substantially reflective to EUV radiation. In the example which is shown in FIG. 8A the cross-sectional shape of the internal surface 1231 of the tube 1251 is a square. The radiation alteration device 1011 has an optical axis 1331 which extends through the cross-sectional center of the tube 1251 and in the z-direction indicated in FIG. 8A. For ease of illustration and explanation, the embodiment of the radiation alteration device 1011 which is shown in FIG. 8A does not include a bend. However other embodiments of a radiation alteration device may include a bend (as is shown, for example, in FIG. 5).

The radiation alteration device 1011 receives a branch radiation beam $B_a$ which is represented in FIG. 8A as a series of rays 127 which extend from a focal point 1081. The branch radiation beam $B_a$ may be focused to the focal point 1081 prior to the branch radiation beam $B_a$ entering a radiation alteration device by one or more focusing optics (as is shown, for example, in FIG. 4). The focal point 1081 is situated upstream of the first opening 1211 and on the optical axis 1331. The rays 127 which are shown in FIG. 8A are therefore diverging from each other as they enter the radiation alteration device 1211, each ray forming an angle with the optical axis 1331. Whilst not shown in FIG. 8A the rays 127 enter the tube 1251 through the first opening 1211 and undergo multiple successive reflections at the internal surface 1231. In the example which is shown in FIG. 8A in which the cross-sectional shape of the internal surface 1231 of the tube 1251 is a square, the angle which each ray forms with the optical axis 1331 is conserved as the rays propagate along the tube 1251 and undergoes reflections at the internal surface 1231.

Figure 8B:
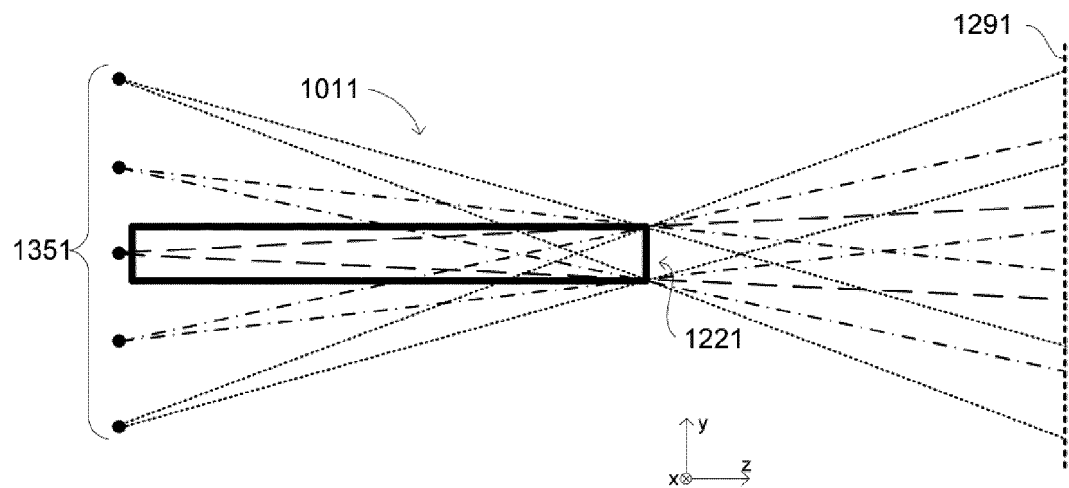

The result of the multiple reflections of the rays 127 at the internal surface 1231 will now be described with reference to FIG. 8B in which the radiation alteration device 1011 is shown in the y-z plane. Radiation which is output from the second opening 1221 of the radiation alteration device 1011 and which is incident on a plane 1291 situated downstream of the radiation alteration device 1011 is equivalent to radiation being emitted from a plurality of virtual point sources 1351 which each illuminate the entire second opening 1221 of the radiation alteration device 1011. By way of example, five virtual point sources 1351 are shown in FIG. 8B, each of which illuminate the full extent of the second opening 1221 of the radiation alteration device 1011. The illumination of the second opening 1221 by the virtual point sources 1351 is indicated in FIG. 8B with a series of dashed, dotted and dash-dot lines which indicate the outer extent of radiation emanating from each virtual point source 1351. In practice the radiation which is output from the second opening of the radiation alteration device 1011 and which is incident on a plane 1291 situated downstream of the radiation alteration device 1011 may be equivalent to radiation emitted from many more than five virtual point sources 1351, however for ease of illustration only five virtual point sources 1351 are shown in FIG. 8B.

It can be seen from FIG. 8B that the radiation emanating from the different point sources 1351 overlaps with each other so as to form a modified branch radiation beam $B_a$ downstream of the radiation alteration device (e.g. in the plane 1291 shown in FIG. 8B) which has an apparent source size of the area of the second opening 1221 of the radiation alteration device 1011.

As was described above the etendue G of a radiation beam may be estimated by $G=\pi A\theta^2$ where $\theta$ is the half divergence of the radiation beam and A is the area of the light source from which radiation is emitted (or equivalently the apparent source size of the radiation beam). The radiation beam which enters the radiation alteration device 1011 through the first opening 1211 radiates from a diffraction limited-focal point 1081 with a given divergence. The apparent source size A of the branch radiation beam $B_a$ which enters the radiation alteration device 1011 is therefore equivalent to the size of the focal point 1081. As was explained above the modified branch radiation beam $B_a$ which is output from the second opening 1221 of the radiation alteration device 1011 has an apparent source size A corresponding to the area of the second opening 1221 of the radiation alteration device 1011. The area of the second opening 1221 is significantly larger than the size of the diffraction limited focal point 1081 and thus the radiation alteration device 1221 significantly increases the apparent source size of the branch radiation beam $B_a$.

As was explained above, the angle which each ray 127, which enters the radiation alteration device 1011, forms with the optical axis 1331 is conserved during reflections of the rays 127 at the internal surface 1231 of the radiation alteration device 1011. The conservation of the angle which each ray 127 forms with the optical axis 1331 means that the maximum angle (relative to the optical axis) with which a ray 127 is output from the second opening 1221 of the radiation alteration device 1011 is the same as the maximum angle with which a ray 127 enters the radiation alteration device 1011. Consequently, the divergence of the modified branch radiation beam $B_a$ which is output from the second opening 1221 is approximately the same as the divergence of the branch radiation beam $B_a$ which enters the radiation alteration device 1011 through the first opening 1211.

The effect of the radiation alteration device 1011 on the branch radiation beam $B_a$ is therefore to increase the apparent source size of the branch radiation beam $B_a$ whilst causing little or no change to the divergence of the branch radiation beam $B_a$. Since the etendue of the branch radiation beam $B_a$ is approximately proportional to the product of the square of the half divergence $\theta$ of the branch radiation beam $B_a$ and the apparent source size A of the branch radiation beam $B_a$, the radiation alteration device 1011 advantageously causes a significant increase in the etendue of the branch radiation beam $B_a$.

In some embodiments the etendue of the modified branch radiation beam $B_a$ which exits the radiation alteration device 101 may be greater than at least 10 times the etendue of the branch radiation beam $B_a$ which enters the radiation alteration device 101. In some embodiments the etendue of the modified branch radiation beam $B_a$ which exits the radiation alteration device 101 may be several orders of magnitude greater than the etendue of the branch radiation beam $B_a$ which enters the radiation alteration device 101. For example, in some embodiments the etendue of the modified branch radiation beam $B_a$ which exits the radiation alteration device may be at least $1\times10^4$, $1\times10^6$ or $1\times10^8$ times the etendue of the branch radiation beam $B_a$ which enters the radiation alteration device 101. In some embodiments the radiation alteration device 101 may be configured to increase the etendue of the branch radiation beam $B_a$ such that the etendue of the branch radiation beam $B_a$ which is output from the radiation alteration device has an etendue which is greater than about $1\times10^{-8}$ m². For example, the radiation alteration device 101 may be configured to increase the etendue of the branch radiation beam $B_a$ such that the etendue of the branch radiation beam $B_a$ which is output from the radiation alteration device 101 is approximately $3\times10^{-8}$ or $5\times10^{-8}$ m².

The etendue of the modified branch radiation beam $B_a$ which is output from a radiation alteration device may constrain the minimum spot size to which the modified radiation beam $B_a$ can be focused at, for example, an intermediate focus IF. The spot size to which a modified radiation beam $B_a$ is focused at an intermediate focus IF depends on the etendue of the modified branch radiation beam $B_a$ and the focal length of a focusing optic which focuses the modified radiation beam $B_a$. In some embodiments, it may be desirable to provide a lithographic apparatus with a modified branch radiation beam $B_a$ having a desired divergence. For example, it may be desirable to provide a lithographic apparatus with a modified branch radiation beam $B_a$ having a half divergence $\theta$ which is about 0.2 radians. The focal length of a focusing optic which focuses the branch radiation beam $B_a$ to an intermediate focus IF may be configured such that the divergence of the branch radiation beam $B_a$ which enters a lithographic apparatus $LA_a$ (having passed through the intermediate focus IF) is close to the desired divergence. It may be desirable to limit the etendue of a modified branch radiation beam $B_a$ such that when the modified branch radiation beam $B_a$ is focused to the intermediate focus IF, the spot size of the modified branch radiation beam $B_a$ at the intermediate focus IF is no larger than a desired spot size at the intermediate focus IF.

Whilst an increase in the etendue of the branch radiation beam $B_a$ has been described above with reference to a specific embodiment of a radiation alteration device 1011, having a square cross-section and not including a bend, other embodiments of a radiation alteration which are configured differently to the embodiment shown in FIG. 8A (e.g. having a different cross-sectional shape and/or including one or more bends) may also cause an increase in the etendue of the branch radiation beam $B_a$ in a similar manner as has described above with reference to FIGS. 8A and 8B.

Figure 8C:
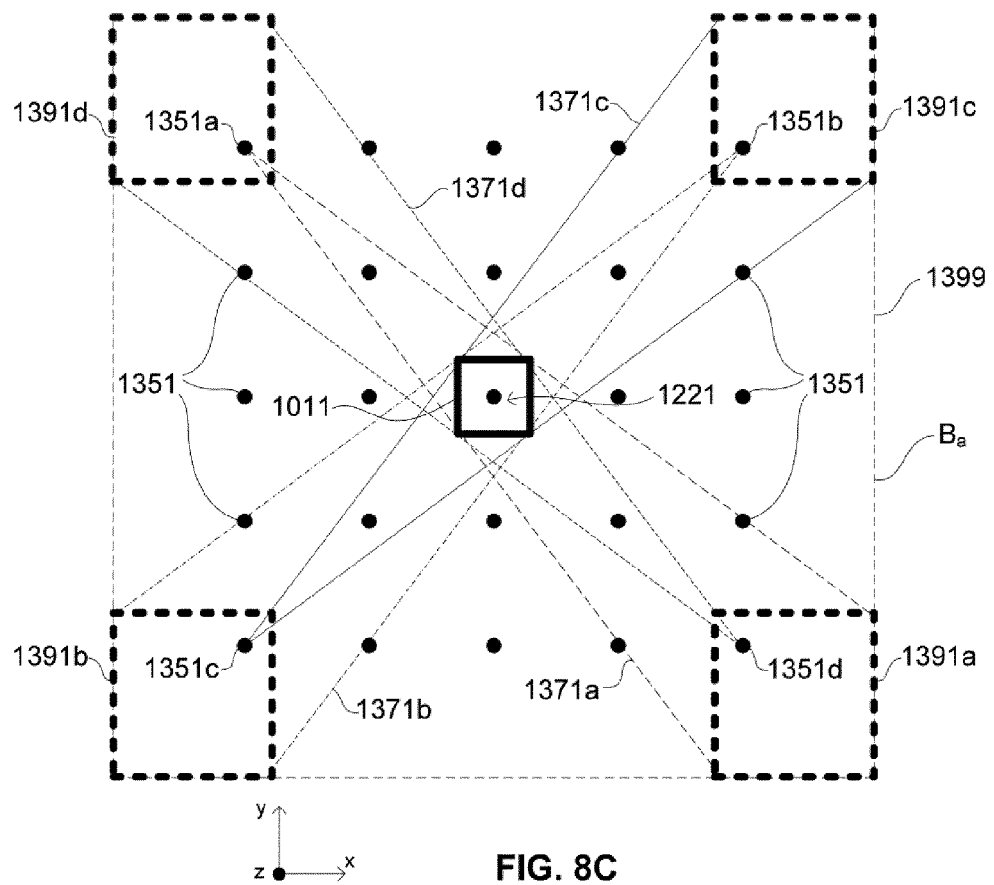

As was described above with reference to FIG. 8B the radiation which is output from the second opening 1221 of the radiation alteration device 1011 is equivalent to radiation emanating from a plurality of virtual point sources 1351 which each illuminate the entire second opening 1221 of the radiation alteration device 1011. FIG. 8C is a schematic illustration of the virtual point sources 1351 as viewed from a plane 1291 which lies downstream of the radiation alteration device 1011 and which is perpendicular to the z-direction. It can be seen from FIG. 8C that the radiation which is output from the second opening 1221 is equivalent to radiation emanating from a square shaped uniform grid of virtual point sources 1351 which extend around the radiation alteration device 1011 in the x and y-directions.

As was described above each virtual point source 1351 illuminates the entire second opening 1221 of the radiation alteration device 1011. In order to demonstrate the shape and extent of the radiation which is output from the radiation alteration device 1011, the radiation emanating from four virtual point sources 1351a, 1351b, 1351c and 1351d which form the corners of the grid of virtual point sources 1351 is shown with lines 1371a, 1371b, 1371c and 1371d in FIG. 8C. The cross-sectional extent of radiation emanating from each of the corner virtual point sources 1351a, 1351b, 1351c and 1351d in the plane 1291 is depicted in FIG. 8C with dashed boxes 1391a, 1391b, 1391c and 1391d. The radiation which emanates from the corner virtual point sources 1351a, 1351b, 1351c and 1351d forms the corners of the extent of the modified branch radiation beam $B_a$ in the plane 1291 downstream of the second opening 1221 of the radiation alteration device 1011. The extent of the modified branch radiation beam $B_a$ in the plane 1291 is indicated in FIG. 8C with a dashed box 1399. It can be seen from FIG. 8C that the modified branch radiation beam $B_a$ in the plane 1291 has a cross-sectional shape which is a square.

In general the cross-sectional shape of a modified branch radiation beam $B_a$ which is output from a radiation alteration device corresponds to the cross-sectional shape of the radiation alteration device. In other embodiments a radiation alteration device may have a cross-sectional shape other than a square. For example, some embodiments of a radiation alteration device may have an elliptical or circular cross-sectional shape (as is shown, for example, in FIG. 5). In other embodiments a radiation alteration device may have a cross-sectional shape which is a polygon. For example, the cross-sectional shape of a radiation alteration device may be a triangle, a square, a pentagon, a hexagon or another polygonal shape. In some embodiments the cross-sectional shape of a radiation alteration device may vary along its length. For example, the cross-sectional area of the radiation alteration device may increase along its length.

The cross-sectional shape of a radiation alteration device determines both the distribution of virtual source points 1351 and the cross-sectional shape of a modified branch-radiation beam $B_a$ which is output from the radiation alteration device 1011. The cross-sectional shape of a radiation alteration device may therefore be selected in order to provide a modified branch radiation beam $B_a$ having a desired cross-sectional shape. For example, the cross-sectional shape of a radiation alteration device may be selected so as to match the cross-sectional shape of the field facet mirror 10 on which the modified branch radiation beam $B_a$ is incident after having passed through an intermediate focus IF.

In some embodiments the field facet mirror 10 on which a modified branch radiation beam $B_a$ is incident has a generally circular shape. In such embodiments a radiation alteration device may be used which has a generally circular cross-sectional shape such that the shape of the modified branch radiation beam $B_a$ corresponds with the shape of the field facet mirror 10. Providing a modified branch radiation beam $B_a$ which has a cross-sectional shape corresponding with the cross-sectional shape of the field facet mirror 10 allows all of the field facets which form the field facet mirror 10 to be illuminated with the branch radiation beam $B_a$ whilst reducing any extent of the branch radiation beam $B_a$ which is not incident on a field facet and is therefore not directed to the pupil facet mirror 11 and is thus lost from the branch radiation beam $B_a$.

However, in some applications it may be desirable to use a radiation alteration device having a cross-sectional shape which is a polygon. A radiation alteration device have a polygonal cross-sectional shape may output a modified branch radiation beam $B_a$ whose angular and spatial intensity profile which is more homogenous than the angular and spatial intensity profile of a modified branch radiation $B_a$ which is output from a radiation alteration device having a circular or elliptical cross-sectional shape (assuming the same input branch radiation beam $B_a$). In embodiments in which it is desired to provide a branch radiation beam $B_a$ having a homogenous angular and spatial intensity profile it may therefore be desirable to use a radiation alteration device having a polygonal cross-sectional shape. In such embodiments a polygonal shape which is relatively similar to the cross-sectional shape of the field facet mirror 10 may be used so as to reduce the radiation which is lost from the branch radiation beam $B_a$ due to differences between the cross-sectional shape of the branch radiation beam $B_a$ and the cross-sectional shape of the field facet mirror 10. For example, in an embodiment in which the field facet mirror 10 has a generally circular shape, a radiation alteration device having a hexagonal cross-section may be used. The use of a radiation alteration device having a hexagonal cross-section may reduce the amount of radiation which is lost from the radiation beam $B_a$ due to differences between the cross-sectional shape of the branch radiation beam $B_a$ and the cross-sectional shape of the field facet mirror 10 than when compared to, for example, the use of a radiation alteration device having a square shaped cross-section.

In other embodiments the field facet mirror 10 may have a shape other than a generally circular shape. For example, in some embodiments the field facet mirror 10 may have a generally rectangular shape. In such embodiments a radiation alteration device having a rectangular cross-section may be used in order to provide a branch radiation beam $B_a$ having a cross-sectional shape which is similar to the cross-sectional shape of the field facet mirror 10.

In addition to the influence of the cross-sectional shape of a radiation alteration device on the cross-sectional shape of the modified branch radiation beam $B_a$ which is output from the radiation alteration device, the shape and dimensions of a radiation alteration device may influence other properties of a modified branch radiation beam $B_a$ which is output from the radiation alteration device. For example, the shape and dimensions of a radiation alteration device may influence the degree of spatial scrambling of rays 127 which form the branch radiation beam $B_a$ which is caused by the radiation alteration device.

As was described above with reference to FIG. 5 some embodiments of a radiation alteration device may include at least one bend. Including a bend in a radiation alteration device may cause a change in the angular spread of rays which form a branch radiation beam $B_a$. As a ray passes along a bend in a radiation device the angle which the ray forms with an optical axis which extends along the cross-sectional center of the radiation alteration device may change and thus the angle which each ray forms with the optical axis is no longer conserved as the rays propagate along the radiation alteration device. As a result the range of angles which the rays form with the optical axis at the second opening of the radiation alteration device may be increased by the presence of a bend in the radiation alteration device. For example, the maximum angle which the rays form with the optical axis may be increased by an amount which is approximately equal to the bend angle α of a bend in the radiation alteration device. An increase in the range of angles which the rays form with the optical axis may increase the divergence of the modified branch radiation beam $B_a$ which is output from the radiation alteration device and may therefore cause a further increase in the etendue of the modified branch radiation beam $B_a$.

An increase in the range of angles which the rays form with the optical axis of a radiation alteration device also causes an increase in the range of grazing angles with which each ray is incident on the internal surface of the radiation alteration device. Increasing the range of grazing angles with which each ray is incident on the internal surface of the radiation alteration device may increase the variety of different paths with which rays propagate through the radiation alteration device and may therefore increase the spatial scrambling of the rays which is caused by the radiation alteration device. Including one or more bends in a radiation alteration device may therefore increase the spatial scrambling of rays of a branch radiation beam $B_a$ which is caused by a radiation alteration device.

In the embodiments which have been described above and which have been shown in the Figures, the branch radiation beam is focused to a focal point which lies on an optical axis of a radiation alteration device before the branch radiation beam $B_a$ enters the radiation alteration device. For example, in the embodiment which is shown in FIG. 8A the branch radiation beam $B_a$ is focused to a focal point 1081 which lies on the optical axis 1331 of the radiation alteration device 1011. However in some embodiments a branch radiation beam $B_a$ may be focused to a focal point which does not lie on an optical axis of a radiation alteration device.

Figure 9:
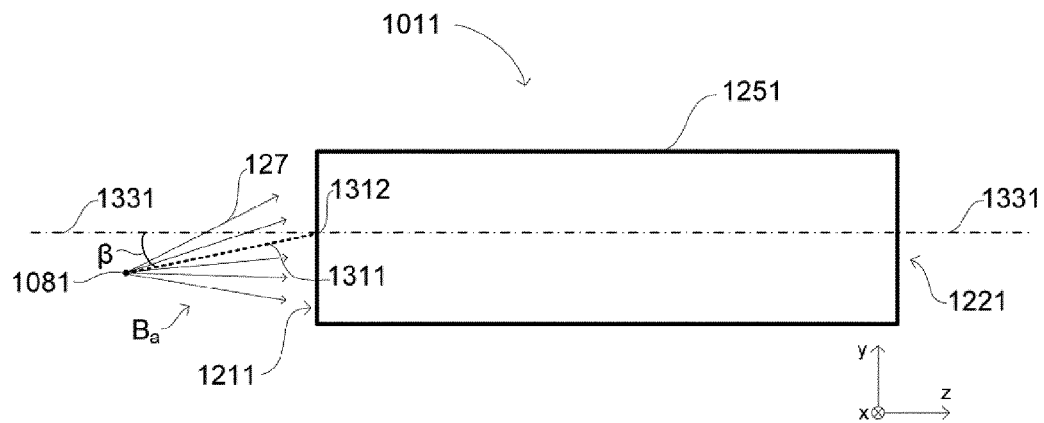
FIG. 9 is a schematic illustration of a radiation beam being focused to an off-axis position before entering a radiation alteration device.

FIG. 9 is a schematic illustration of a branch radiation beam $B_a$ entering a radiation alteration device 1011 where a focal point 1081 of the branch radiation beam $B_a$ does not lie on the optical axis 1331 of the radiation alteration device 1011. The optical axis 1331 of the radiation alteration device 1011 extends along the cross-sectional center of the tube 1251. The optical axis 1331 extends into and out of the tube 1251 through the first 1211 and second 1221 openings. As is shown in FIG. 9 the branch radiation beam $B_a$ is focused to a focal point 1081 which does not lie on the optical axis 1331. The amount by which the focal point 1081 is displaced from the optical axis 1331 may be quantified with an off-axis angle β. The off-axis angle β is the angle which is formed between the optical axis 1331 and a line 1311 which extends between the focal point 1081 and a position 1312 on the optical axis 1331 at which the optical axis 1331 passes through the first opening 1211. In some embodiments the off-axis angle β may be approximately the same as or is greater than the half divergence θ of the branch radiation beam $B_a$ which enters the radiation alteration device 1011.

Focusing a branch radiation beam $B_a$ to a focal point which does not lie on an optical axis 1331 of the radiation alteration device (as is shown in FIG. 9) may increase the range of angles which the rays 127 form with the optical axis and may increase the range of grazing angles with which the rays are incident on the internal surface of the radiation alteration device. Focusing a branch radiation beam to a focal point which does not lie on an optical axis of a radiation alteration device may therefore increase the divergence of the modified branch radiation beam $B_a$ which is output from the radiation alteration device and may increase the spatial scrambling of the rays which is caused by the radiation alteration device. In particular, focusing a branch radiation beam $B_a$ to a focal point which does not lie on an optical axis and which has an off-axis angle β which is approximately the same as or is greater than the half divergence θ of the branch radiation beam $B_a$ which enters the radiation alteration device, may result in a desirable amount of spatial scrambling in the radiation alteration device 1011.

Additionally or alternatively the range of angles which the rays form with the optical axis and the range of grazing angles with which the rays are incident on the internal surface of a radiation alteration device may be increased by increasing the divergence of the branch radiation beam $B_a$ which enters the first opening of the radiation alteration device. For example, the focal length of one or more focusing optics (e.g. the first focusing optic 107 shown in FIG. 4) which are configured to focus the branch radiation beam $B_a$ before the branch radiation beam $B_a$ enters the radiation alteration device may be decreased so as to increase the divergence of the branch radiation beam $B_a$ which enters the radiation alteration device.

Embodiments have been described above in which a range of grazing angles with which rays 127 of a branch radiation beam $B_a$ are incident on an internal surface of a radiation alteration device may be increased. However the reflectivity of an internal surface of a radiation alteration device may be a strong function of the grazing angle with which radiation is incident on the internal surface. In particular the reflectivity of an internal surface of a radiation alteration device may decrease with increasing grazing angles. An increase in the grazing angles with which radiation is incident on an internal surface of a radiation alteration device may therefore lead to a decrease in the amount of radiation which is reflected at an internal surface of a radiation alteration device and may lead to an increase in an amount of radiation which is lost from a branch radiation beam $B_a$ as it propagates along a radiation alteration device.

In some embodiments the internal surface of a radiation alteration device may comprise a substrate (e.g. a silicon substrate) on which a reflective coating is disposed. For example, a smooth coating of ruthenium coating may be disposed on a substrate so as to form the internal surface of a radiation alteration device. The amount of EUV radiation which is lost due to absorption during a reflection from a ruthenium coating may be approximately proportional to the grazing angle with which the EUV radiation is incident on the ruthenium coating. For example, approximately 0.06% of EUV radiation may be lost due to absorption during a reflection from a ruthenium coating per milliradian of grazing angle.

In some embodiments coatings other than ruthenium may be used. For example, a coating comprising molybdenum may be used. In other embodiments a multilayer coating may be used comprising alternating layers of a first and second material. The first material may, for example, be molybdenum. The second material may, for example, be silicon. In some embodiments one or more layers of a third material may be interspersed with the first and second materials. For example, a layer of a third material may be positioned between each layer of the first and second materials. The third material may, for example, be $B_4C$. In some embodiments the first material may be $Mo_2C$ and the second material may be silicon. Radiation alteration devices comprising a multilayer coating may, for example, be suitable for receiving and reflecting EUV radiation at grazing incidence angles which are greater than about 200 milliradians.

In some embodiments the divergence of a branch radiation beam $B_a$ as it enters a radiation alteration device, the bend angle α of a bend in the radiation alteration device and/or the extent to which a focal point of the branch radiation beam $B_a$ is located away from an optical axis of the radiation alteration device, may be limited so as to limit the maximum grazing angle with which rays 127 are incident on an internal surface of the radiation alteration device. Since the amount of radiation which is absorbed during a reflection at the internal surface increases with increasing grazing angle, limiting the maximum grazing angle may limit the amount of radiation which is lost from the branch radiation beam $B_a$ due to absorption. In some embodiments, the bend angle α of a bend in a radiation alteration device may be less than approximately 5 degrees. In some embodiments the bend angle α of a bend in a radiation alteration device may be less than about 2 degrees.

In some embodiments the bend angle α may be approximately equal to or greater than the half divergence θ of the branch radiation beam $B_a$ as it enters the radiation alteration device. In some embodiments the bend angle α may be sufficiently large that no direct line of sight is provided through the radiation alteration device. In such embodiments there is no optical path along which radiation can propagate through the radiation alteration device without undergoing a reflection at the internal surface of the radiation alteration device.

An embodiment of a radiation alteration device may comprise a tube having a length of approximately 1 m and a diameter of approximately 1 mm. The tube may include a bend angle of approximately 10 milliradians. The radiation alteration device may include an internal surface comprising a smooth ruthenium coating. In such an embodiment if a branch radiation beam $B_a$ is focused to a focal point positioned on an optical axis of the radiation alteration device such that the branch radiation beam $B_a$ enters the radiation alteration device with a half divergence θ of approximately 10 milliradians then approximately 5% of the branch radiation beam $B_a$ may be lost to absorption at the internal surface.

An alternative embodiment of a radiation alteration device may comprise a tube having a length of approximately 1 m and a diameter of approximately 4 mm. The tube may include a bend angle of approximately 20 milliradians. The radiation alteration device may include an internal surface comprising a smooth ruthenium coating. In such an embodiment a branch radiation beam $B_a$ may be focused to a focal point which is not positioned on an optical axis of the radiation alteration device such that the off-axis angle β is approximately 20 milliradians. The branch radiation beam $B_a$ may enter the radiation alteration device with a half divergence θ of approximately 20 milliradians. In such an embodiment the divergence of the branch radiation beam $B_a$ may be increased by the radiation alteration device such that the half divergence of the branch radiation beam $B_a$ which is output from the radiation alteration device is approximately 60 milliradians. The radiation alteration device may increase the etendue of the branch radiation beam $B_a$ such that the etendue of the branch radiation beam $B_a$ which is output from the radiation alteration device is of the order of $1 \times 10^8$ times larger than the etendue of the branch radiation beam $B_a$ which is input to the radiation alteration device. Such an embodiment of a radiation alteration device may result in approximately 15% of the power of the branch radiation beam $B_a$ being lost to absorption at the internal surface.

In other embodiments the branch radiation beam $B_a$ may enter the radiation alteration device with a half divergence θ of approximately other than 20 milliradians. In some embodiments, the half divergence θ may, for example, be greater than about 10 milliradians. In some embodiments, the half divergence θ may, for example, be less than about 100 milliradians. In some embodiments, the radiation alteration device may not include a bend and the divergence of the radiation which exits the radiation alteration device may be substantially the same as the divergence of the radiation which enters the radiation alteration device.

The amount of radiation which is lost to absorption at the internal surface may, for example, be decreased by decreasing the divergence of the branch radiation beam $B_a$ as it enters the radiation alteration device, decreasing the bend angle of the bend in the radiation alteration device and/or altering the dimensions of the radiation alteration device so as to decrease the number of reflections which each ray of the branch radiation beam $B_a$ undergoes at the internal surface. However as was described above, increases in the divergence of the branch radiation beam $B_a$, increases in the bend angle α of a bend in a radiation alteration device and/or increasing a number of reflections which each ray undergoes at the internal surface may bring about other advantageous effects. The dimensions of a radiation alteration device and the focusing of a branch radiation beam $B_a$ prior to input of the branch radiation beam $B_a$ to a radiation alteration device may therefore be selected so as to bring about an advantageous modification of the branch radiation beam $B_a$ whilst reducing the loss of radiation caused by absorption of the branch radiation beam $B_a$ at the internal surface of the radiation alteration device.

It will be appreciated from the discussion provided above that a radiation alteration device may be configured with a variety of different shapes and dimensions each of which influences the modification of a branch radiation beam $B_a$ which is caused by the radiation alteration device. It will be appreciated that the shape and dimensions of a radiation alteration device may be tailored to specific applications so as to provide a desired modification of a branch radiation beam $B_a$.

As was described above it is desirable to reduce the amount of radiation which is lost from a branch radiation beam $B_a$ through absorption of radiation at the internal surface of a radiation alteration device. The loss of radiation from the branch radiation beam $B_a$ may increase if the internal surface of the radiation alteration device becomes contaminated. For example, during use particles and/or molecules may be deposited on the internal surface of the radiation alteration device. For example, carbon molecules may be deposited on the internal surface of the radiation alteration device, thereby leading to the growth of a carbon layer on the internal surface. Contamination which is deposited on the internal surface of a radiation alteration device may absorb and/or scatter radiation from the branch radiation beam $B_a$ therefore causing radiation to be lost from the branch radiation beam $B_a$. In order to reduce contamination of the internal surface of a radiation alteration device it may be desirable to clean the internal surface.

Figure 10:
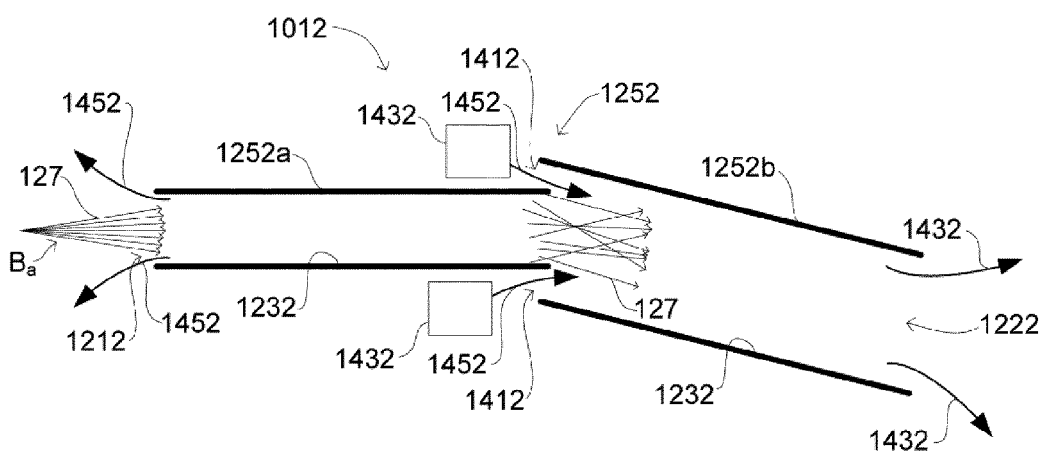
FIG. 10 is a schematic illustration of an alternative embodiment of a radiation alteration device which includes a gas supply.

FIG. 10 is a schematic illustration of an embodiment of a radiation alteration device 1012 which provides for cleaning of an internal surface 1232 of the radiation alteration device 1012. The radiation alteration device 1012 comprises a tube 1252 having a first section 1252a and a second section 1252b. The first and second sections 1252a, 1252b of the tube define an internal surface 1232 of the tube which is substantially reflective to EUV radiation. The first section 1252a of the tube includes a first opening 1212 arranged to receive a branch radiation beam $B_a$. The second section 1252b of the tube includes a second opening configured to output a modified branch radiation beam $B_a$. The second section 1252b of the tube is arranged to receive radiation from the first section 1252a of the tube. The first and second sections 1252a, 1252b of the tube are arranged so as to form a gap 1412 between the first and second sections 1252a, 1252b through which gas may enter or leave the tube 1252. The radiation alteration device 1012 further comprises gas supplies 1432 configured to inject gas 1452 through the gap 1412 and into the tube 1252.

The gas 1452 may, for example, comprise hydrogen. The hydrogen gas which is injected into the tube 1252 is irradiated with EUV radiation from the branch radiation beam $B_a$ which may result in the formation of hydrogen radicals. Hydrogen radicals are highly reactive and if brought into contact with contamination which may be deposited on the internal surface 1232 the hydrogen radicals may react with the contamination to cause a gaseous compound. The gaseous compound formed from a reaction between hydrogen radicals and contamination may flow out of the tube 1252, for example through the first opening 1212 or the second opening 1222, thereby removing the contamination from the tube 1252. The injection of hydrogen gas into the tube therefore serves to clean the internal surface 1232 of the tube 1252.

The first and second sections 1252a, 1252b of the tube 1252 are arranged relative to each other such that radiation which enters the tube 1252 through the first opening 1212 does not exit the tube 1252 through the gap 1412. As is shown in FIG. 10 a branch radiation beam $B_a$ comprising a series of diverging rays 127 enters the tube 1252 through the first opening 1212. The rays 127 undergo reflections (not shown in FIG. 10) at the internal surface 1232 such that the rays 127 exit the first section 1252a of the tube 1252 propagating in directions such that they are incident on the internal surface 1232 of the second section 1252b and are not incident on the gap 1412. The first and second sections 1252a, 1252b are therefore arranged relative to each other such that no radiation is lost through the gap 1412.

In the embodiment which is shown in FIG. 10 the second section 1252b of the tube is arranged at an angle with respect to the first section 1252a of the tube so as to form a bend in the tube 1252. However in other embodiments the second section 1252b may extend in substantially the same direction as the first section 1252a of the tube such that the first and second sections do not form a bend.

As was described above a radiation alteration device may be configured so as to cause rays 127 which form a branch radiation beam $B_a$ to be spatially scrambled by the radiation alteration device. In some embodiments it may be desirable to further introduce temporal variation to the modified branch radiation beam $B_a$ which is output from a radiation alteration device.

Figure 11:
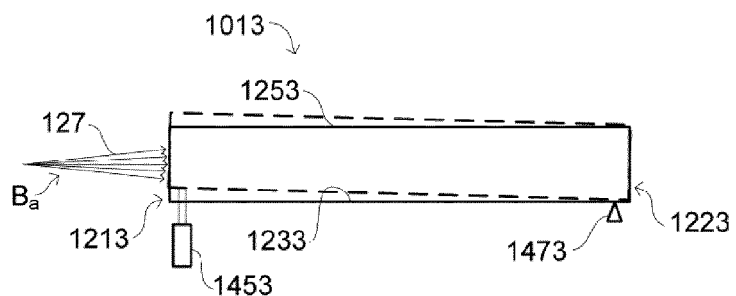
FIG. 11 is a schematic illustration of an alternative embodiment of a radiation alteration device which includes an actuator configured to cause the radiation device to undergo an oscillatory motion.

FIG. 11 is a schematic illustration of an embodiment of a radiation alteration device 1013 which is configured to introduce temporal variations to a modified branch radiation beam $B_a$ which is output from the radiation alteration device 1013. The radiation alteration device 1013 comprises a tube 1253 having a first opening arranged to receive a branch radiation beam $B_a$ and a second opening 1223 arranged to output a modified branch radiation beam $B_a$. The tube 1253 is defined by an internal surface 1233 which is substantially reflective to EUV radiation. The radiation alteration device further comprises an actuator 1453 operable to actuate the tube 1253 so as to cause the tube 1253 to undergo an oscillatory motion. For example, the tube 1253 may be repeatedly moved between a first position (indicated by the solid line in FIG. 11) and a second position (indicated by the dashed line in FIG. 11). Movement between the first and second positions may, for example, comprise pivoting the tube 1253 about a pivot point 1473. In some embodiments the actuator 1453 may be operable to actuate the tube 1253 so as to cause the tube 1253 to undergo a circular motion. For example, the first opening 1213 of the tube 1253 may undergo a circular motion in the x-y plane.

Movement of the tube 1253 may cause a change in position at which the rays 127 of the branch radiation beam $B_a$ are output from the second opening 1223 of the radiation alteration device 1013 and/or may cause a change in the directions in which the rays 127 propagate as they are output from the second opening 1223. Movement of the tube 1253 therefore causes a temporal scrambling of the rays 127 in addition to the spatial scrambling of the rays 127 which has been described above. Consequently the angular and spatial intensity profile of the modified branch radiation beam $B_a$ which is incident on the field facet mirror 10 may oscillate with time.

During exposure of a substrate W in a lithographic apparatus $LA_a$ each target portion of the substrate W is exposed to radiation for a given exposure time. In general it is desirable to expose a target portion of a substrate W to a desired dose of radiation during an exposure time period. It is therefore the integral of the intensity of radiation to which the target portion is exposed during an exposure time period which is important rather than the nature of any variations in the intensity of radiation which occur during an exposure time period. In order to ensure that each target portion of a substrate W is exposed to approximately the same dose of radiation it is desirable that the time period of the oscillatory motion of the tube 1253 is less than the exposure time of a target portion of the substrate W. In some embodiments, the exposure time of a target portion of a substrate W may be approximately 1 ms. In such embodiments the frequency of the oscillatory motion of the tube 1253 may be greater than about 1 kHz such that the time period of the oscillatory motion is less than the exposure time. In some embodiments the frequency of the oscillatory motion may be about 5 kHz or may be greater than about 5 kHz.

Introducing a temporal scrambling of the rays 127 which are output from the radiation alteration device 1013 may be advantageous for the same reasons as were described above with reference to a spatial scrambling of the rays 127. In some embodiments introducing a temporal scrambling of the rays 127 may allow the dimensions of a radiation alteration device to be adjusted so as to reduce the loss of radiation from the branch radiation beam $B_a$ due to absorption at the internal surface of the radiation alteration device.

The degree of spatial scrambling of rays 127 which is caused by a radiation alteration device increases with the number of reflections which the rays 127 undergo at the internal surface of the radiation alteration device. The number of reflections which the rays 127 undergo may be approximately proportional to θL/D where θ is the half divergence with which a branch radiation beam $B_a$ enters a radiation alteration device, L is the length of the radiation alteration device and D is the diameter of a tube which forms the radiation alteration device. The degree of spatial scrambling may therefore be increased by increasing the divergence of the branch radiation beam $B_a$, increasing the length L of the radiation alteration device and/or decreasing the diameter of the radiation alteration device. However the amount of radiation which is lost from a branch radiation beam $B_a$ due to absorption at the internal surface of a radiation alteration device may be approximately proportional to $\theta^2 L/D$. Altering the dimensions of a radiation alteration device and/or the divergence of the branch radiation beam $B_a$ in order to increase the degree of spatial scrambling of the rays 127 may therefore result in an increase in the amount of radiation which is lost from the branch radiation beam $B_a$ due to absorption.

Introducing a temporal scrambling of the rays 127 which are output from the radiation alteration device 1013 may allow the degree of spatial scrambling which is caused by the radiation alteration device 1013 to be decreased whilst still achieving the advantageous effects which are associated with scrambling the rays 127. Introducing a temporal scrambling of the rays 127 may therefore allow the length L of the radiation alteration device 1013 to be decreased, the divergence of the branch radiation beam $B_a$ to be decreased and/or the diameter D of the tube 1253 to be increased, thereby advantageously decreasing the amount of radiation which is lost from the branch radiation beam $B_a$ due to absorption whilst still achieving the advantageous effects which are associated with a scrambling the rays 127.

Whilst an oscillatory motion of the tube 1253 has been described above in order to introduce a temporal scrambling of the rays 127, in some embodiments one or more other optical components may be forced to undergo an oscillatory motion in order to introduce a temporal scrambling. For example, one or more actuators may be configured to cause one or more of the second focusing optical 109 and/or the third focusing optic 111 to undergo an oscillatory motion so as to introduce a temporal scrambling to the rays 127.

Figure 12A:
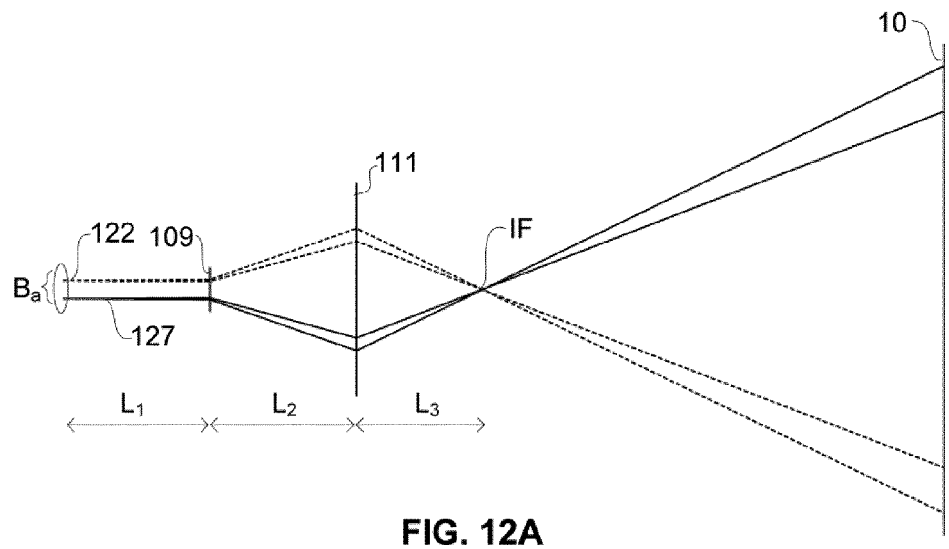
FIGS. 12A, 12B, 12C, 12D and 12E are schematic illustrations of focusing schemes which may be used to focus radiation which is output from a radiation alteration device.
Figure 12B:
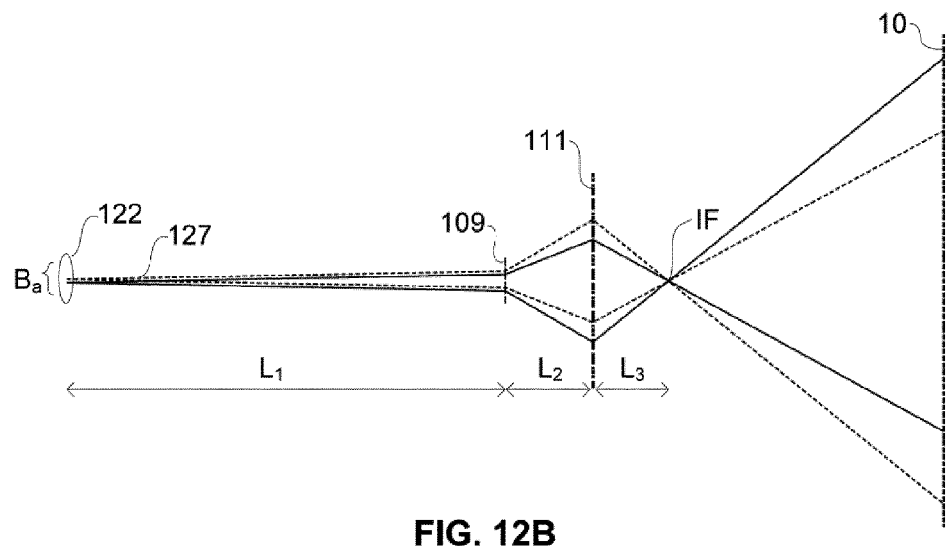

As has been described above, in some embodiments the modified branch radiation beam $B_a$ which is output from a radiation alteration device is focused (e.g. with the second focusing optic 109 and the third focusing optic 111 shown in FIG. 4) to an intermediate focus IF located at an opening 8 in an enclosing structure of a lithographic apparatus $LA_a$. FIGS. 12A and 12B are schematic illustrations of two alternative focusing schemes which may be used to focus the modified branch radiation beam $B_a$ output from a radiation alteration device to an intermediate focus IF so as to illuminate a field facet mirror 10.

For ease of illustration and explanation the second focusing optic 109 and the third focusing optic 111 are shown in FIGS. 12A and 12B as being transmissive focusing optics. However in practice the focusing schemes illustrated in FIGS. 12A and 12B may be implemented using reflective focusing optics as will be understood by a person skilled in the art. The two focusing schemes which are shown in FIGS. 12A and 12B differ from each other in that the distances between the various components are different. In each of FIGS. 12A and 12B, the distance between a second opening 122 of a radiation alteration device from which a modified branch radiation beam $B_a$ is output and the second focusing element 109 is labeled $L_1$. The distance between the second focusing element 109 and the third focusing element 111 is labeled $L_2$ and the distance between the second focusing element 111 and the intermediate focus IF is labeled $L_3$. The second focusing optic 109 has a focal length $f_2$ which is less than zero. The third focusing optic 111 has a focal length $f_3$ which is greater than zero. The path of the modified branch radiation beam $B_a$ from the second opening 122 of the radiation alteration device to a far field plane in which the field facet mirror 10 lies is shown in FIGS. 12A and 12B with solid and dotted lines 127 which represent different rays 127 which form the modified branch radiation beam $B_a$.

In the focusing scheme which is shown in FIG. 12A, the second focusing optic 109 and the third focusing optic 111 are configured to form an image of the second opening 122, from which the modified branch radiation beam $B_a$ is output, on the field facet mirror 10. An image of the second opening 122 is formed on the field facet mirror 10 by ensuring that the distance $L_1$ between the second opening 122 and the second focusing optic 109 is sufficiently small that the modified radiation beam $B_a$ reaches the second focusing optic 109 before the rays 127 have substantially overlapped with each other. This may be achieved if the distance $L_1$ between the second opening 122 and the second focusing optic 109 is much less than the diameter of the second opening 122 divided by the divergence of the modified branch radiation beam $B_a$ at the second opening. Since the focusing scheme which is shown in FIG. 12A forms an image of the second opening 122 on the field facet mirror 10, the spatial intensity profile of the radiation which is incident on the field facet mirror 10 depends on the spatial intensity profile of the modified branch radiation beam $B_a$ at the second opening 122.

Whilst, it has been stated above that the focusing scheme which is shown in FIG. 12A is configured to form an image of the second opening 122 on the field facet mirror 10, an in focus image of the second opening 122 may, in practice, be formed in a plane which lies between the intermediate focus and the field facet mirror 10. The image which is formed on the field facet mirror 10 may therefore be out of focus. However, despite the image which is formed on the field facet mirror 10 being out of focus, the intensity profile of the radiation which is incident on the field facet mirror 10 may still be predominantly dependent on the spatial intensity profile of the modified branch radiation beam $B_a$ at the second opening 122.

In contrast to the focusing scheme which is shown in FIG. 12A, in the focusing scheme which is shown in FIG. 12B the distance $L_1$ between the second opening 122 and the second focusing optic 109 is much greater than in the focusing scheme which is shown in FIG. 12A. Consequently an image of the second opening 122, from which the modified branch radiation beam $B_a$ is output, is no longer formed on the field facet mirror 10 but is instead formed close to the intermediate focus IF. Since an image of the second opening 122 is formed close to the intermediate focus IF, the radiation which is incident on the field facet mirror 10 depends on the angular intensity profile of the modified branch radiation beam $B_a$ at the second opening 122.

Typically the spatial intensity profile of the branch radiation beam $B_a$ at the second opening 122 is more homogenous than the angular intensity profile of the branch radiation beam $B_a$ at the second opening 122. Consequently the focusing scheme which is shown in FIG. 12A advantageously results in a spatial intensity profile at the field facet mirror 10 which is more homogenous than the spatial intensity profile which is formed at the field facet mirror 10 due to the focusing scheme which is shown in FIG. 12B.

Figure 12C:
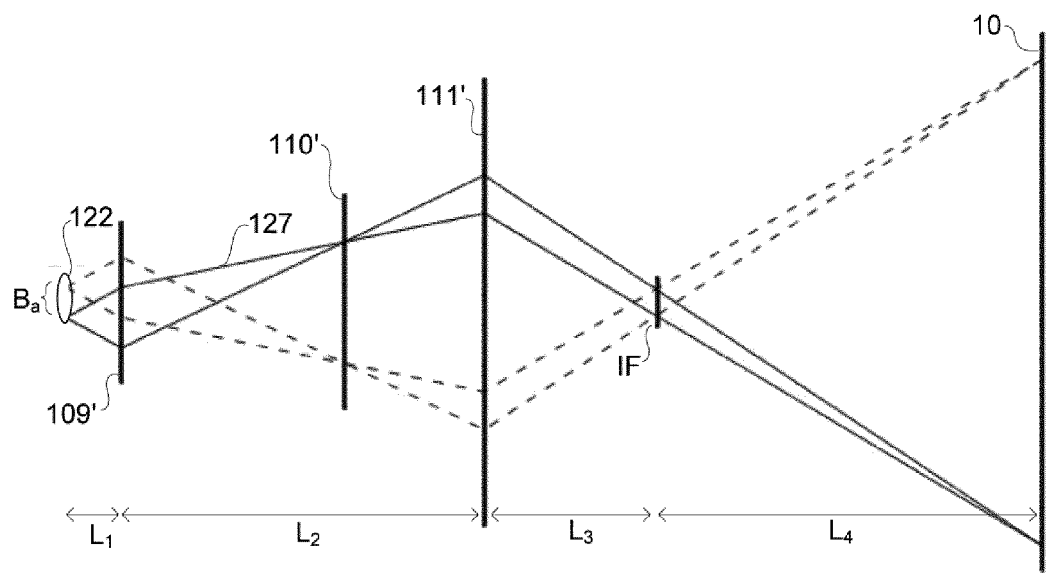

As was described above, in the embodiments which are shown in FIGS. 12A and 12B the second focusing optic 109 has a negative focusing power (focal length of less than zero) and the third focusing optic 111 has a positive focusing power (focal length of greater than zero). FIG. 12C is a schematic illustration of a still further embodiment of a focusing scheme which may be used to focus a modified branch radiation beam $B_a$ which is output from a radiation alteration device so as to illuminate a field facet mirror 10.

The focusing scheme which is shown in FIG. 12C comprises a second focusing optic 109' and a third focusing optic 111' which both have a positive focusing power (focal length of greater than zero). The second focusing optic 109' is configured to form a magnified image of the second opening 122 of a radiation alteration device at an image plane 110'. The third focusing optic 111' is configured to focus the image which is formed at the image plane 110' on to the field facet mirror 10. The focusing scheme which is shown in FIG. 12C therefore focuses an image of the second opening 122 of a radiation alteration device onto the field facet mirror 10.

As was described above the spatial intensity profile of a branch radiation beam $B_a$ at the second opening 122 is typically more homogenous than the angular intensity profile of the branch radiation beam $B_a$. Forming an image of the second opening 122 on the field facet mirror 10 may therefore advantageously result in a spatial intensity profile at the field facet mirror 10 which is relatively homogenous. The focusing arrangement which is shown in FIG. 12C and which includes two focusing optics both having a positive focusing power may advantageously allow the image of the second opening 122 which is formed at the field facet mirror 10 to be substantially in focus at the field facet mirror 10. That is, the focusing scheme of FIG. 12C may advantageously allow an image of the second opening 122 to be formed in a focal plane which is substantially coincident with the plane in which the field facet mirror 10 lies. This is in contrast to the focusing schemes of FIGS. 12A and 12B in which the focal plane of an image of the second opening 122 lies at or near to the intermediate focus IF (FIG. 12B) or between the intermediate focus IF and the field facet mirror 10 (FIG. 12A). As was described above, forming an in-focus image of the second opening 122 substantially at the field facet mirror 10 may advantageously increase the spatial homogeneity of radiation which is incident on the field facet mirror (when compared to forming an image whose focal plane lies before the field facet mirror 10). The focusing scheme which is shown in FIG. 12C may, in some embodiments, therefore provide a spatial intensity distribution at the field facet mirror 10 which is more homogenous than a spatial intensity distribution which is provided at the field facet mirror 10 by the focusing schemes shown in FIGS. 12A and 12B.

As is shown in FIG. 12C the second 109' and third focusing optics 111' are configured to focus rays 127 of the branch radiation beam $B_a$ such that all of the rays 127 pass substantially through an intermediate focus IF. Whilst the intermediate focus IF which is shown in FIG. 12C is referred to as a focus, in the embodiment of FIG. 12C the rays 127 are not focused to a single focal point and the branch radiation beam $B_a$ is not in focus at the intermediate focus IF. In the embodiment of FIG. 12C the intermediate focus IF is not therefore a focal point and merely represents a region through which all rays 127 pass. The region through which the rays 127 pass may, for example, coincide with an opening 8 in an enclosing structure of a lithographic apparatus LA.

The term "intermediate focus" is used throughout this document to refer to a region through which rays 127 of a radiation beam (e.g. a branch radiation beam $B_a$) are directed to pass. An intermediate focus IF may, in some embodiments, be a focal point. In other embodiments an intermediate focus IF may be a region having a non-zero area. An intermediate focus IF may coincide with an opening 8 in an enclosing structure of a lithographic apparatus LA such that rays 127 which pass through the intermediate focus IF also pass through the aperture 8 and into the lithographic apparatus LA.

A focusing scheme of the type which is depicted in FIG. 12C may be implemented in a number of different ways. For example, the focal lengths of the second 109' and third 111' focusing optics and the separations between the second opening 122, the focusing optics 109', 111', the intermediate focus IF and the field facet mirror 10 may be configured differently in different embodiments.

In an embodiment, which is presented by way of example only, the second opening 122 of a radiation alteration device, having a diameter of approximately 4 mm, may be imaged on to a field facet mirror 10 using a focusing scheme of the type shown in FIG. 12C. In such an embodiment the distance $L_1$ between the second opening 122 and the second focusing optic 109' may be approximately 109 mm. The focal length $f_2$ of the second focusing optic 109' may be approximately 104 mm. The distance $L_2$ between the second focusing optic 109' and the third focusing optic 111' may be approximately 2.5 m. The focal length $f_3$ of the third focusing optic 111' may be approximately 190 mm. The distance $L_3$ between the third focusing optic 111' and the intermediate focus IF may be approximately 209 mm. A distance $L_4$ between the intermediate focus IF and the field facet mirror 10 may be approximately 1 m.

For ease of illustration, in the representation of the focusing scheme which is depicted in FIG. 12C the second focusing optic 109' and the third focusing optic 111' are depicted as being transmissive focusing optics. However, it will be understood by those skilled in the art that the focusing scheme which is depicted in FIG. 12C may be implemented using reflective optics. For example, the second focusing optic 109' and/or the third focusing optic 111' may be mirrors. In some embodiments, the second focusing optic 109' and/or the third focusing optic 111' may be implemented as grazing-incidence mirrors. The second focusing optic 109' and/or the third focusing optic 111' may have a reflective surface which has a substantially ellipsoidal shape. In some embodiments the second focusing optic 109' and/or the third focusing optic 111' may have a reflective surface which has an optimized free-form shape which is not substantially ellipsoidal.

The embodiments depicted in FIGS. 12A-12C each comprise two focusing optics. In other embodiments, a suitable focusing scheme may be realized using only a single focusing optic. In the embodiments of FIGS. 12A-12C the second opening 122 of a radiation alteration device may be imaged onto an image plane with a relatively large magnification ratio. In order to achieve such a magnification using a single focusing optic, the single focusing optic may need to be positioned very near to the second opening 122. Such an implementation may be impractical when using a reflective focusing element which receives radiation at grazing incidence angles. The use of a plurality of focusing optics, advantageously allows the focusing optics to be located at a greater distance from the second opening 122. This may allow grazing incidence reflective optics to be used. However, in alternative embodiments the magnification ratio with which the second opening 122 of the radiation alteration device is imaged onto an image plane may be smaller than that shown in FIGS. 12A-12C. This may allow for a practical implementation of the focusing schemes using a single focusing optic.

Figure 12D:
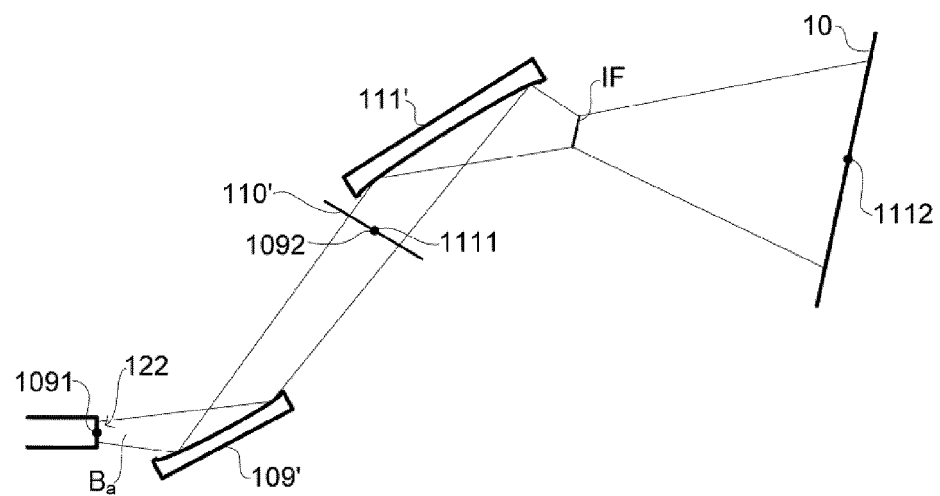

FIG. 12D is a schematic illustration of an embodiment of the focusing scheme of FIG. 12C in which the second 109' and third 111' focusing optics are implemented as grazing-incidence mirrors each having a substantially ellipsoidal reflective surface. A branch radiation beam $B_a$ is output from a second opening 122 of a radiation alteration device and is incident on the second reflective focusing optic 109'. The second reflective focusing optic 109' has a first focal point 1091 and a second focal point 1092. The first focal point 1091 lies substantially in a plane which is defined by the second opening 122 of the radiation alteration device. The second focal point 1092 lies in an image plane 110' in which an image of the second opening 122 is formed.

The third reflective focusing optic 111' has a first focal point 1111 and a second focal point 1112. The first focal point 1111 of the third focusing optic 111' is substantially coincident with the second focal point 1092 of the second focusing optic 109'. The second focal point 1112 of the third focusing optic 111' lies substantially in a plane which is defined by the field facet mirror 10. The third focusing optic 111' therefore forms an image of the image plane 110' at the field facet mirror 10. The third focusing optic 111' also serves to direct the branch radiation beam $B_a$ through the intermediate focus IF, which in the embodiment of FIG. 12D comprises a region through which all rays of the branch radiation beam $B_a$ are directed. The intermediate focus IF may, for example, coincide with an opening 8 in an enclosing structure of a lithographic apparatus LA.

The reflective focusing optics 109', 111' of the embodiment of FIG. 12D each comprise a reflective surface having a substantially ellipsoidal shape. Ellipsoidal reflective surfaces are configured to image radiation from a first focal point to a second focal point. For example, the second focusing optic 109' images radiation from its first focal point 1091 to its second focal point 1092. However in the embodiment of FIG. 12D the ellipsoidal reflective surfaces are arranged to image a plane, as opposed to a point. For example, the second focusing optic 109' is arranged to form an image of a plane defined by the second opening 122 in an image plane 110'. As a result of forming an image of a plane with an ellipsoidal reflective surface the image which is formed in the image plane 110' will be blurred, for example, due to comatic aberration and/or other higher order aberrations. Similarly the image which is formed at the field facet mirror 10 will be blurred.

Forming a blurred image at the field facet mirror may, in some embodiments, be acceptable and may not cause any substantial disadvantageous effects. However in other embodiments aberrations (e.g. comatic aberrations) may cause disadvantageous effects. For example, aberrations may cause some radiation to not pass through the intermediate focus IF which may result in radiation being lost from the branch radiation beam $B_a$ at the intermediate focus IF. Additionally or alternatively aberrations may cause the cross-sectional shape of the branch radiation beam $B_a$ at the field facet mirror 10 to be different to the cross-sectional shape of the field facet mirror 10. A mismatch between the cross-sectional shapes of the branch radiation beam $B_a$ and the field facet mirror 10 may result in radiation being lost from the branch radiation beam $B_a$ at the field facet mirror 10.

Aberrations which are present in an image formed at the field facet mirror 10 may be reduced by using reflective elements which are configured generally in the form of a Wolter telescope. A Wolter telescope is an arrangement of grazing incidence mirrors which are configured to form an image of a source plane at an image plane. The source plane which is imaged by a Wolter telescope may be located at a large distance from the Wolter telescope (which may be considered to be an infinite distance) and the image plane onto which the source plane is imaged may be located relatively close to the Wolter telescope. Alternatively the source plane which is imaged by a Wolter telescope may be located relatively close to the Wolter telescope and the image onto which the source plane is imaged may be located at a large distance from the Wolter telescope (which may be considered to be an infinite distance).

Typically the term "Wolter telescope" may be used to refer to an arrangement comprising a reflective element having an ellipsoidal shape and a reflective element having a parabolic shape. The reflective elements may be configured to image a nearby plane onto a plane at infinity or a plane at infinity onto a nearby plane. The Wolter telescopes described herein may differ from conventional Wolter telescopes in that they are configured to image a large conjugate plane (not at infinity) onto a nearby plane or vice versa. The Wolter telescopes described herein may, for example, comprise a first reflective element having an ellipsoidal shape and a second reflective element having an ellipsoidal shape which is close to being parabolic.

Figure 12E:
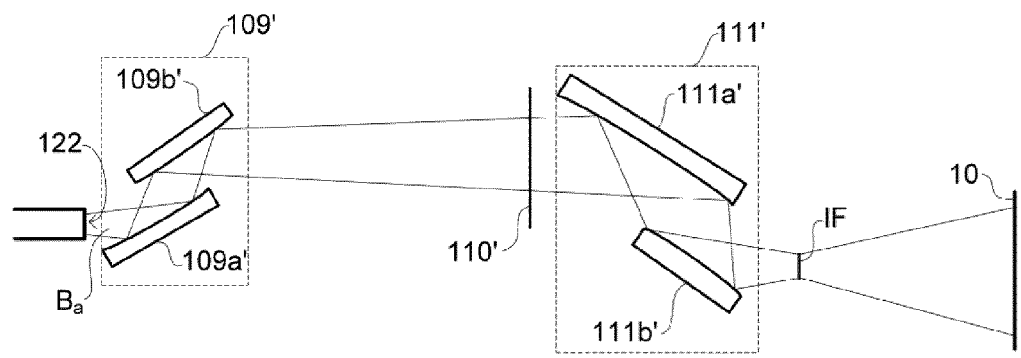

FIG. 12E is a schematic illustration of an embodiment in which an image of the second opening 122 of a radiation alteration device is imaged onto a field facet mirror 10 using optics arranged in the form of a Wolter telescope. In the embodiment which is shown in FIG. 12E the second 109' and third 111' focusing optics each comprise a Wolter telescope comprising two reflective elements. The Wolter telescope which forms the second focusing optic 109' comprises a first reflective element 109a' and a second reflective element 109b'. The Wolter telescope which forms the third focusing optic 111' comprises a third reflective element 111a' and a fourth reflective element 111b'.

The first 109a' and second 109b' reflective elements together form a Wolter telescope which is configured to image a plane which is located relatively close to the Wolter telescope onto a plane which is located at an infinite distance from the Wolter telescope. The image plane 110' is not at an infinite distance from the Wolter telescope which forms the second focusing optic 109'. Consequently the second opening 122 will not be perfectly imaged onto the image plane 110'. However, the ratio of the distance between the second opening 122 and the second focusing optic 109' and the distance between the second focusing optic 109' and the image plane 110' may be sufficiently small that an image of the second opening 122 is formed at the image plane 110' with relatively few aberrations. For example, using a Wolter telescope to form an image of the second opening 122 at the image plane 110' (as shown in FIG. 12E) may reduce any aberrations (e.g. comatic aberrations) present in the image, when compared to using ellipsoidal mirrors to form the image (as shown in FIG. 12D).

Similarly to the Wolter telescope which is formed from the first 109a' and second 109b' reflective elements, the third 111a' and fourth 111b' reflective elements together form a Wolter telescope which is configured to image a plane which is located relatively close to the Wolter telescope onto a plane which is located at an infinite distance from the Wolter telescope. The ratio of the distance between the image plane 110' and the third focusing optic 111' and the distance between the image plane 111a' and the field facet mirror 10 may be sufficiently small that an image of the image plane 110' is formed at the field facet mirror 10 with relatively few aberrations. For example, aberrations which are present in the image which is formed at the field facet mirror may be reduced when using a Wolter telescope to form the image (as is shown in FIG. 12E), when compared to using ellipsoidal mirror to form the image (as shown in FIG. 12D).

As was described above in connection with the embodiment shown in FIG. 12E optical elements arranged in the form of one or more Wolter telescopes may advantageously reduce aberrations in an image of the second opening 122 which is formed at the field facet mirror 10. In the embodiment which is shown in FIG. 12E the Wolter telescopes which form the second 109' and third 111' focusing optics are both of the form of a type-III Wolter telescope. In other embodiments a (rotationally symmetric) type-I and/or a type-II Wolter telescope may be used to form an image of the second opening 122 at the field facet mirror 10.

Embodiments of a radiation alteration device have been described above in the context of a radiation alteration device which is arranged to receive a branch radiation beam $B_a$ prior to the branch radiation beam $B_a$ being provided to a lithographic apparatus $LA_a$. However embodiments of a radiation alteration device may additionally or alternatively be advantageously used for other purposes and at different positions in a lithographic system than has been described above. For example, as was described above with reference to FIG. 1 a lithographic system LS may include a beam delivery system BDS comprising beam splitting optics configured to split a main radiation beam B into a plurality of branch radiation beams $B_a$-$B_n$. As will be described in further detail below a radiation alteration device may additionally or alternatively be advantageously used to modify a main radiation beam B prior to the main radiation beam B being provided to beam splitting optics.

Figure 13:
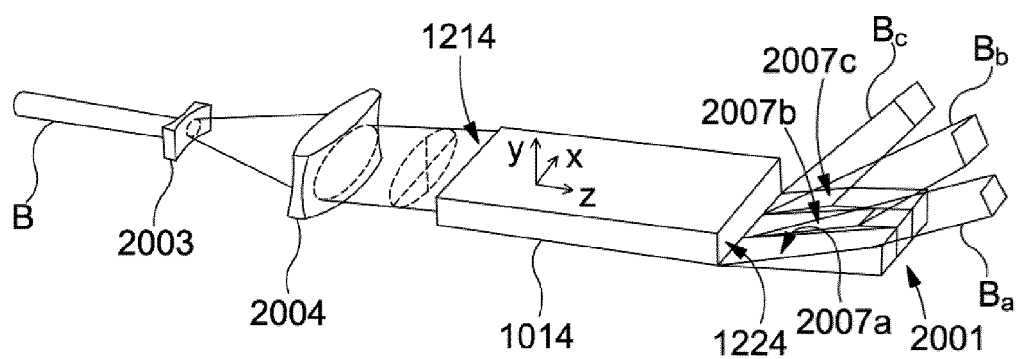
FIG. 13 is a schematic illustration of a radiation alteration device provided upstream of a beam splitting apparatus.

FIG. 13 is a schematic illustration of a beam splitting apparatus 2001 arranged downstream of an embodiment of a radiation alteration device 1014. The radiation alteration device 1014 is arranged to receive a main radiation beam B. The main radiation beam B may, for example, be output from a radiation source SO comprising at least one free electron laser FEL. The main radiation beam B is incident on a fourth focusing optic 2003 and a fifth focusing optic 2004 prior to being provided to the radiation alteration device 1014. For ease of illustration the fourth focusing optic 2003 and the fifth focusing optic 2004 are depicted in FIG. 13 as transmissive optics however in practice the fourth focusing optic 2003 and the fifth focusing optic 2004 may be implemented as reflective optics as will be well understood by a person skilled in the art.

The fourth focusing optic 2003 and the fifth focusing optic 2004 are together configured to expand the main radiation beam B. The fourth focusing optic 2003 is configured to introduce divergence into the main radiation beam B so as to expand the cross-section of the main radiation beam B. For example, the fourth focusing optic 2003 may be configured to expand the cross-section of the main radiation beam B such that the cross-section of the main radiation beam B is approximately similar to the cross-section of a first opening 1214 of the radiation alteration device 1014. In the example which is shown in FIG. 13, the radiation alteration device 1014 has a rectangular cross-section having a greater extent in the x-direction than in the y-direction. The fourth focusing optic 2003 may therefore be configured to introduce a larger divergence in the y-direction than in the x-direction so as to expand the main radiation beam B to approximately match the rectangular cross-section of the radiation alteration device 1014.

In the example which is shown in FIG. 13, the fifth focusing optic 2004 is configured to decrease the divergence of the main radiation beam B prior to the main radiation beam B entering the radiation alteration device 1014 through the first opening 1214. The fifth focusing optic 2004 may, for example, be configured to decrease the divergence of the main radiation beam B so as to reduce the grazing angle with which radiation is incident on an internal surface of the radiation alteration device. As was described above with reference to other embodiments of a radiation alteration device, the amount of radiation which is lost from a radiation beam through absorption at an internal surface of a radiation alteration device increases with increases in the grazing angle with which radiation is incident on the internal surface. The fifth focusing optic 2004 may therefore decrease the divergence of the main radiation beam B so as to reduce the amount of radiation which is lost from the main radiation beam B due to absorption at the internal surface of the radiation alteration device 1014.

The fourth focusing optic 2003 and the fifth focusing optic 2004 are presented merely as examples of focusing optics which may be used to adapt the main radiation beam B prior to the main radiation beam entering a radiation alteration device 1014. In other embodiments more or less focusing optics than are shown in FIG. 13 may be used. In some embodiments the focusing optics may be configured differently than the configuration shown in FIG. 13. In general any one or more focusing optics may be used in order to adapt to the main radiation beam B such that the main radiation beam B has one or more desired properties upon entry to the radiation alteration device 1014. For example, one or more focusing optics may be configured to expand the cross-section of the main radiation beam such that the cross-sectional size of the main radiation beam B is approximately close to the cross-sectional size of the first opening 1214 of the radiation alteration device 1014 and may be configured to cause the main radiation beam B to be diverging upon entry to the radiation alteration device such that the main radiation beam B undergoes reflection at an internal surface of the radiation alteration device 1014.

As was described above with reference to other embodiments of a radiation alteration device arranged to receive a branch radiation beam $B_a$, radiation which enters the first opening 1214 of the radiation alteration device 1014 undergoes multiple reflections at a reflective internal surface of the radiation alteration device. The radiation alteration device 1014 is configured to output a modified main radiation beam B at a second opening 1224 of the radiation alteration device 1014.

As will be appreciated from the discussion of other embodiments of radiation alteration devices which was provided above, the radiation alteration device 1014 causes rays which form the main radiation beam B to be spatially scrambled. The spatial scrambling of the rays which form the main radiation beam B may increase the homogeneity of the intensity profile of the main radiation beam B, such that the modified main radiation beam B which is output from the second opening 1224 of the radiation alteration device 1014 has a more homogenous intensity profile than the intensity profile of the main radiation beam which enters the radiation alteration device 1014 through the first opening 1214. Furthermore the modified radiation beam B which is output from the second opening 1224 of the radiation alteration device has a cross-sectional shape which corresponds to the cross-sectional shape of the second opening 1224 of the radiation alteration device 1014.

The modified main radiation beam B which is output from the radiation alteration device is incident on a beam splitting apparatus 2001. The beam splitting apparatus 2001 comprises a first reflective facet 2007a, a second reflective facet 2007b and a third reflective facet 2007c. The reflective facets 2007a-2007c are each arranged to receive different portions of the cross-section of the modified radiation beam B which is output from the second opening 1224 of the radiation alteration device 1014 and reflect the different portions in different directions. As is shown in FIG. 13, the reflection of different portions of the modified radiation beam B in different directions causes the formation of separate branch radiation beams $B_a$, $B_b$ and $B_c$. The branch radiation beams $B_a$, $B_b$, $B_c$ may each be directed to different lithographic apparatus. It may be desirable to split the main radiation beam B into branch radiation beams $B_a$-$B_c$ which have approximately equal cross-sections and powers such that the lithographic apparatus are provided with branch radiation beams having substantially similar properties.

As was explained above, the cross-sectional shape of the modified main radiation beam B which is output from the radiation alteration device 1014 is equivalent to the cross-sectional shape of the second opening 1224 of the radiation alteration device 1014. In the embodiment which is shown in FIG. 13 the radiation alteration device 1014 is provided with a main radiation beam B having an approximately elliptical cross-section (after having been expanded by the focusing optics 2003, 2004). The radiation alteration device 1014 has a rectangular cross-section such that the modified main radiation beam B which is output from the rectangular second opening 1224 of the radiation alteration device 1014 also has a rectangular cross-section. The radiation alteration device 1014 therefore serves to convert the cross-sectional shape of the main radiation beam B from being substantially elliptical to being substantially rectangular. It will be appreciated that the task of splitting a main radiation beam B having a rectangular cross-section into substantially similar branch radiation beams $B_a$-$B_c$ is significantly easier than splitting a main radiation beam B having an elliptical cross-section into substantially similar branch radiation beams $B_a$-$B_c$. For example, the modified rectangular main radiation beam B which is output from the radiation alteration device 1014 may simply be split into a plurality of substantially equal branch radiation beams $B_a$-$B_c$ by providing substantially rectangular shaped reflective facets 2007a-2007c in the path of the modified main radiation beam B.

Modification of the main radiation beam B with a radiation alteration device prior to splitting the main radiation beam B into branch radiation beams $B_a$-$B_c$ may also advantageously allow the main radiation beam B to be split into branch radiation beams each having substantially the same power. As was described above the radiation alteration device 1014 serves to increase the homogeneity of the main radiation beam B such that the spatial intensity profile of the modified radiation beam which is output from the radiation alteration device 1014 may be substantially homogenous. If the spatial intensity profile of the modified radiation beam which is output from the radiation alteration device 1014 is homogenous then branch radiation beams $B_a$-$B_c$ having approximately equal powers may be provided simply be splitting the main radiation beam B into branch radiation beams $B_a$-$B_c$ having approximately equal cross-sections.

Providing a radiation alteration device 1014 before a beam splitting apparatus 2001 is further advantageous because the radiation alteration device 1014 decreases the sensitivity of the spatial intensity profile of the main radiation beam B to changes in the main beam pointing direction (as was described above with reference to the embodiment depicted in FIG. 4). The sensitivity of the power of each of the branch radiation beams $B_a$-$B_c$ to changes in the pointing direction of the main radiation beam B is therefore advantageously decreased by providing a radiation alteration device 1014 upstream of the beam splitting apparatus 2001.

An alternative beam splitting apparatus which may be used in some lithographic systems comprises a diffraction grating configured to split a main radiation beam B into a plurality of diffraction orders which form branch radiation beams. The power and position of each of the branch radiation beams which are formed by a beam splitting apparatus comprising a diffraction grating may be highly sensitive to changes in the pointing direction of the main radiation beam B and to changes in the wavelength of the main radiation beam B. A radiation beam which is emitted from a free electron laser FEL may experience variations in both pointing direction and wavelength and thus branch radiation beams which are formed by a beam splitting apparatus comprising a diffraction grating may undergo significant variations in both power and position. By comparison, a branch radiation beams formed by a beam splitting apparatus which comprises a plurality of reflective facets which receives radiation output from a radiation alteration device as described herein is advantageously relatively insensitive to variations in both the wavelength and pointing direction of a main radiation beam B.

Whilst a specific example, of a beam splitting apparatus 2001 is shown in FIG. 13 comprising three reflective facets 2007a-2007c which split a main radiation beam B into three branch radiation beams $B_a$-$B_c$ other arrangements of a beam splitting apparatus 2001 may instead be used which may comprise more or less than three reflective facets 2007a-2007c. For example alternative arrangements of a beam splitting apparatus which may be arranged to receive a modified main radiation beam B output from a radiation alteration device 1014 are shown in FIGS. 14A and 14B.

Figure 14A:
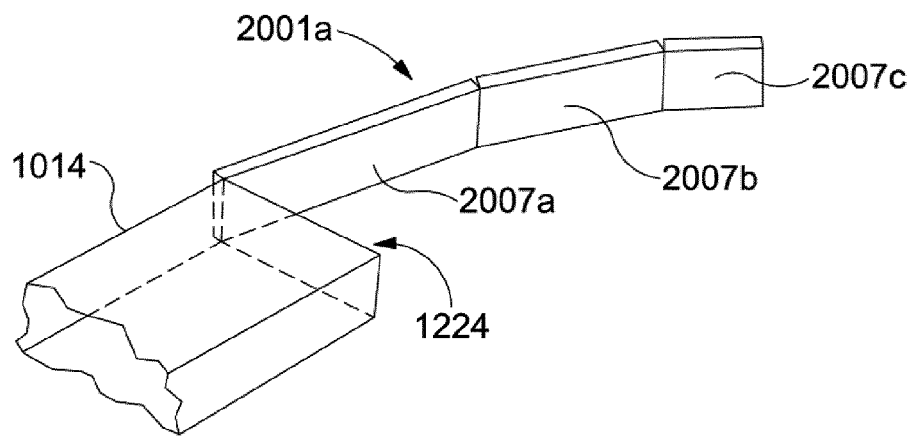
FIGS. 14A and 14B are schematic illustrations of embodiments of a beam splitting apparatus which may be used in combination with a radiation alteration device.

FIG. 14A is a schematic illustration of an embodiment of a beam splitting apparatus 2001a comprising three reflective facets 2007a, 2007b and 2007c. The reflective facets 2007a, 2007b and 2007c are each arranged to receive different portions of a modified main radiation beam B which is output from the second opening 1224 of the radiation alteration device 1014 and reflect the different portions in different directions so as to split the main radiation beam B into separate branch radiation beams.

Figure 14B:
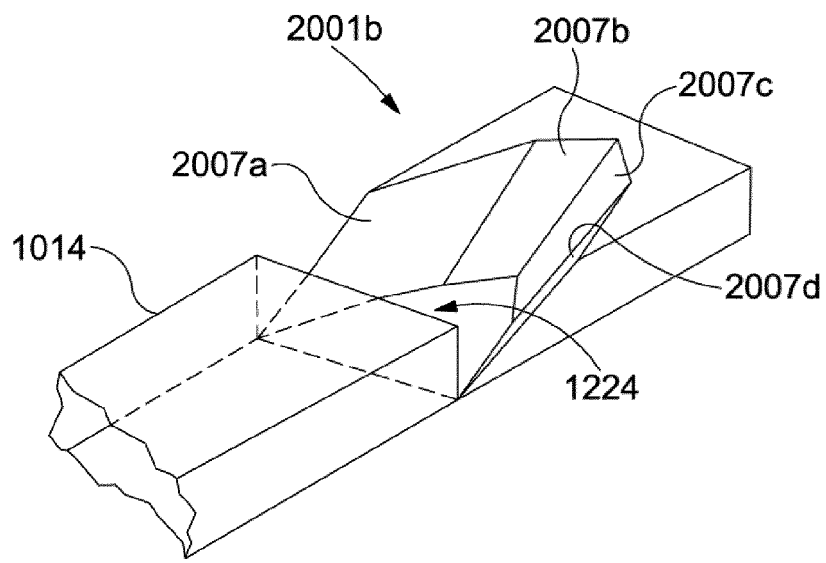

FIG. 14B is a schematic illustration of an embodiment of a beam splitting apparatus 2001b comprising four reflective facets 2007a, 2007b, 2007c and 2007d. The reflective facets 2007a, 2007b, 2007c and 2007d are each arranged to receive different portions of a modified main radiation beam B which is output from the second opening 1224 of the radiation alteration device 1014 and reflect the different portions in different directions so as to split the main radiation beam B into separate branch radiation beams.

Whilst a specific embodiment of a radiation alteration device 1014 has been described with reference to modifying a main radiation beam B prior to providing the modified main radiation beam to a beam splitting apparatus 2001, other embodiments of a radiation alteration device may instead be used to modify a main radiation beam B. For example, a radiation alteration device which includes a bend may be used to modify a main radiation beam B prior to providing the modified main radiation beam to a beam splitting apparatus 2001. Additionally or alternatively a radiation alteration device having a cross-sectional shape which is different to the cross-sectional shape of the radiation alteration device 1014 shown in FIG. 13 may be used. For example, a radiation alteration device having a square cross-section may be used. In general the cross-sectional shape of a radiation alteration device may be configured to as to provide a modified main radiation beam B having a desired cross-section. The desired cross-section of a modified main radiation beam B which is output from a radiation alteration device may depend on the arrangement of reflective facets which form a beam splitting apparatus 2001 arranged to receive the modified main radiation beam B.

In some embodiments it may be desirable to provide a beam splitting apparatus which is configured to split the modified main radiation beam B into a relatively large number of branch radiation beams. For example, a beam splitting apparatus may be provided which is configured to split a main radiation beam B into approximately ten branch radiation beams so as to provide ten different lithographic apparatus with a branch radiation beam.

As was described above with reference to other embodiments of a radiation alteration device which are configured to receive a branch radiation beam $B_a$, the degree of scrambling of a radiation beam which is caused by a radiation alteration device depends on the number of reflections which radiation undergoes at an internal surface of the radiation alteration device. The number of reflections which radiation undergoes at an internal surface of the radiation alteration device is approximately proportional to θL/D where θ is the half divergence with which a radiation beam enters a radiation alteration device, L is the length of the radiation alteration device and D is the diameter of a tube which forms the radiation alteration device. In order to achieve a desired degree of spatial scrambling a radiation alteration device which receives a main radiation beam B may have a relatively small diameter.

An embodiment of a radiation alteration device may, for example, have a substantially rectangular cross-section and may have a second opening from which a modified main radiation beam B is output having dimensions of approximately 3 mm in the y-direction and approximately 10 mm in the x-direction (the x and y-directions being perpendicular to a z-direction in which the main radiation beam propagates). The divergence of the main radiation beam B which is input to the radiation alteration device may be such that radiation which is output from the second opening of the radiation alteration device has a half divergence of approximately 3 milliradians in the x-direction and approximately 10 milliradians in the y-direction.

In order to reduce the amount of radiation which is lost from the main radiation beam B due to absorption at a beam splitting apparatus it is desirable for the reflective facets of a beam splitting apparatus to be arranged such that radiation is incident on the reflective facets and is reflected from the reflective facets at relatively small grazing angles. For example, the reflective facets of a beam splitting apparatus may be arranged such that radiation is incident on the reflective facets with a grazing angle of approximately 1 degree. Since the grazing angles at which the branch radiation beams are reflected are relatively small, the angular separation between the branch radiation beams will also be relatively small. Branch radiation beams which have a relatively small angular separation between them and which are diverging beams may overlap with each other as they diverge away from a beam splitting apparatus and cannot therefore be treated as separate branch radiation beams.

In order to prevent branch radiation beams from overlapping with each other as they propagate away from a beam splitting apparatus, the modified main radiation beam B which is output from a radiation alteration device may be imaged onto a beam splitting apparatus with a magnification factor so as to reduce its divergence at the beam splitting apparatus.

Figure 15:
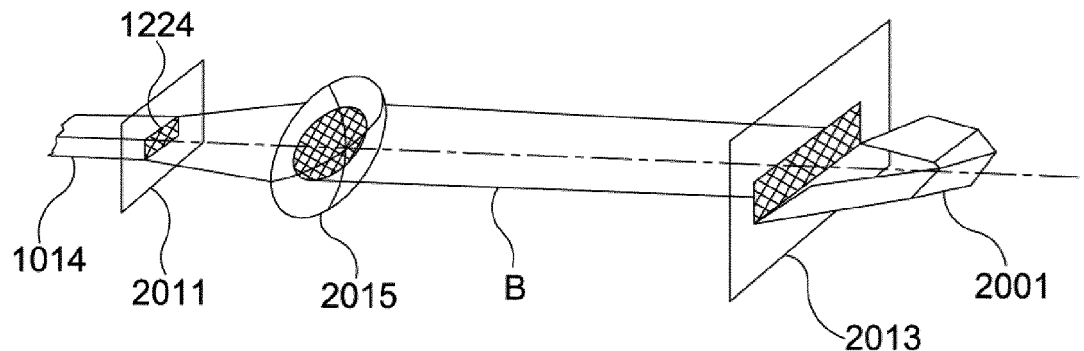
FIG. 15 is a schematic illustration of a radiation alteration device, a beam splitting apparatus and a focusing optic configured to form an image of radiation which is output from the radiation alteration device at the beam splitting apparatus.

FIG. 15 is a schematic illustration of an arrangement in which a modified main radiation beam B which is output from the second opening 1224 of a radiation alteration device 1014 is focused onto a beam splitting apparatus 2001. The modified main radiation beam B which is output from the radiation alteration device 1014 is incident on a focusing optic 2015.

The focusing optic 2015 is configured to form an image of an object plane 2011 (in which the second opening 1224 of the radiation alteration device lies) in an image plane 2013. The image which is formed in the image plane 2013 is a magnified image of the second opening 1224 of the radiation alteration device 1014. That is, the cross-sectional size of the main radiation beam B in the image plane 2013 is greater than the cross-sectional size of the main radiation beam B in the object plane 2011 (i.e. at the second opening 1224 of the radiation alteration device 1014). Magnification of the main radiation beam B from the object plane 2011 to the image plane 2013 means that the divergence of the main radiation beam B in the image plane 2013 is less than the divergence of the main radiation beam B in the object plane 2011 (due to conservation of the etendue of the main radiation beam B between the object plane 2011 and the image plane 2013). The divergence of the main radiation beam is reduced by the magnification factor with which the object plane 2011 is magnified at the image plane 2013. The focusing optic 2015 therefore serves to decrease the divergence of the main radiation beam B in the image plane 2011 when compared to the divergence of the main radiation beam at the second opening of the radiation alteration device 2011.

A beam splitting apparatus 2001 comprising a plurality of reflective facets is situated downstream of the image plane 2013 such that the magnified main radiation beam which passes through the image plane 2013 is incident on the beam splitting apparatus 2001. Since the focusing optic 2015 serves to decrease the divergence of the main radiation beam B, the main radiation beam B which is incident on the beam splitting apparatus 2001 has a smaller divergence than the divergence of the main radiation beam B which is output from the radiation alteration device. The reduced divergence of the main radiation beam B at the beam splitting apparatus means that the branch radiation beams which are formed at the beam splitting apparatus 2001 have a reduced divergence. The smaller divergence of the branch radiation beams may prevent the branch radiation beams from overlapping with each other as they diverge away from the beam splitting apparatus 2001. Magnification of the main radiation beam B from the object plane 2011 to the image plane 2013 may therefore be used to prevent the branch radiation beams produced at the beam splitting apparatus 2001 from overlapping with each other such that each branch radiation beam may be treated as a separate radiation beam and may be provided to a separate lithographic apparatus.

An additional advantage of imaging the radiation which is output from a second opening of a radiation alteration device onto a beam splitting apparatus with a magnification factor, is that the cross-sectional size of the radiation beam at the beam splitting apparatus is greater than the cross-sectional size of the radiation beam at the second opening of the radiation alteration device. Increasing the cross-sectional size of the radiation beam which is incident on the beam splitting apparatus may allow the size of each of the reflective facets of the beam splitting apparatus to be increased. Reflective facets having relatively small dimensions may be difficult to manufacture and thus allowing the size of the reflective facets to be increased advantageously makes the reflective facets easier to manufacture.

For ease of illustration the focusing optic 2015 is depicted in FIG. 15 as a transmissive focusing optic. However in practice the focusing optic 2015 may be implemented as a reflective optical element as will be well understood by a person skilled in the art. In some embodiments the magnification of the main radiation beam B from an object plane to an image plane may be performed using a plurality of optical elements. For example, in some embodiments the main radiation beam B may be magnified from an object plane to an image plane using two mirrors which are arranged similarly to the arrangement of mirrors in a Wolter telescope.

As has been described above branch radiation beams which are formed by a beam splitting apparatus 2001 which receives a main radiation beam B output from a radiation alteration device 1014 have a positive divergence. Each branch radiation beam is directed to a respective lithographic apparatus. In some embodiments the distance between a beam splitting apparatus 2001 and a lithographic apparatus may be relatively large such that each branch radiation beam propagates along a relatively long optical path before being provided to a lithographic apparatus. For example, the optical path of a branch radiation beam between a beam splitting apparatus and a lithographic apparatus may be several tens of meters long.

In order to avoid a large increase in the cross-section of a branch radiation beam $B_a$ between a beam splitting apparatus 2001 and a lithographic apparatus $LA_a$, the divergence of a branch radiation beam $B_a$ may be decreased at a location downstream of the beam splitting apparatus 2001. For example, a branch radiation beam $B_a$ which is output from a beam splitting apparatus 2001 may be directed to be incident on one or more focusing optics which may be configured to decrease the divergence of the branch radiation beam $B_a$. The one or more focusing optics may, for example, focus the branch radiation beam $B_a$ such that the branch radiation beam $B_a$ is close to being a collimated radiation beam. Since the etendue of the main radiation beam B is increased by the radiation alteration device 1014, the branch radiation beam $B_a$ cannot be perfectly collimated by the one or more focusing optics, however the one or more focusing optics may focus the branch radiation beam $B_a$ such that is close to being collimated.

As was described above with reference to, for example, FIG. 4, prior to being provided to a lithographic apparatus $LA_a$ the branch radiation beam $B_a$ may be focused by a focusing optic 107 such that it enters a radiation alteration device 101 with a desired divergence. The radiation alteration device 101 modifies the branch radiation beam $B_a$ and the modified branch radiation beam $B_a$ is focused (e.g. with a second focusing optic 109 and a third focusing optic 111) to an intermediate focus IF before being provided to a lithographic apparatus $LA_a$.

Figure 16:
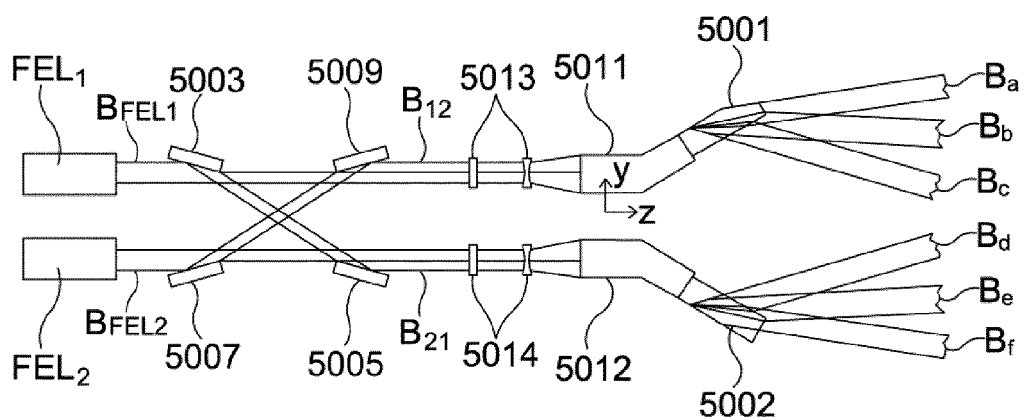
FIG. 16 is a schematic illustration of an arrangement of free electron lasers arranged to form combined radiation beams.

In some embodiments of a lithographic system LS a main radiation beam B which is provided to a beam splitting apparatus may comprise a combination of radiation beams which are emitted from a plurality of free electron lasers FEL. FIG. 16 is a schematic illustration of an arrangement in which radiation which is emitted from a plurality of free electron lasers is combined to form a plurality of main radiation beams. A first free electron laser $FEL_1$ emits a first free electron laser beam $B_{FEL1}$ and a second free electron laser $FEL_2$ emits a second free electron laser beam $B_{FEL2}$. A first mirror 5003 is arranged in a portion of the optical path of the first free electron laser beam $B_{FEL1}$ such that approximately half of the cross-section of the first free electron laser beam $B_{FEL1}$ is directed to be incident on a second mirror

5005. A third mirror 5007 is arranged in a portion of the optical path of the second free electron laser beam $B_{FEL2}$ such that approximately half of the cross-section of the second free electron laser beam $B_{FEL2}$ is directed to be incident on a fourth mirror 5009. The second mirror 5005 is situated adjacent to the portion of the second free electron laser beam $B_{FEL2}$ which is not incident on the third mirror 5007 and is orientated so as to combine the portion of the first free electron laser beam $B_{FEL1}$ which is incident on the first mirror 5003 with the portion of the second free electron laser beam $B_{FEL2}$ which is not incident on the third mirror 5007 to form a first combined radiation beam $B_{21}$. The fourth mirror 5009 is situated adjacent to the portion of the first free electron laser beam $B_{FEL1}$ which is not incident on the first mirror 5003 and is orientated so as to combine the portion of the second free electron laser beam $B_{FEL2}$ which is incident on the third mirror 5007 with the portion of the first free electron laser beam $B_{FEL1}$ which is not incident on the first mirror 5003 to form a second combined radiation beam $B_{12}$. The mirrors 5003, 5005, 5007, 5009 therefore form a beam combination apparatus which is configured to combine EUV radiation emitted from the first free electron laser $FEL_1$ with radiation emitted from the second free electron laser $FEL_2$ to form the combined radiation beams.

The first combined radiation beam $B_{12}$ and the second combined radiation beam $B_{21}$ each comprise a combination of radiation which is emitted from the first free electron laser $FEL_1$ and radiation which is emitted from the second free electron laser $FEL_2$. The first and second combined radiation beams may each be used as main radiation beams which are provided to respective first and second beam splitting apparatus 5001, 5002 which split the combined radiation beams into branch radiation beams. The branch radiation beams may be provided to a plurality of lithographic apparatus.

Forming a main radiation beam from a combination of radiation which is emitted from a plurality of free electron lasers advantageously provides redundancy such that if one of the free electron lasers develops a fault or is taken offline (e.g. for maintenance), each lithographic apparatus continues to receive radiation which is emitted from one or more other free electron lasers. The arrangement of mirrors which is shown in FIG. 16 results in a first combined free electron laser beam $B_{21}$ and a second combined free electron laser beam $B_{12}$ each having a cross-section comprising a first half being formed from radiation emitted from one of the free electron lasers $FEL_1$, $FEL_2$ and a second half being formed from radiation emitted from the other of the free electron lasers $FEL_1$, $FEL_2$. In the event that one of the free electrons $FEL_1$, $FEL_2$ stops emitting radiation the cross-sections of each of the first and second combined free electron laser beams $B_{21}$, $B_{12}$ will therefore be halved. If the first and second combined free electron laser beams $B_{21}$, $B_{12}$ were to be provided directly to a beam splitting apparatus (i.e. without passing through a radiation alteration device), then a halving of the cross-sections of the first and second combined free electron laser beams $B_{21}$, $B_{12}$ may cause some of the reflective facets which form the beam splitting apparatus to receive no radiation. Consequently some of the branch radiation beams may not be formed and some lithographic apparatus may no longer be provided with radiation.

In order to reduce the impact of one of the free electron lasers $FEL_1$, $FEL_2$ ceasing to emit radiation, each of the first and second combined free electron laser beams $B_{21}$, $B_{12}$ are directed into respective first and second radiation alteration devices 5011, 5012. In order to ensure that the first and second combined free electron laser beams $B_{21}$, $B_{12}$ enter their respective radiation alteration devices 5011, 5012 having a positive divergence, focusing optics 5013, 5014 are arranged to receive the first and second combined free electron laser beams $B_{21}$, $B_{12}$ and focus the beams such that they have a positive divergence. For ease of illustration the focusing optics 5013, 5014 are depicted in FIG. 16 as being transmissive focusing optics. However in practice the focusing optics 5013, 5014 may be implemented as reflective optics as will be well understood by a person skilled in the art.

Figure 17:
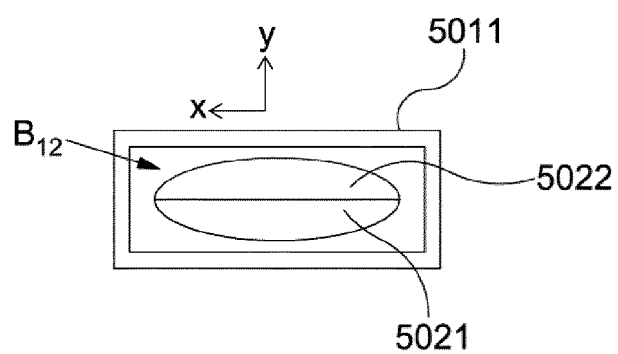
FIG. 17 is a schematic illustration of a cross-section of a combined radiation beam formed by the arrangement of free electron lasers of FIG. 16 at an input to a radiation alteration device.

FIG. 17 is a schematic illustration of a cross-section through the radiation alteration device 5011 at a first opening of the radiation alteration device which receives the second combined free electron laser beam $B_{12}$ from the focusing optics 5013. The second combined free electron laser beam $B_{12}$ comprises a first portion 5021 formed from radiation emitted from the first free electron laser $FEL_1$ and a second portion formed from radiation emitted from the second free electron laser $FEL_2$. As was described above with reference to other embodiments of a radiation alteration device, the radiation alteration device 5011 is configured to spatially scramble the second combined free electron laser beam $B_{21}$ to form a scrambled combined radiation beam. The spatial scrambling which is caused by the radiation alteration device 5011 is such that the spatially scrambled combined radiation beam includes overlap between radiation emitted from the first free electron laser $FEL_1$ and radiation emitted from the second free electron laser $FEL_2$.

The radiation beams which are emitted from the radiation alteration devices 5011, 5012 are provided to beam splitting apparatus 5001, 5002 which split the radiation beams into branch radiation beams $B_a$-$B_f$. Since the radiation beams which are output from each of the radiation alteration devices 5011, 5012 comprises a scrambled combination of radiation emitted from the first free electron laser $FEL_1$ and radiation emitted from the second free electron laser $FEL_2$, in the event that one of the free electron lasers $FEL_1$, $FEL_2$ stops emitting radiation the cross-sections of the radiation beams which are provided to the beam splitting apparatus 5001, 5002 may remain relatively unchanged. Consequently, each of the reflective facets which form the beam splitting apparatus 5001, 5002 continue to receive radiation and thus each of the branch radiation beams $B_a$-$B_h$ continue to be formed by the beam splitting apparatus 5001, 5002. The power of each of the radiation beams which are output from each of the radiation alteration devices 5011, 5012 will be reduced in the event that one of the free electron lasers $FEL_1$, $FEL_2$ stops emitting radiation and thus the power of each of the branch radiation beams $B_a$-$B_h$ will be reduced. Whilst the power of each of the radiation beams which are output from each of the radiation alteration devices 5011, 5012 will be reduced in the event that one of the free electron lasers $FEL_1$, $FEL_2$ stops emitting radiation, the spatial scrambling which is caused by the radiation alteration devices 5011, 5012 may ensure that the spatial distribution of power in the radiation beams output from the radiation alteration devices 5011, 5012 will remain relatively unchanged. That is, a variation in the power of radiation emitted by one or more of the first and second free electron lasers $FEL_1$, $FEL_2$ may cause the total power of the radiation which is output from the radiation alteration devices 5011, 5012 to vary but may not cause a substantial variation in the spatial distribution of power in the radiation beam which exits the radiation alteration devices 5011, 5012. The lithographic apparatus which receive the branch radiation beams $B_a$-$B_h$ from the beam splitting apparatus 5001, 5002 will therefore continue to receive radiation and may therefore continue to operate.

In some embodiments, the mirrors 5003, 5005, 5007 and 5009 which are arranged to form the first and second combined free electron laser beams $B_{21}$, $B_{12}$, may be moved out of the optical paths of the first and second free electron laser beams $B_{FEL1}$, $B_{FEL2}$ during normal operation of the first and second free electron lasers $FEL_1$, $FEL_2$. That is, when both the first and second free electron laser $FEL_1$, $FEL_2$ are emitting radiation, the first free electron laser beam $B_{FEL1}$ may be provided to the first radiation alteration device 5011 and the first beam splitting apparatus 5001, and the second free electron laser beam $B_{FEL2}$ may be provided to the second radiation alteration device 5012 and the second beam splitting apparatus 5002. In the event that one of the free electron lasers $FEL_1$, $FEL_2$ is to be taken offline or stops emitting radiation, then the mirrors 5003, 5005, 5007 and 5009 may be moved into to the optical paths of the first and second free electron laser beams $B_{FEL1}$, $B_{FEL2}$ as is shown in FIG. 16. Moving the mirrors 5003, 5005, 5007 and 5009 into to the optical paths of the first and second free electron laser beams $B_{FEL1}$, $B_{FEL2}$ ensures that each radiation alteration device 5011, 5012 and thus each beam splitting apparatus 5001, 5002 continues to receive radiation.

As has been described above, in some embodiments (e.g. the embodiments shown in FIGS. 13, 14A, 14B, 15 and 16) a radiation alteration device may be positioned upstream of a beam splitting apparatus so as to provide the beam splitting apparatus with a modified main radiation beam B. The beam splitting apparatus may split the modified main radiation beam B into a plurality of branch radiation beams, each branch radiation beam being provided to a separate lithographic apparatus. In some embodiments further radiation alteration devices are arranged and configured to modify each branch radiation beam before the branch radiation beam is provided to the lithographic apparatus (as is shown, for example, in FIG. 4). In such embodiments each branch radiation beam may therefore pass via two radiation alteration devices before being provided to a lithographic apparatus.

In other embodiments a branch radiation beam may only pass via one radiation alteration device before being provided to a lithographic apparatus. For example, in some embodiments the main radiation beam B may not be modified by a radiation alteration device prior to being incident on a beam splitting apparatus and a radiation alteration device may only be provided in the path of each branch radiation beam. Alternatively, a radiation alteration device may be arranged to modify the main radiation beam B before the main radiation beam B is incident on the beam splitting apparatus but no radiation alteration devices may be provided in the path of the branch radiation beams. However, providing a radiation alteration device in the path of a branch radiation beam advantageously allows the cross-sectional shape of the branch radiation beam to be modified prior to the branch radiation beam being provided to a lithographic apparatus. For example, the cross-sectional shape of a branch radiation beam may be modified by a radiation alteration device such that the cross-sectional shape of the branch radiation beam approximately matches the shape of a field facet mirror 10 on which the branch radiation beam is incident.

The ability of a radiation alteration device to modify the cross-sectional shape of a branch radiation beam before the branch radiation beam is provided to a lithographic apparatus may allow new configurations of beam splitting apparatus to be used. For example, without the use of a radiation alteration device, a beam splitting apparatus may be configured so as to provide branch radiation beams having cross-sectional shapes which are suitable for providing to a lithographic apparatus. However in embodiments in which the cross-sectional shapes of the branch radiation beams are modified using radiation alteration devices the beam splitting apparatus may provide branch radiation beams having any cross-sectional shape. The cross-sectional shapes of the branch radiation beams may then be modified by the radiation alteration devices so as to provide each lithographic apparatus with a branch radiation beam having a desired cross-sectional shape.

Figure 18:
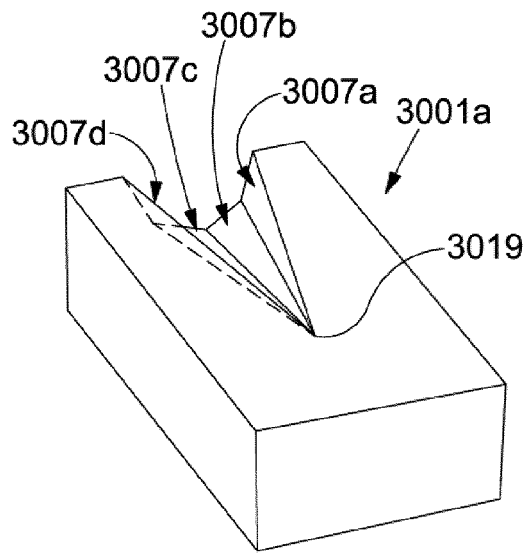
FIG. 18 is a schematic illustration of a first portion of an embodiment of a beam splitting apparatus.

FIG. 18 is schematic illustration of a first portion 3001a of an embodiment of a beam splitting apparatus which is configured to split a main radiation beam B into a plurality of branch radiation beams, where each branch radiation beam is formed from a sector of the cross-section of the main radiation beam B. The first portion 3001a comprises four reflective facets 3007a-3007d arranged in a diamond formation. The reflective facet 3007a-3007d are configured to receive different sectors of the cross-section a main radiation beam B and reflect the different sectors in different directions so as to split the main radiation beam into a plurality of branch radiation beams.

Figure 19:
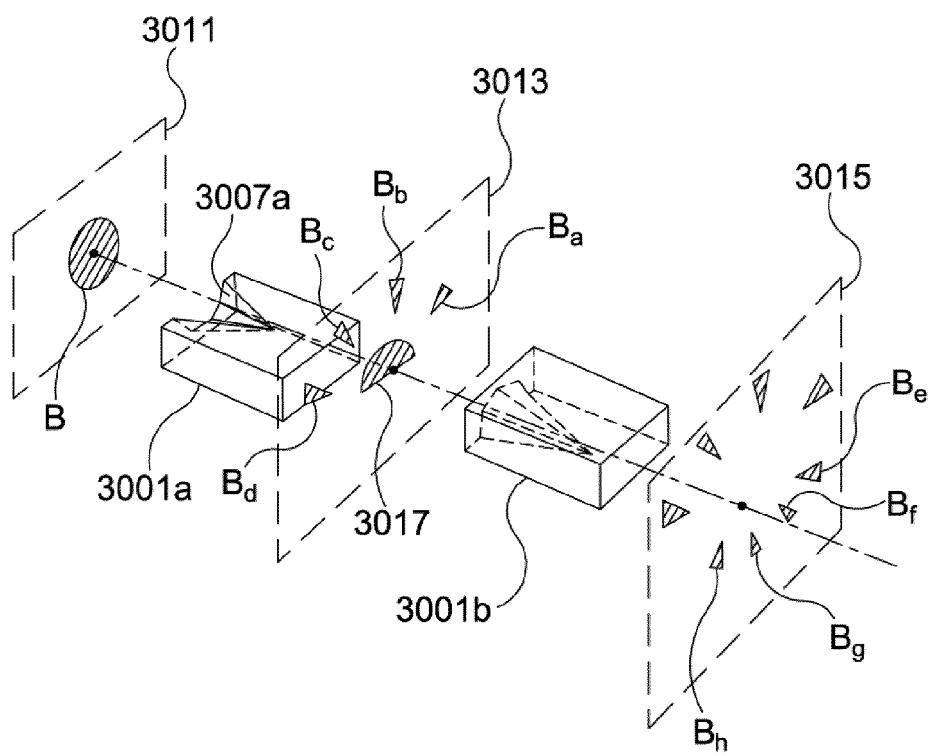
FIG. 19 is a schematic illustration of the first portion of the beam splitting apparatus of FIG. 18 in combination with a second portion of the beam splitting apparatus.

FIG. 19 is a schematic illustration of an arrangement of the first portion 3001a of the beam splitting apparatus and a second portion 3001b of the beam splitting apparatus, both the first and second portions being arranged in the path of a main radiation beam B. The cross section of the main radiation beam B is shown in a first plane 3011 located upstream of the beam splitting apparatus. In the first plane 3011 the main radiation beam B has a substantially circular cross-section. The first portion 3001a of the beam splitting apparatus is arranged such that approximately half of the circular cross-section of the main radiation beam B is incident on the reflective facets 3007a-3007b of the first portion 3001a of the beam splitting apparatus. The first portion of the beam splitting apparatus therefore splits half of the cross-section of the main radiation beam B into four separate branch radiation beams $B_a$-$B_d$. The branch radiation beams $B_a$-$B_d$ are shown in FIG. 19 in a second plane 3013 located downstream of the first portion 3001a of the beam splitting apparatus. Also shown in the second plane 3013 is the remaining half 3017 of the main radiation beam B which is not incident on the first portion 3001a of the beam splitting apparatus.

A second portion 3001b of the beam splitting apparatus is located downstream of the second plane 3013 and downstream of the first portion 3001a of the beam splitting apparatus. Similarly to the first portion 3001a of the beam splitting apparatus, the second portion 3001b comprises four reflective facets arranged in a diamond formation. The reflective facets of the second portion 3001b of the beam splitting apparatus are arranged to receive the remaining half 3017 of the main radiation beam B which was not split into branch radiation beams $B_a$-$B_d$ by the first portion 3001a of the beam splitting apparatus. The reflective facets of the second portion 3001b of the beam splitting apparatus split the main radiation beam B into four branch radiation beams $B_e$-$B_h$. The branch radiation beams $B_a$-$B_d$ which are formed by the first portion 3001a of the beam splitting apparatus and the branch radiation beam $B_a$-$B_h$ which are formed by the second portion 3001b of the beam splitting apparatus are shown in a third plane 3015 located downstream of the second portion 3001b of the beam splitting apparatus. It can be seen from FIG. 19 that the branch radiation beams $B_a$-$B_h$ correspond to different segments of the cross-section of the main radiation beam B.

Figure 20A:
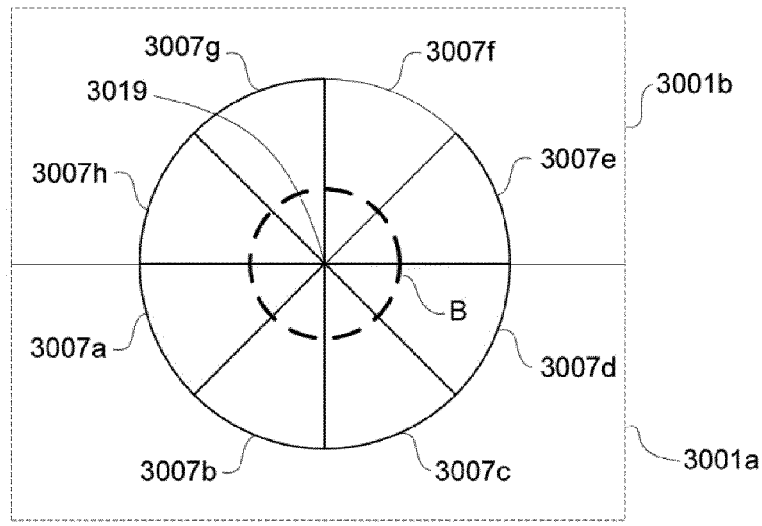
FIGS. 20A and 20B are schematic illustrations of a radiation beam which is incident on the beam splitting apparatus of FIG. 19.

FIG. 20A is a schematic illustration of the reflective facets 3007a-3007h which form the first portion 3001a and the second portion 3001b of the beam splitting apparatus as viewed along the direction of propagation of the main radiation beam B. The position of the main radiation beam B on the reflective facets 3007a-3007h is indicated in FIG. 20A with a dashed circle. In the example which is shown in FIG. 20A the center of the main beam B is aligned with an intersection 3019 of the reflective facets 3007a-3007h. The reflective facets 3007a-3007h therefore split the main beam B into branch radiation beams $B_a$-$B_h$ which correspond to equal sized sectors of the cross-section of the main radiation beam B.

The cross-sectional intensity profile of the main radiation beam B may not be homogenous but may, for example, be rotationally symmetric. For example, the cross-sectional intensity profile of the main radiation beam B may be a two-dimensional Gaussian distribution. If the cross-sectional intensity profile of the main radiation beam B is rotationally symmetric and the center of the main beam B is aligned with the intersection 3019 of the reflective facets 3007a-3007h then each branch radiation beam $B_a$-$B_h$ corresponding to a sector of the cross-section of the main radiation beam B will have approximately the same power.

Figure 20B:
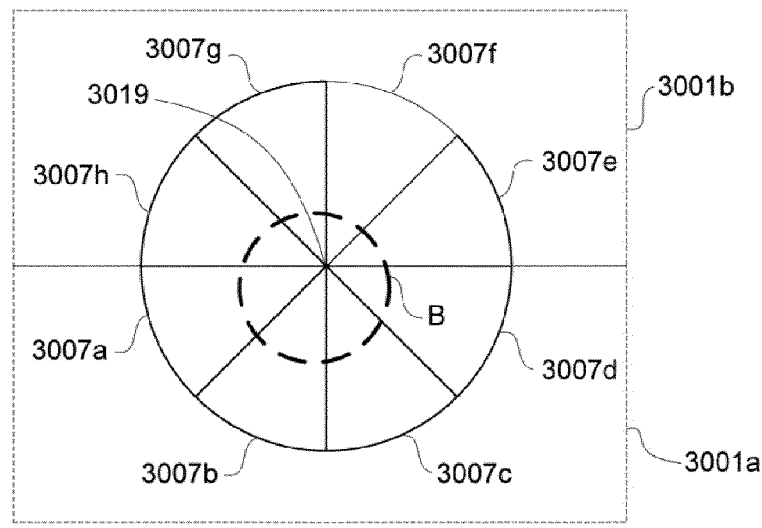

FIG. 20B is a schematic illustration of the reflective facets 3007a-3007h and the main radiation beam B in a case where the center of the main radiation B is not aligned with the intersection 3019 of the reflective facets 3007a-3007h. It can be seen from FIG. 20B that when the center of the main beam B is not aligned with the intersection 3019 of the reflective facets 3007a-3007h, each facet receives a differently sized portion of the main radiation beam B. Consequently the branch radiation beams $B_a$-$B_h$ correspond to differently sized portions of the main radiation beam B and may therefore have different powers. In such an arrangement the powers of the branch radiation beams $B_a$-$B_h$ are therefore sensitive to variations in the pointing direction of the main radiation beam B which will lead to variations in the alignment of the main radiation beam B relative to the reflective facets 3007a-3007h.

In order to reduce the sensitivity of the powers of the branch radiation beams $B_a$-$B_h$ to variations in the pointing direction of the main radiation beam B, branch radiation beams may be formed by combining radiation which is reflected from radially opposite reflective facets. For example, radiation which is reflected from the reflective facet 3007a may be combined with radiation which is reflected from the reflective facet 3007e to form a first branch radiation beam $B_1$, radiation which is reflected from the reflective facet 3007b may be combined with radiation which is reflected from the reflective facet 3007f to form a second branch radiation beam $B_2$, radiation which is reflected from the reflective facet 3007c may be combined with radiation which is reflected from the reflective facet 3007g to form a third branch radiation beam $B_3$ and radiation which is reflected from the reflective facet 3007d may be combined with radiation which is reflected from the reflective facet 3007h to form a fourth branch radiation beam $B_4$. The contribution of radiation which is reflected from each of the reflective facets to their respective branch radiation beams will therefore vary as a function of the pointing direction of the main radiation beam B but the power of each of the first, second, third and fourth branch radiation beams will advantageously be relatively insensitive to the changes in the pointing direction of the main radiation beam B.

Figure 21:
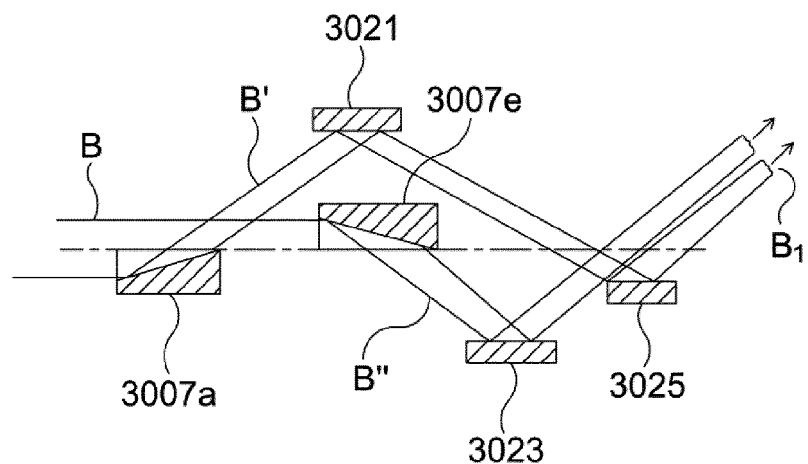
FIG. 21 is a schematic illustration of an arrangement of mirrors which may be used to combine branch radiation beams formed by a beam splitting apparatus.

FIG. 21 is a schematic illustration of an arrangement of mirrors which may be used to combine radiation which is reflected from different reflective facets so as to form a single branch radiation beam $B_1$. In the example, which is shown in FIG. 21 a portion B' of a main radiation beam B is reflected from a first reflective facet 3007a and a second portion B" of the main radiation beam B is reflected from a second reflective facet 3007e. The first reflective facet 3007a and the second reflective facet 3007e may be arranged so as to receive and reflect radially opposite sectors of the cross-section of the main radiation beam B. A first mirror 3021 is arranged to reflect the first portion B' to be incident on a second mirror 3025. A third mirror 3023 is arranged to reflect the second portion B" such that the first portion B' which is reflected from the second mirror 3025 and the second portion B" which is reflected from the third mirror 3023 propagate in substantially the same direction and adjacent to each other to form a first branch radiation beam $B_1$. It will be appreciated that further similar arrangements of mirrors may be used to combine other portions of the main radiation beam B which are reflected from other reflective facets so as to form further branch radiation beams.

In the embodiment of a beam splitting apparatus which is shown in FIGS. 18 and 19 each of the reflective facets of the first portion 3001a of the beam splitting apparatus intersect at a single intersection point 3019. Similarly the reflective facets of the second portion 3001b of the beam splitting apparatus also intersect at a single intersection point. Each reflective facet will therefore have a sharp tip at the intersection point which may be difficult to manufacture.

Figure 22A:
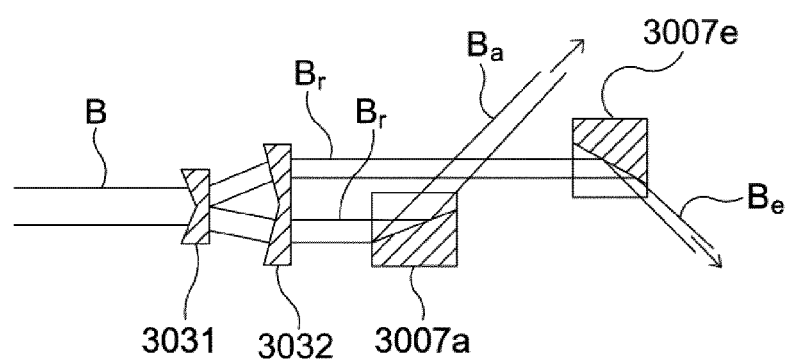
FIGS. 22A and 22B are schematic illustrations of an arrangement of lenses which may be used to form an annular ring of radiation to be provided to a beam splitting apparatus and an annular ring of radiation which is incident on a beam splitting apparatus.

FIG. 22A is a schematic illustration of an alternative arrangement of a beam splitting apparatus which allows the beam splitting apparatus to be formed from reflective facets which do not have sharp tips. The main radiation beam B is incident on a first conical lens 3031 and a second conical lens 3032. The first conical lens 3031 and the second conical lens 3032 are configured to direct the main radiation beam B to form an annular ring of radiation $B_r$. An annular ring of radiation beam $B_r$ may be conveniently split into branch radiation beams by reflective facets which do not comprise sharp tips. For example, reflective facets 3007a and 3007e are shown in FIG. 22A splitting the annular ring of radiation $B_r$ into branch radiation beams $B_a$ and $B_e$ respectively. For ease of illustration the conical lenses 3031, 3032 are depicted in FIG. 22A as being transmissive focusing optics. However in practice the conical lenses 3031, 3032 may be implemented as reflective optics as will be well understood by a person skilled in the art.

Figure 22B:
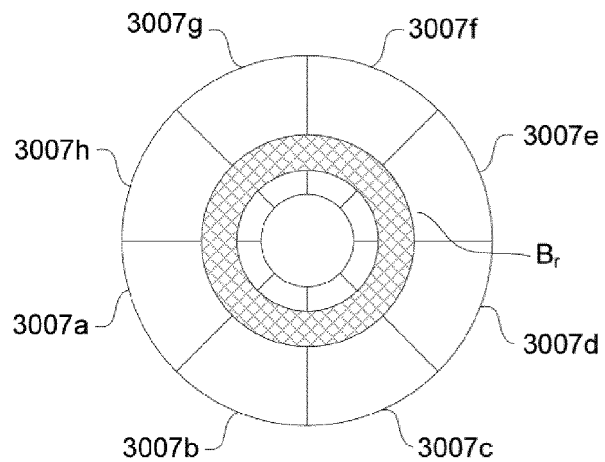

FIG. 22B is a schematic illustration of the reflective facets 3007a-3007h which are arranged to split an annular ring of radiation $B_r$ into a plurality of branch radiation beams, as viewed along the direction of propagation of the annular ring of radiation $B_r$. It can be clearly seen from FIG. 22B that the annular ring of radiation $B_r$ may be split into branch radiation beams with reflective facets 3007a-3007h which do not comprise sharp tips.

Figure 23:
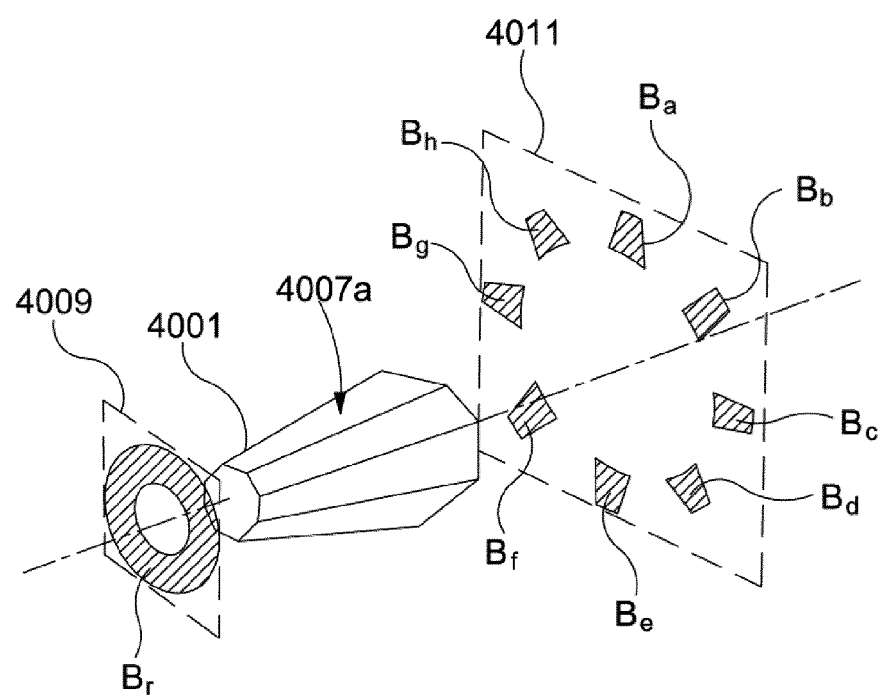
FIG. 23 is a schematic illustration of a beam splitting apparatus which splits an annular ring of radiation into a plurality of branch radiation beams.

The use of conical lenses to expand a main radiation beam B into an annular ring of radiation $B_r$ may enable further alternative arrangements of a beam splitting apparatus to be advantageously used. FIG. 23 is a schematic illustration of an alternative embodiment of a beam splitting apparatus 4001 which is configured to split an annular ring of radiation $B_r$ into a plurality of branch radiation beams $B_a$-$B_h$. The annular ring of radiation $B_r$ which is shown in a first plane located upstream of the beam splitting apparatus 4001 may, for example, be formed from a main radiation beam B by one or more conical lenses (e.g. the first and second conical lenses shown in FIG. 22A). The beam splitting device 4001 has a generally conical shape with an exterior surface which forms a plurality of reflective facets. A single one of the reflective facets is labeled 4007a in FIG. 23. The reflective facets are each configured to reflect a sector of the annular ring of radiation $B_r$ to form a plurality of branch radiation beams $B_a$-$B_h$. The branch radiation beams $B_a$-$B_h$ are shown in a second plane 4011 which is located downstream of the beam splitting apparatus 4001 in FIG. 23.

One or more of the branch radiation beams $B_a$-$B_h$ which are shown in FIG. 23 may be combined with each other to form combined branch radiation beams. For example, an arrangement of mirrors similar to the mirrors which are shown in FIG. 21 may be used to combine radiation which is reflected from radially opposite reflective facets to form branch radiation beams whose power is relatively insensitive to changes in the pointing direction of the main radiation beam B.

Whilst the embodiment of a beam splitting apparatus 4001 which is shown in FIG. 23 has been described in connection with splitting up an annular ring of radiation $B_r$ into branch radiation beams, it will be appreciated that the beam splitting apparatus 4001 of FIG. 23 may be adapted such that it is suitable to split a main radiation beam B into branch radiation beams $B_a$-$B_h$ without first expanding the main radiation beam B into an annular ring of radiation $B_r$. For example, each of the reflective facets which form the beam splitting apparatus which is shown in FIG. 23 may be extended towards the first plane 4009 in FIG. 23 such that the reflective facets intersect at a point. Such a beam splitting apparatus may be suitable for splitting a main radiation beam B into branch radiation beams $B_a$-$B_h$ without first expanding the main radiation beam B into an annular ring of radiation $B_r$.

Several embodiments of a beam splitting apparatus have been described above with reference to FIGS. 18-23 in which a main radiation beam B is split into a plurality of branch radiation beams, each branch radiation beam corresponding to one or more sectors of the cross-section of the main radiation beam B. It will be appreciated that the branch radiation beams which are formed by such beam splitting apparatus have cross-sectional shapes which may not match the cross-sectional shape of a field facet mirror 10 on which the branch radiation beams are directed to be incident. Each branch radiation beam may therefore be modified by one or more radiation alteration devices which may modify the cross-sectional shapes of the branch radiation beams such that the cross-sectional shapes of the branch radiation beams approximately correspond to the cross-sectional shapes of field facet mirrors on which the branch radiation beams are incident.

Several embodiments of a beam splitting apparatus have been described above with reference to FIGS. 18-23 in which a main radiation beam B is split into a plurality of branch radiation beams, each branch radiation beam corresponding to one or more sectors of the cross-section of the main radiation beam B. The term "sector" is intended to mean a portion of the cross-section of the main radiation beam which is bound by two radial lines both extending from a single point. A sector of the cross-section of a radiation beam may, for example, correspond to a sector of a circular cross-section as is shown, for example, in FIG. 20A. Alternatively a sector of the cross-section of a radiation beam may correspond to a sector of an annular ring of radiation as is shown in FIG. 22B.

Whilst the embodiments of the beam splitting apparatus which are depicted in FIGS. 18-23 have been described with reference to a main radiation beam B which has not passed through a radiation alteration device, in some embodiments a radiation alteration device may be located upstream of the beam splitting apparatus shown in FIGS. 18-23 such that the beam splitting apparatus receive a modified main radiation beam B which has passed through a radiation alteration device.

Figure 24:
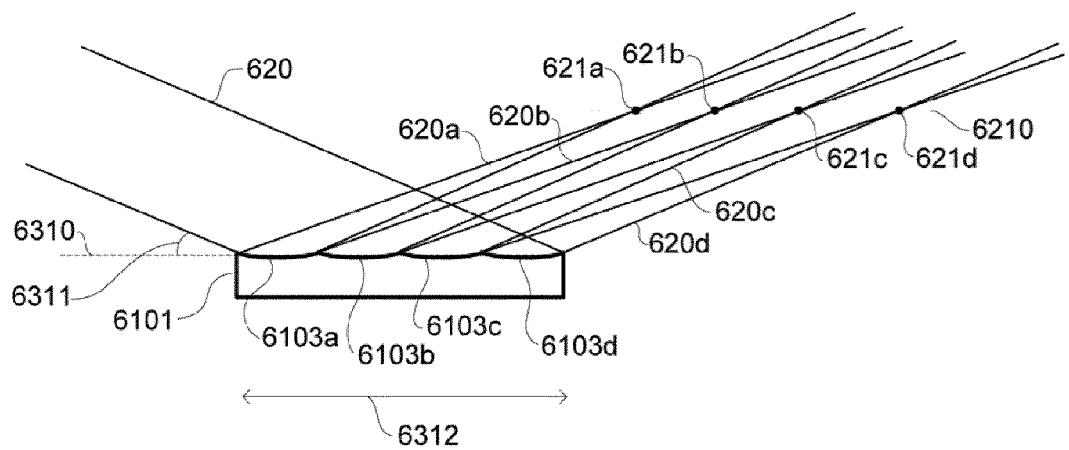
FIG. 24 is a schematic illustration of an embodiment of radiation alteration device comprising a plurality of reflective facets.

Various embodiments of a radiation alteration device have been described above in which the radiation alteration device comprises a tube having a reflective internal surface. In other embodiments, a radiation alteration device may comprise a plurality of reflective facets. FIG. 24 is a schematic illustration of a radiation alteration device 6101 which comprises a plurality of reflective facets 6103a-6103d. The radiation alteration device 6101 receives a radiation beam 620. The radiation beam 620 may, for example, be a branch radiation beam $B_a$ received from a beam splitting apparatus. Alternatively the radiation beam 620 may be a main radiation beam B emitted from a free electron laser FEL.

Each of the reflective facets 6103a-6103d receive a portion of the radiation beam 620 and reflect the received portion so as to form a plurality of sub-beams 620a-620d. For example, a first reflective facet 6103a reflects a portion of the radiation beam 620 to form a first sub-beam 620a. Each of the reflective facets 6103a-6103d comprises a concave reflective surface and are configured to focus the sub-beams to a respective focal point 621a-621d. The focal points 621a-621d each lie in a plane of focal points 6210. In some embodiments the focal points 621a-621d may be substantially uniformly spaced from each other in the plane of focal points 6210. In the embodiment which is shown in FIG. 24, the plane of focal points 6210 is approximately parallel with a plane 6310 in which the reflective facets 6103a-6103d generally lie. As is shown in FIG. 24 the reflective facets 6103a-6103d each comprise a curved reflective surface. The reflective surfaces of the facets 6103a-6103d do not therefore lie exactly in the plane 6310. The plane 6310 merely represents a plane in which the reflective facets 6103a-6103d generally lie.

As was described above with reference to other embodiments, the radiation beam 620 which is incident on a radiation alteration device may have a relatively low etendue. The reflective facets 6103a-6103d of the radiation alteration device 6101 are configured to focus and direct the sub-beams 620a-620d such that the sub-beams 620a-620d overlap in a far field location so as to form a modified radiation beam. When viewed in a far field location, the plurality of focal points 621a-621d act as a planar high-etendue light source. The modified radiation beam therefore has a significantly larger etendue than the radiation beam 620 which is incident on the radiation alteration device 6101. The modified radiation beam may additionally have a spatial intensity profile in a far field which is significantly more homogeneous than the spatial intensity profile of the radiation beam 620 which is incident on the radiation alteration device 6101. The reflective facets 6103a-6103d may, for example, be configured to direct different portions of the spatial intensity profile of the radiation beam 620 which is incident on the radiation alteration device 6101 to different locations in a far-field plane so as to provide a modified radiation beam having a substantially homogenous spatial intensity profile.

Figure 25:
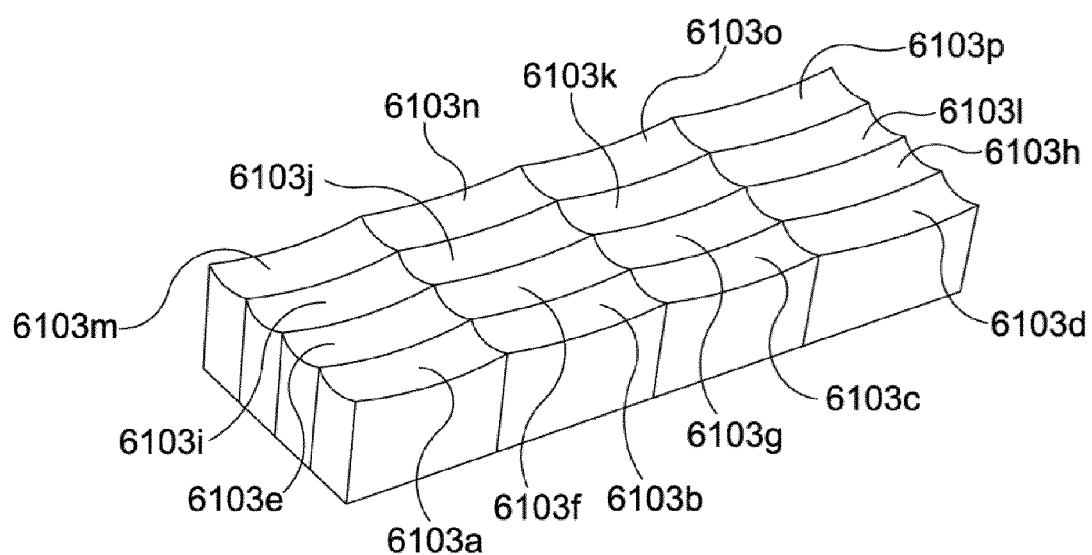
FIG. 25 is a schematic illustration of a perspective view of a radiation alteration device comprising a plurality of reflective facets.

In the embodiment which is shown in FIG. 24 four reflective facets 6103a-6103d are shown. In some embodiments a radiation alteration device 6101 may comprise more than four reflective facets. FIG. 25 is a schematic illustration of a radiation alteration device 6101 which comprises sixteen reflective facets 6103a-6103p. The sixteen reflective facets 6103a-6103p which are shown in FIG. 25 may comprise all of the reflective facets of a radiation alteration device 6103 or may comprise a portion of a radiation alteration device 6103. For example, a radiation alteration device 6103 may comprise more than the sixteen reflective facets 6103a-6103p that are shown in FIG. 25. In an embodiment, a radiation alteration device 6103 may comprise, for example, approximately 44 reflective facets.

The reflective facets 6103a-6103p may be configured to cause the modified radiation beam which is formed by the radiation alteration device 6101 to have one or more desired properties. For example, the reflective facets 6103a-6103p may be configured to cause a desired increase in the etendue of the modified radiation beam when compared to the radiation beam 620 which is incident on the radiation alteration device 6101.

In an embodiment the radiation beam 620 which is incident on the radiation alteration device 6101 may have a beam diameter of approximately 30 mm. The radiation beam 620 may be incident on the radiation alteration device at a grazing angle 6311 (as labeled in FIG. 24) of approximately 8.5°. The radiation alteration device 6101 may comprise 44 reflective facets so as to form 44 sub-beams. Each sub-beam which is incident on the radiation alteration device may be equivalent to a portion of the cross-section of the radiation beam 620. Each portion of the cross-section of the radiation beam 620 which forms a sub-beam at the radiation alteration device 6101 may have a substantially square cross-sectional shape in a plane which lies perpendicular to the direction of propagation of the radiation beam 620. The square-shaped cross-sections of each sub-beam may have dimensions of approximately 4 mm by 4 mm. The sub-beams are focused by the reflective facets to a plurality of focal points. The sub-beams may be focused such that the half divergence of each sub-beam downstream of its focal point is approximately 7 milliradians. The focal lengths of the reflective facets may be approximately 285 mm. A length 6312 (as labeled in FIG. 24) of the radiation alteration device 6101 may be approximately 200 mm. It may be desirable for the focal lengths of the reflective facets to be greater than the length of a focal plane (i.e. the length of the plane of focal points 6210). The length of the focal plane is approximately equal to the length 6312 of the radiation alteration device.

The sub-beams overlap with each other in a far field location so as to form a modified radiation beam. In the above described embodiment, the modified radiation beam has a half divergence of approximately 7 milliradians (corresponding to the half divergence of each sub-beam) and an apparent source size having a diameter of approximately 30 mm (corresponding to the diameter of the radiation beam 620 which is incident on the radiation alteration device). The etendue of the modified radiation beam is of the order of the square of the product of the diameter of the apparent source size and the half divergence of the modified radiation beam. As was described above, the modified radiation beam which is formed by the radiation alteration device 6101 has a significantly higher etendue than the radiation beam 620 which is incident on the radiation alteration device 6101.

The cross-sectional shape of the modified radiation beam which is formed by a radiation alteration device in a far field location, depends at least in part on the cross-sectional shapes of the reflective facets. For example, the reflective facets 6103a-6103p which are shown in FIG. 25 each have approximately rectangular cross-sections. The modified radiation beam which is formed by the reflective facets 6103a-6103p in a far field location may have an approximately square cross-sectional shape. In some embodiments, the modified radiation beam which is formed by the reflective facets 6103a-6103p may have an approximately rectangular cross-sectional shape.

It may be desirable to form a modified radiation beam having a cross-sectional shape which approximately matches the shape of an optical element which receives the modified radiation beam. For example, in some embodiments a modified radiation beam may be provided to a lithographic apparatus and may be incident on a field facet mirror in the lithographic apparatus. In such embodiments, a mismatch between the cross-sectional shapes of the modified radiation beam and a field facet mirror may result in radiation being lost from the modified radiation beam at the field facet mirror. It may therefore be desirable to provide a modified radiation beam having a cross-sectional shape which approximately matches the cross-sectional shape of the field facet mirror.

Figure 26:
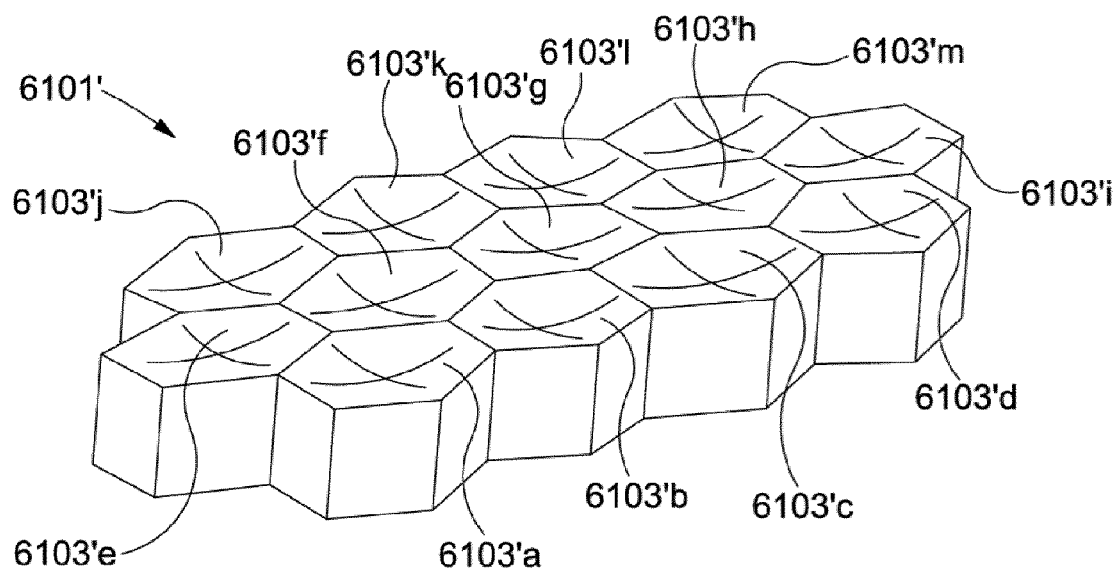
FIG. 26 is a schematic illustration of a perspective view of an alternative embodiment of a radiation alteration device comprising a plurality of reflective facets.

In some embodiments the reflective facets which form a radiation alteration device may have cross-sectional shapes which are configured to form a modified radiation beam having a desired cross-sectional shape. FIG. 26 is a schematic illustration of an embodiment of a radiation alteration device 6101' comprising a plurality of reflective facets 6103'a-6103'm. The reflective facets 6103'a-6103'm each have an approximately hexagonal cross-section and are arranged in the form of a honeycomb lattice. The reflective facets 6103'a-6103'm may be configured to form a modified radiation beam in a far field location which has an approximately hexagonal cross-sectional shape. The honeycomb lattice which is shown in FIG. 26 comprises a plurality of reflective facets 6103'a-6103'm each having a stretched hexagonal shape such that the cross-sectional shape of a portion of the radiation beam which is incident on a single facet 6103'a-6103'm is approximately a regular hexagon.

In some embodiments, a modified radiation beam which is formed by the radiation alteration device 6101' may be incident on a field facet mirror having an approximately circular cross-sectional shape. The hexagonal cross-section of a modified radiation beam which is formed by the radiation alteration device 6101' may be approximately matched to the circular shape of the field facet mirror so as to reduce any loss of radiation from the modified radiation beam at the field facet mirror.

In the embodiment of a radiation alteration device 6101 which is shown in FIG. 24, the reflective facets 61033a6103a-6103d are arranged to focus sub-beams 620a-620d to focal points 621a-621d which lie in a plane of focal points 6210 which is approximately parallel with a plane 6310 in which the reflective facets 6103a-6103d generally lie. In other embodiments the plane of focal points 6210 may not be parallel with a plane 6310 in which the reflective facets 6103a-6103d generally lie.

Figure 27:
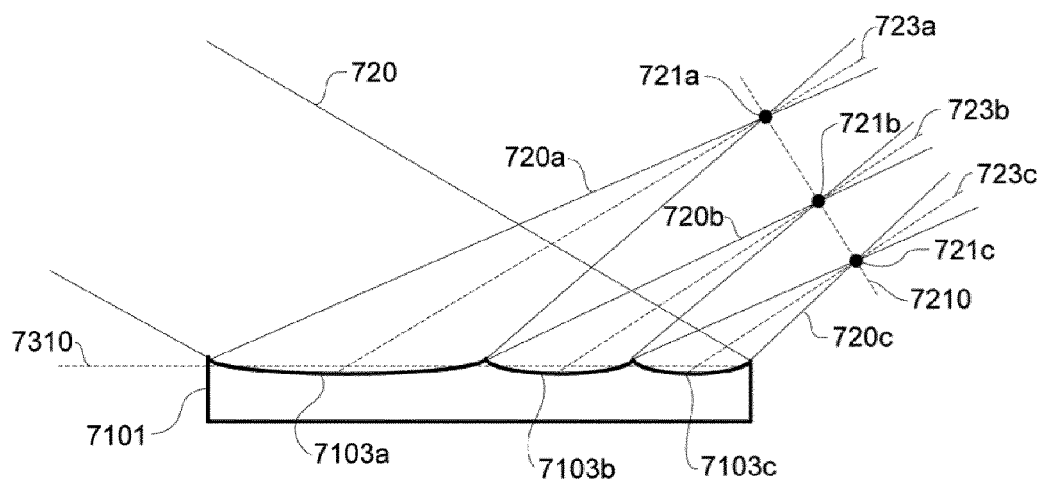
FIG. 27 is a schematic illustration of a further alternative embodiment of a radiation alteration device comprising a plurality of reflective facets.

FIG. 27 is a schematic illustration of an embodiment of a radiation alteration device 7101. The radiation alteration device 7101 comprises reflective facets 7103a-7103c which lie generally in a plane 7310. A radiation beam 720 is incident on the radiation alteration device 7101 and is focused into a plurality of sub-beams 720a-720c by the reflective facets 7103a-7103c. The sub-beams 720a-720c are focused to a plurality of focal points 721a-721c which each lie in a plane of focal points 7210. In the embodiment of FIG. 27 the reflective facets 7103a-7103c are arranged such that the plane of focal points 7210 is not parallel with the plane 7310 in which the reflective elements 7103a-7103c generally lie.

Each of the sub-beams 720a-720c has a central optical axis 723a-723c. In the embodiment of FIG. 27, the reflective facets 7103a-7130c are arranged such the plane of focal points 7210 is substantially perpendicular to the optical axes 723a-723c of the sub-beams 720a-720c.

Figure 28:
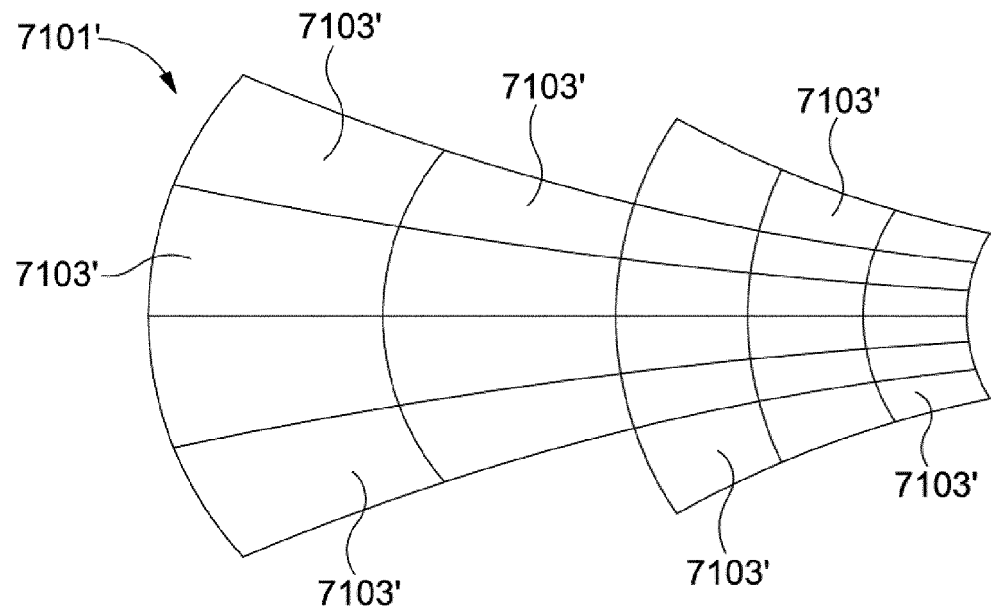
FIG. 28 is a schematic illustration of an embodiment of a radiation alteration device comprising a plurality of reflective facets as viewed from above.

In embodiments in which the plane of focal points 7210 is not parallel with a plane 7310 in which the reflective facets 7103a-7103c generally lie (as is shown, for example, in FIG. 27), the size and/or the shape of the reflective facets may be different for different reflective facets. FIG. 28 is a schematic illustration of an embodiment of a radiation alteration device 7101' as viewed from above. The radiation alteration device 7101' comprises a plurality of reflective facets 7103' which are arranged to focus a plurality of sub-beams to focal points which lie in a plane of focal points, where the plane of focal points is substantially perpendicular to the optical axes of the sub-beams (as is shown, for example, in FIG. 27). As can be seen in FIG. 28 the reflective facets 7103' have different sizes and shapes.

Different reflective facets having different sizes results in the cross-sectional sizes of the different portions of the radiation beam 720 which form the sub-beams 720a-720c being different for each other. Consequently different sub-beams may have different powers. For example, a reflective facet having a relatively large cross-section may receive and focus more radiation into a sub-beam than a reflective facet having a relatively small cross-section. Consequently a sub-beam which is reflected from a reflective facet having a relatively large cross-section may have a higher power than a sub-beam which is reflected from a reflective facet having a relatively small cross-section. A further consequence of differently sized and/or shaped reflective facets may result in the focal points 721a-721c being unevenly spaced apart (as can be seen from FIG. 27).

Figure 29:
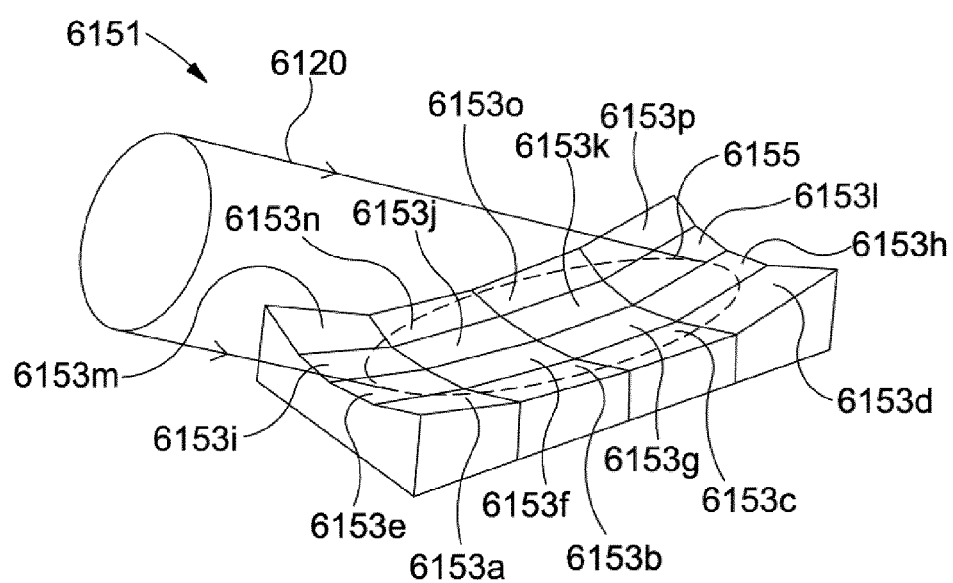
FIG. 29 is a schematic illustration of an alternative embodiment of a radiation alteration device comprising a plurality of reflective facets.

FIG. 29 is a schematic illustration of an alternative embodiment of a radiation alteration device 6151 comprising a plurality of reflective facets 6153a-6153p. The radiation alteration device 6151 is arranged to receive a radiation beam 6120, such that the radiation beam 6120 illuminates at least a portion 6155 of the radiation alteration device 6151. Each reflective facet 6153a-6153p receives and reflects a portion of the radiation beam 6120 so as to form a plurality of sub-beams (not shown in FIG. 29). In the embodiment which is shown in FIG. 29, the reflective facets 6153a-6153p are substantially flat such that they do not have any focusing power. In other embodiments the reflective facets 6153a-6153p may have a concave shape and have a positive focusing power. Alternatively the reflective facets 6153a-6153p may have a convex shape and have a negative focusing power.

The reflective facets 6153a-6153p are configured such that the sub-beams which are formed at the reflective facets 6153a-6153p overlap with each other in a far field plane so as to form a modified radiation beam in the far field plane. The reflective facets may, for example, be configured such that at least some of the sub-beams illuminate substantially the same area in the far field plane. That is, at least some of the sub-beams may completely overlap with each other in the far field plane. In some embodiments not all of the sub-beams formed at each of the reflective facets will completely overlap with each other in a far field plane. In general, the reflective facets are arranged such that if each reflective facet is fully illuminated with radiation then each sub-beam will at least partially overlap with at least one other sub-beam in a far field plane.

In an embodiment, the radiation alteration device 6151 may supply the modified radiation beam to a lithographic apparatus. In such an embodiment the sub-beams which are formed at the reflective facets 6153a-6153p may, for example, overlap with each other in a plane in which a field facet mirror of the lithographic apparatus is situated. In such embodiments one or more focusing optics may be positioned in between the radiation alteration device and the lithographic apparatus. For example focusing optics may be arranged to focus the modified radiation beam to an intermediate focus prior to being provided to a lithographic apparatus.

In an alternative embodiment, the modified radiation beam, formed at the radiation alteration device 6151, may be provided to a beam splitting apparatus (such as, for example, a beam splitting apparatus of the form shown in any of FIG. 13, 14A, 14B, 18, 19, 21, 22A, or 23). In such an embodiment the sub-beams which are formed at the reflective facets 6153a-6153p may overlap with each other in a plane which is close to the beam splitting apparatus.

As was mentioned above, the reflective facets 6153a-6153p are configured such that regions of a far field plane are illuminated with more than one overlapping sub-beam. The intensity of radiation which is incident on a particular location in the far field plane is therefore dependent on the intensity of radiation which is reflected from more than one of the reflective facets 6153a-6153p. Consequently, the dependence of the cross-sectional intensity profile in the far field plane on the cross-sectional intensity profile at the reflective facets 6153a-6153p is reduced. In this way the radiation alteration device 6151 serves to increase the homogeneity of the cross-sectional intensity profile of the modified radiation beam. In some embodiments, if all of the reflective facets 6153a-6153p are completely illuminated then the reflective facets 6153a-6153p may form sub-beams which substantially completely overlap with each other in the far field plane. In such embodiments the intensity profile in the far field plane may be substantially homogenous and may not strongly depend on the intensity profile of the radiation beam 6120 incident on the reflective facets 6153a-6153p.

By forming a modified radiation beam from sub-beams which overlap in a far field plane as was described above, the pointing direction and/or the intensity profile of the modified radiation beam may be relatively insensitive to changes in the pointing direction of the radiation beam 6120 which is incident on the radiation alteration device 6151. As was explained above, in some embodiments the reflective facets 6153a-6165p may be configured such that if all of the reflective facets are completely illuminated then the reflective facets 6153a-6153p form sub-beams which substantially completely overlap with each other in the far field plane. As is shown for example in FIG. 29, in practice the radiation beam 6120 may not completely illuminate all of the reflective facets 6153a-6153p. In such an embodiment, a change in the pointing direction of the radiation beam 6120 may cause more radiation to be incident on some of the reflective facets 6153a-6153p and less radiation to be incident on others of the reflective facets 6153a-6153p. In an embodiment in which the sub-beams formed at the reflective facets overlap in a far field plane, a shift of radiation to different reflective facets may cause little or no change in the pointing direction and/or the intensity profile of the modified radiation beam in the far field plane. The radiation alteration device 6151 therefore advantageously reduces the dependence of the pointing direction and/or the intensity profile of the modified radiation beam in the far field plane, on the pointing direction of the radiation beam 6120 which is incident on the radiation alteration device 6151.

In the embodiment which is shown in FIG. 29 the radiation alteration device 6151 comprises a total of 16 reflective facets 6153a-6153p. In other embodiments a radiation alteration device 6151 of the type shown in FIG. 29 may comprise more or fewer than 16 reflective facets. For example, in some embodiments a radiation alteration device may comprise 8 rows and 8 columns of reflective facets (as opposed to the 4 rows and 4 columns shown in FIG. 29) such that there is provided a total of 64 reflective facets. In other embodiments of a radiation alteration device, a number of rows of reflective facets may be different to a number of columns of reflective facets.

Increasing the number of reflective facets from which a radiation alteration device is formed may advantageously increase the homogeneity of the intensity profile of the modified radiation beam in the far field plane. As was described above, arranging the reflective facets such that they form overlapping sub-beams in the far field plane reduces the dependence of the intensity profile in the far field plane on any differences between the intensity of radiation incident on different reflective facets. However, the intensity profile in the far field plane may still be sensitive to any inhomogeneities in the intensity profile of radiation which is incident on a single reflective facet. For example, if the intensity of radiation which is incident on a single reflective facet includes spatial inhomogeneities then these spatial inhomogeneities may also be present in the intensity profile in the far field plane.

Increasing the number of reflective facets from which a radiation alteration device is formed will usually result in a reduction in the size of each reflective facet. Reducing the size of a reflective facet will reduce the cross-section of a portion of the radiation beam 6120 which is incident on a single reflective facet. Reducing the cross-section of a portion of the radiation beam 6120 which is incident on a single reflective facet will typically lead to a reduction in the size of any spatial inhomogeneities which are present in the intensity profile of radiation which is incident on the single reflective facet. Consequently the size of any spatial inhomogeneities present in the intensity profile in the far field plane may be reduced.

Increasing the number of reflective facets from which a radiation alteration device is formed may additionally or alternatively reduce the dependence of the radiation in the far field plane on the pointing direction of the radiation beam 6120 which is incident on the radiation alteration device 6151.

Increasing the number of reflective facets from which a radiation alteration device is formed may, however, increase the complexity and/or the expense involved with manufacturing a radiation alteration device. The number of reflective facets from which a radiation alteration device is formed and the size of the reflective facets may be selected so as to find a balance between the cost and complexity of manufacture and the performance of the radiation alteration device.

The cross-sectional shapes of the reflective facets 6153a-6153p and the focusing power of the reflective facets may, at least in part, determine the size and shape of the cross-section of the modified radiation beam in the far field plane. The cross-sectional shapes of the reflective facets 6153a-6153p may be selected such that the cross-section of the modified radiation beam in the far field plane approximately matches one or more optical elements which are situated in or close to the far field plane. For example, the cross-section of the modified radiation beam in a far field plane (which may be located after one or more focusing optics) may approximately match the cross-section of a field facet mirror which forms part of a lithographic apparatus. Alternatively the cross-section of the modified radiation beam in the far field plane may approximately match the cross-section of a beam splitting apparatus, on which the modified radiation beam is incident.

In the embodiment which is shown in FIG. 29 the reflective facets 6153a-6153p each have approximately rectangular cross-sectional shapes. As shown in FIG. 29, the radiation beam 6120 may be incident on the radiation alteration device 6151 at a grazing incidence angle such that the reflective facets receive approximately square-shaped cross-sectional portions of the radiation beam 6120. In other embodiments, the reflective facets may have different cross-sectional shapes than the shapes shown in FIG. 29 and/or the reflective facets may be arranged differently to the arrangement shown in FIG. 29.

The radiation alteration device 6151 which is shown in FIG. 29 is different to the radiation alteration devices which are shown in FIGS. 24-28. In particular, the radiation alteration devices which are shown in FIGS. 24-28 each comprise a plurality of reflective facets configured to direct and focus a plurality of sub-beams to a plurality of focal points which lie in a plane of focal points. As was explained above with reference to FIG. 24, when viewed in a far field plane, the plurality of focal points act as a planar high-etendue light source. In the embodiment which is shown in FIG. 29, a plurality of reflective facets are not configured to focus the sub-beams to a plurality of focal points which lie in a plane of focal points but are instead arranged to form sub-beams which overlap with each other in a far field plane. Both forms of radiation alteration device serve to provide a modified radiation beam having an etendue which is greater than the etendue of a radiation beam which is incident on the radiation alteration device. Both forms of radiation alteration device also serve to provide a modified radiation beam whose cross-sectional intensity profile is more homogenous than the cross-sectional intensity profile of a radiation beam which is incident on the radiation alteration device. Both forms of radiation alteration device may provide a modified radiation beam in a far field plane which is suitable for providing to a lithographic apparatus and/or a beam splitting apparatus.

A radiation alteration device of the type shown in FIG. 29 may provide a modified radiation beam which is suitable for providing to a lithographic apparatus and/or a beam splitting apparatus in a far field plane which lies relatively close to the radiation alteration device. A radiation alteration device of the type shown in FIGS. 24-28 may provide a modified radiation beam which is suitable for providing to a lithographic apparatus and/or a beam splitting apparatus in a far field plane which lies relatively far away from the radiation alteration device. Either form of radiation alteration device may be used in conjunction with one or more focusing optics. For example, a modified radiation beam provided by a radiation alteration device may be focused onto a far field plane by one or more focusing optics.

Figure 30:
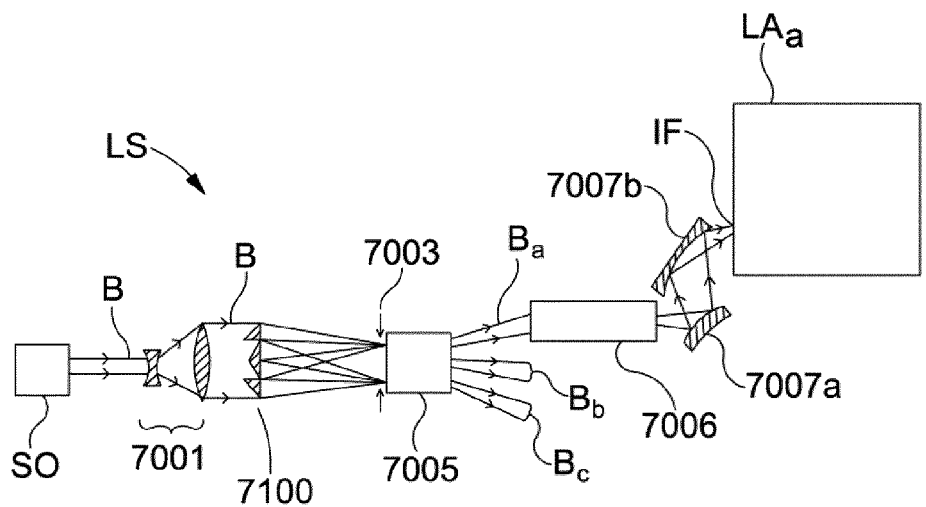
FIG. 30 is a schematic illustration of a lithographic system according to an embodiment of the invention.

FIG. 30 is a schematic illustration of a portion of a lithographic system LS which includes a radiation alteration device of the type shown in FIG. 29. The lithographic system LS includes a radiation source SO which provides a radiation beam B. The radiation source SO may, for example, include one or more free electron lasers FEL. The radiation beam B is initially incident on beam expanding optics 7001. The beam expanding optics 7001 expand the radiation beam B which is subsequently incident on a radiation alteration device 7100. The radiation alteration device 7100 provides a modified radiation beam 7003 which is incident on a beam splitting apparatus 7005. The beam splitting apparatus 7005 splits the modified radiation beam 7003 into a plurality of branch radiation beams $B_a$-$B_c$. In the example which is shown in FIG. 30 the beam splitting apparatus 7005 splits the modified radiation beam 7003 into three branch radiation beams $B_a$-$B_c$. In some embodiments the beam splitting apparatus 7005 may split the modified radiation beam 7003 into more or fewer than three branch radiation beams $B_a$-$B_c$.

A first branch radiation beam $B_a$ is incident on directing optics 7006. The directing optics 7006 provide the first branch radiation beam $B_a$ to a first focusing optic 7007a and a second focusing optic 7007b. The first and second focusing optics 7007a, 7007b together focus the modified radiation beam to an intermediate focus IF. The intermediate focus IF is situated substantially at an opening in an enclosing structure of a lithographic apparatus $LA_a$. The modified radiation beam passes through the opening in the enclosing structure and is incident on optical components (not shown) which form the lithographic apparatus $LA_a$. For example, the modified radiation beam may initially be incident on a field facet mirror (not shown) which forms part of the lithographic apparatus $LA_a$.

Second $B_b$ and third $B_c$ branch radiation beams may also be provided to respective lithographic apparatuses (not shown) via respective directing optics (not shown) and focusing optics (not shown). For ease of illustration, the optical path of the second $B_b$ and third $B_c$ branch radiation beams are omitted from FIG. 30.

For ease of illustration the beam expanding optics 7001 and the radiation alteration device 7100 are shown in FIG. 30 as being formed from transmissive optical components. However, in practice the beam expanding optics 7001 and the radiation alteration device 7100 may be formed from reflective optics.

Figure 31:
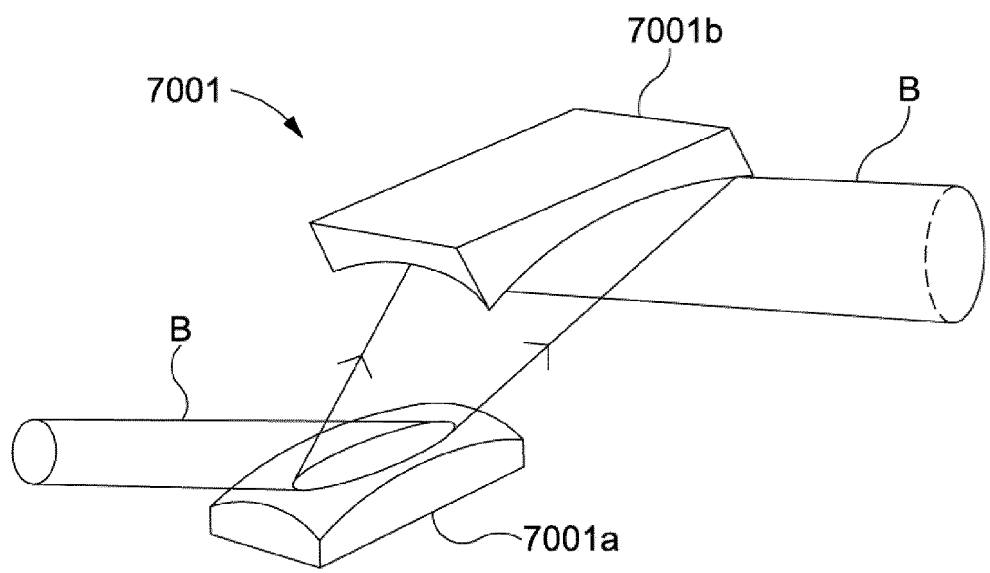
FIG. 31 is a schematic illustration of beam expanding optics of the lithographic system of FIG. 30.

FIG. 31 is a schematic illustration of an example of beam expanding optics 7001.

In the example shown in FIG. 31, the beam expanding optics 7001 comprises a first reflective element 7001a and a second reflective element 7001b. The first reflective element 7001a comprises a convex reflective surface which receives and reflects the radiation beam B. The second reflective surface comprises a concave reflective surface which receives and reflects the radiation beam B. Together, the first and second reflective elements 7001a, 7001b serve to expand the cross-section of the radiation beam B. The cross-section of the radiation beam B may, for example, be expanded such that the radiation beam B illuminates a majority of the radiation alteration device 7100.

In other embodiments the beam expanding optics may comprise any optical component or combination of optical components which serve to expand the cross-section of the radiation beam B. In some embodiments, the beam expanding optics may comprise more than two optical components. For example the beam expanding optics may comprise four or more reflective elements. The reflective elements may, for example, include reflective surfaces whose shape conforms to an extruded parabola.

The radiation alteration device 7100 comprises a plurality of reflective facets which each receive a portion of the expanded radiation beam B. Each reflective facet reflects a received portion of the expanded radiation beam B so as to form a sub-beam. The reflective facets are configured such that the sub-beams overlap with each other in a far field plane. The far field plane lies at or close to the beam splitting apparatus 7005. The radiation alteration device 7100 may, for example, be of the form described above with reference to FIG. 29.

The beam splitting apparatus 7005 may comprise a plurality of reflective facets each arranged to receive a portion of a modified radiation beam which is formed by the radiation alteration device 7100. The reflective facets may be arranged to reflect respective portions of the modified radiation beam in different directions so as to form branch radiation beams $B_a$-$B_c$. The beam splitting apparatus 7005 may be of the form shown in any of FIG. 13, 14A, 14B, 18, 19, 21, 22A, or 23 or may take any other form.

Figure 32:
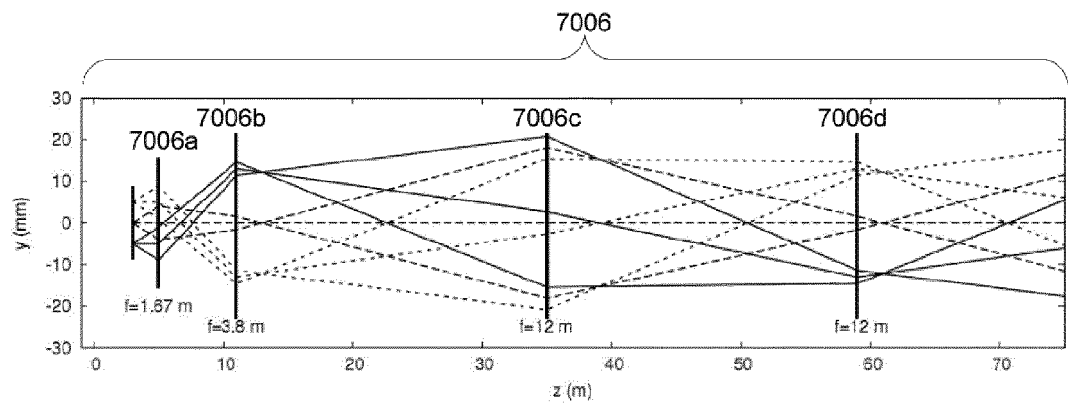
FIG. 32 is a schematic representation of optical elements which form an embodiment of directing optics of the lithographic system of FIG. 30.

The directing optics 7006 receive the first branch radiation beam $B_a$ from the beam splitting apparatus 7005 direct the branch radiation beam $B_a$ to the focusing optics 7007a, 7007b. FIG. 32 is a schematic representation of optical elements which form an embodiment of the directing optics 7006. In the embodiment which is shown in FIG. 32, the directing optics are formed from four optical elements 7006a-7006d. Each optical element forms an image of the branch radiation beam $B_a$. In the representation which is shown in FIG. 32, the optical elements are depicted as transmissive optics. The transmissive optics are shown on a scale which extends in y and z-directions. The dimensions in the y-direction are given in millimeters and the dimensions in the z-direction are given in meters. Each optical element 7006a-7006d has its own focal length f. The focal lengths f of each of the optical elements 7006a-7006d are labelled in FIG. 32.

Whilst the optical elements 7006a-7006d which are shown in FIG. 32 are depicted as transmissive optics in FIG. 32, in practice each optical element 7006a-7006d may be formed from one or more reflective elements. For example, each optical element 7006a-7006d may comprise a plurality of grazing incidence mirrors. In some embodiments one or more of the optical elements may comprise back to back Wolter telescopes.

In the example which is shown in FIG. 32 the branch radiation beam has a half divergence θ of approximately 4 milliradians. The branch radiation beam may initially have a beam diameter of approximately 10 mm. The optical elements 7006a-7006d are configured such that the diameter of the branch radiation beam $B_a$ does not exceed approximately 40 mm.

Delivering a radiation beam over a given distance using delivery optics such as those shown in FIG. 32, may be simplified if the etendue of the radiation beam is reduced. In the embodiment which is shown in FIG. 30, the etendue of the branch radiation beam is increased by the radiation alteration device 7100 which comprises a plurality of reflective facets. In other embodiments the etendue of a branch radiation beam may be increased by a radiation alteration device comprising a tube having a reflective internal surface (as is shown for example in FIG. 13). A radiation alteration device comprising a tube having a reflective internal surface may typically increase the etendue of a radiation beam to a greater extent than an equivalent radiation alteration device comprising a plurality of reflective facets. The use of a radiation alteration device comprising a plurality of reflective facets prior to providing a radiation beam to a beam splitting apparatus (as is shown in FIG. 30) may therefore simplify the directing optics 7006 used to direct a branch radiation beam $B_a$ to a lithographic apparatus (when compared to using a radiation alteration device comprising a tube having a reflective internal surface).

As was previously explained, the etendue of a modified radiation beam is of the order of the square of the product of the diameter of the apparent source size and the half divergence of a modified radiation beam. In the example which is shown in FIG. 32, the diameter of the apparent source size of the branch radiation beam which is provided to the directing optics may be approximately 10 mm and the half divergence may be approximately 4 milliradians. The product of the diameter of the apparent source size and the half divergence is therefore approximately 40 mm milliradians. In an alternative embodiment in which the radiation alteration device comprises a tube having a reflective internal surface, the equivalent diameter of the apparent source size of the branch radiation beam may be approximately 5 mm and the equivalent half divergence may be approximately 20 milliradians. The product of the diameter of the apparent source size and the half divergence is therefore approximately 100 mm milliradians. The etendue of the branch radiation beam may therefore be significantly smaller when a radiation alteration device comprising a plurality of reflective facets is used prior to the beam splitting apparatus (when compared to a radiation alteration device comprising a tube having a reflective internal surface). As was explained above this may simplify the design of the directing optics which direct the branch radiation beam $B_a$ to a lithographic apparatus.

Figure 33:
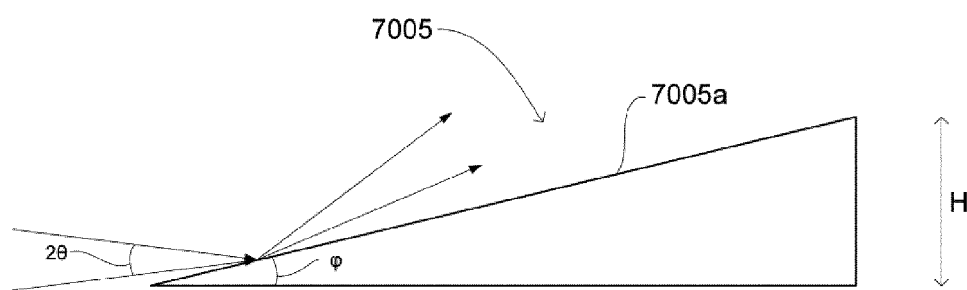
FIG. 33 is a schematic illustration of a portion of a beam splitting apparatus of the lithographic system of FIG. 30.

FIG. 33 is a schematic illustration of a portion of the beam splitting apparatus 7005. As was described above the beam splitting apparatus 7005 may, for example, be of the form shown in any of FIG. 13, 14A, 14B, 18, 19, 21, 22A, or 23 or may take any other form. FIG. 33 shows a single reflective facet 7005a which forms part of the beam splitting apparatus 7005. The reflective facet 7005a has a height H. The reflective facet 7005a also has a width W (not shown in FIG. 33) which extends into the page of FIG. 33. A modified radiation beam is incident on the reflective facet 7005a having an angular range of propagation directions 2θ. That is, the angular range of propagation directions is two times the half-divergence θ of the modified radiation beam. The average grazing incidence angle with which the modified radiation beam is incident on the reflective facet 7005a is labelled φ in FIG. 33.

As was described above with reference to FIG. 30 the beam splitting apparatus is positioned at or near a far field plane in which sub-beams formed at the radiation alteration device 7100 overlap with each other. In particular, it may be desirable for the entire surface of the reflective facets of the beam splitting apparatus to be close to the far field plane in which the sub-beams overlap. The entire beam splitting apparatus may be considered to be close to the far field plane if the following inequality is satisfied.

$$\frac{HD_0}{W\varphi L} \ll 1 \quad (3)$$

where $D_o$ is the diameter of the radiation beam which is incident on the radiation alteration device 7100 and N is the number of reflective facets of the beam splitting apparatus and thus the number of branch radiation beams to be formed.

It may be further desirable for substantially all rays of radiation which form the modified radiation beam to be incident on one of the reflective facets which form the beam splitting apparatus. This may be achieved if the following inequality is satisfied.

$$\frac{D_0}{\varphi L} \ll 1 \quad (4)$$

where L is the distance between the radiation alteration device 7100 and the beam splitting apparatus 7005.

It may be further desirable for the facets of the beam splitting apparatus to be sufficiently large such that the branch radiation beams are separated by an angle which is larger than the angular spread 2θ. This may be achieved if the following inequality is satisfied.

$$\frac{D_0 N}{2\pi\varphi L} < 1 \quad (5)$$

In an embodiment the variables mentioned above may take on approximately the following values L=4 m, $D_0$=20 mm, W=100 mm, H=10 mm, N=10, φ=50 milliradians. In such an embodiment the inequalities given in equations (3)-(5) are all satisfied.

Figure 34:
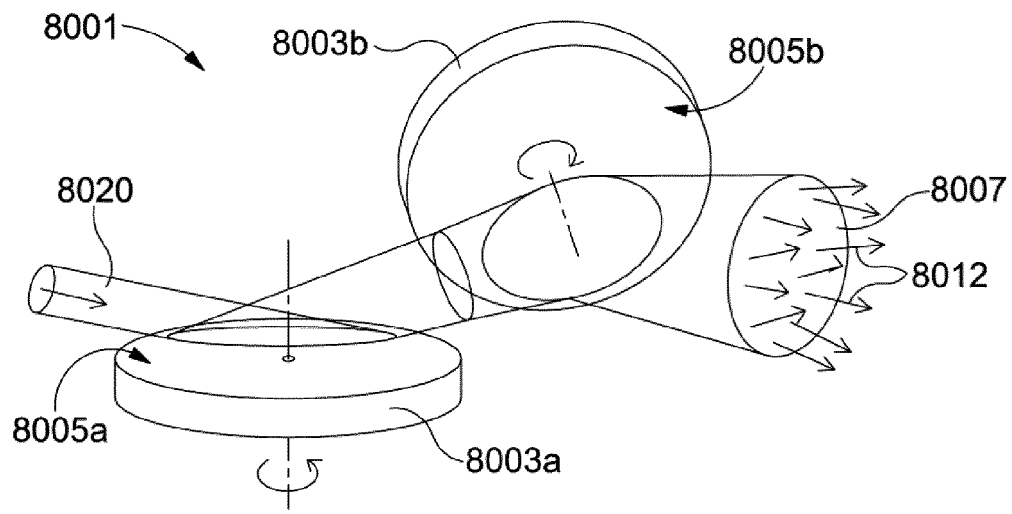
FIG. 34 is a schematic illustration of a radiation alteration device according to an embodiment of the invention.

FIG. 34 is a schematic illustration of an alternative embodiment of a radiation alteration device 8001 comprising a first diffusing element 8003a and a second diffusing element 8003b. The first diffusing element 8003a comprises a first roughened reflective surface 8005a and the second diffusing element 8003b comprises a second roughened reflective surface 8005b. In the embodiment which is shown in FIG. 34 the first and second diffusing elements 8003a, 8003b both comprise disc like structures which include roughened reflective surfaces 8005a, 8005b.

A radiation beam 8020 is incident on the first roughened reflective surface 8005a and reflected from the first roughened reflective surface 8005a so as to be incident on the second roughened reflective surface 8005b. The radiation beam is reflected from the second roughened reflective surface 8005b so as to output a modified radiation beam 8007.

Figure 35:
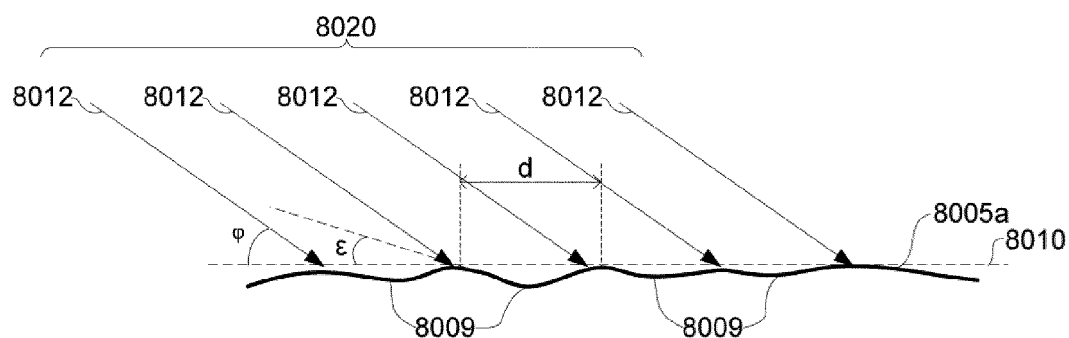
FIG. 35 is a schematic illustration of a roughened reflective surface which forms part of the radiation alteration device of FIG. 34.

FIG. 35 is a schematic illustration of a portion of the first roughened reflective surface 8005a. The roughened reflective surface 8005a includes indentations 8009 which cause the reflective surface 8005a to deviate from a flat plane 8010 which is shown in FIG. 35 for reference purposes. Also shown in FIG. 35 are rays of radiation 8012 which represent parts of the radiation beam 8020 and which are incident on the roughened reflective surface 8005a. The radiation beam 8020 and the rays 8012 are incident on the roughened reflective surface 8005a at a grazing incidence angle φ relative to the flat plane 8010 from which the roughened reflective surface 8005a deviates.

Due to the deviations of the roughened surface 8005a from the flat plane 8010 different rays of radiation 8012 will be incident on the reflective surface 8005a at different grazing incidence angles relative to the roughened reflective surface 8005a. Consequently different rays of radiation 8012 will be reflected from the roughened reflective surface in different directions. The roughened reflective surface 8005a therefore serves to increase a range of angles with which rays of radiation 8012, which form the radiation beam 8012, propagate. That is, the roughened reflective surface 8005a introduces an angular spread to the radiation beam 8012.

Most of the angular spread which is introduced into the radiation beam 8020 is in a direction which is approximately parallel to the plane of incidence at the roughened reflective surface 8005a. The second roughened reflective surface 8005b of the second diffusing element 8003b may be similar to the first roughened reflective surface 8005a which is shown in FIG. 35. The second roughened reflective surface 8005b may therefore also introduce an angular spread into the radiation beam 8020. The second roughened reflective surface 8005*b* may be arranged such that it is approximately perpendicular to the first roughened reflective surface 8005*a*. The plane of incidence at the second roughened reflective surface 8005*b* may therefore be approximately perpendicular to the plane of incidence at the first roughened reflective surface 8005*a*. The angular spread which is introduced at the second roughened surface 8005*b* may therefore generally be in a direction which is approximately perpendicular to the general direction in which an angular spread is introduced at the second roughened surface 8005*b*. The modified radiation beam 8007 which is output from the radiation alteration device 8001 may therefore include angular spread in all directions. This is illustrated in FIG. 34 by rays of radiation 8012 which propagate in a range of different directions.

The angular spread of radiation which is introduced by the radiation alteration device 8001 serves to increase the etendue of the modified radiation beam, when compared to the radiation beam 8020 which is incident on the first diffusing element 8003*a*. Due to the uneven nature of the roughened reflective surfaces 8005*a*, the direction in which a given ray of the radiation beam 8020 is output from the radiation alteration device 8001 as part of the modified radiation beam 8007 may be described by a probability distribution. The probability distribution may be a continuous function such that the angular intensity profile of the modified radiation beam 8007 which is output from the radiation alteration device 8001 is also a continuous function. It may be desirable to image the angular intensity profile of the modified radiation beam 8007 onto a far field plane such that the spatial intensity profile in the far field plane is a continuous function.

The radiation beam 8020 which is incident on the diffusing elements 8003*a*, 8003*b* may be an approximately coherent radiation beam. As was explained above, different rays of radiation 8012 which form the coherent radiation beam 8020 may be reflected in different directions. This may lead to interference occurring between the different rays 8020. Interference between different rays 8020 may lead to a speckle pattern occurring in the modified radiation beam 8012. It may be desirable to reduce or remove the occurrence of speckle in the modified radiation beam 8012. This may be achieved by rotating the first and/or the second diffusing elements 8003*a*, 8003*b*. Rotation of the diffusing elements 8003*a*, 8003*b* is indicated in FIG. 34 by arrows. The diffusing elements 8003*a*, 8003*b* may, for example, be rotated about central axes of the diffusing elements 8003*a*, 8003*b*.

Rotation of the diffusing elements 8003*a*, 8003*b* may advantageously reduce the occurrence of speckle in the modified radiation beam 8012. For example, rotation of the diffusing elements 8003*a*, 8003*b* may increase the frequency at which local intensity fluctuations occur in the modified radiation beam 8012 as a result of interference effects. For example, rotation of the diffusing elements 8003*a*, 8003*b* may ensure that local intensity fluctuations only occur at frequencies which are greater than approximately 10 kHz. Local intensity fluctuations which occur with frequencies of greater than approximately 10 kHz may not cause significant problems when all or a portion of the modified radiation beam is used in a lithographic exposure process. Local intensity fluctuations which occur with frequencies of greater than approximately 10 kHz may therefore be acceptable.

The speed at which the roughened reflective surfaces 8005*a*, 8005*b* need to move in order to ensure that local intensity fluctuations occur only above a given frequency, may depend on the size of the roughness features on the roughened reflective surfaces 8005*a*, 8005*b* (e.g. a diameter d of the indentations 8009). In an embodiment, the roughness features on the roughened reflective surfaces 8005*a*, 8005*b* may have approximate sizes of about 0.1 mm. In such an embodiment the rotation speed of the diffusing elements 8003*a*, 8003*b* may be large enough that the roughened reflective surfaces 8005*a*, 8005*b* move at speeds which are greater than about 1 meter per second. This may ensure that local intensity fluctuations due to interference effects occur at frequencies above about 10 kHz.

The diffusing elements 8003*a*, 8003*b* may, for example be forced to rotate by one or more actuators (not shown in FIG. 34). Whilst rotation of the diffusing elements 8003*a*, 8003*b* has been described above, in other embodiments the diffusing elements 8003*a*, 8003*b* may undergo forms of movement other than rotation. For example, the diffusing elements 8003*a*, 8003*b* may undergo periodic linear motion in a direction which causes the roughened reflective surfaces 8003*a*, 8003*b* to remain in approximately the same plane. In general, the diffusing elements 8003*a*, 8003*b* may be forced to undergo any form of motion which ensures that the roughened reflective surfaces 8005*a*, 8005*b* travel at a speed which is great enough to reduce speckle effects in the modified radiation beam 8007.

Referring again to FIG. 35, the indentations 8009 in the roughened reflective surface 8005*a* have an approximate diameter d. The maximum angle which the roughened reflective surface 8005*a* makes with the flat plane 8010 is shown in FIG. 35 and is labelled ε. It is desirable that no rays of radiation 8012 which form the radiation beam 8020 are reflected from the roughened reflective surface 8005*a* more than once. In order to ensure that the rays of radiation 8012 are only reflected once it is desirable that the magnitude of the maximum angle ε is less than about a third of the grazing incidence angle φ. That is, it is desirable to satisfy the inequality $|\varepsilon|<\varphi/3$. In some embodiments it may be desirable for the maximum angle ε to be smaller than this. For example, it may be desirable to satisfy the inequality $|\varepsilon|<\varphi/3$. This may serve to reduce an asymmetry between rays 8012 which are deflected upwards or downwards relative to a reflection from the flat plane 8010.

In an embodiment, it may be desirable to generate an angular spread in the modified radiation beam 8007 of approximately 20 milliradians. This may be achieved, for example, with a maximum angle ε of approximately 10 milliradians. In some embodiments it may be desirable for the modified radiation beam 8007 to have a smaller etendue than will be achieved with a maximum angle ε of approximately 10 milliradians. In such embodiments the maximum angle ε may be less than 10 milliradians. For example, the maximum angle ε may be approximately 1 milliradian.

In an embodiment the grazing incidence angle φ may be approximately 70 milliradians, the maximum angle ε of approximately 10 milliradians, the diameter d of the indentations 8009 may be approximately 0.1 mm. The indentations 8009 may have a depth of approximately 250 nm and a radiation of curvature which is approximately equal to 5 mm. If the indentations can be approximated by a portion of a sphere then the depth of the indentations will be approximately equal to $d\varepsilon/4$ and the radius of curvature of the indentations will be approximately equal to $d/(2\varepsilon)$.

In some embodiments the grazing incidence angle φ may be less than about 5°. In some embodiments the grazing incidence angle φ may be less than about 2°. In some embodiments the grazing incidence angle φ may be less than about 1°. The use of roughened reflective surfaces which receive radiation at grazing incidence angles (e.g. grazing incidence angles of about 5° or less) advantageously relaxes surface roughness requirements for the roughened reflective surfaces. For example, if the roughened reflective surfaces were to receive radiation at angles of incidence which are close to normal incidence then in order to reflect radiation from the roughened reflective surface with a given efficiency, the surface may need to have a surface roughness parameter which is less than a given threshold. For an equivalent surface which receives radiation at grazing incidence angles, the equivalent surface roughness parameter threshold may be relaxed. For example, the equivalent surface roughness parameter threshold may be approximately an order of magnitude greater for reflection at grazing incidence angles. It may therefore be simpler to manufacture a suitable roughened reflective surface which is configured to receive radiation at grazing incidence angles, than it is to manufacture a similar surface to receive radiation at angles of incidence which are close to normal incidence.

It may be desirable for the above described restrictions on the maximum angle ε to hold true even for small deviations in the surface, which may have sizes smaller than the diameter d of the indentations 8009. For example, it may be desirable for the restrictions on the maximum angle ε to hold true even for any deviations which have a depth which is equivalent to or larger than the wavelength of the radiation beam 8020. A reflective surface may include small scale roughness features (for example, on a nanometer scale) which form angles which are greater than the maximum angle ε.

In general all reflective surfaces include roughness features on some scale. For example, all reflective surfaces include roughness features on a small scale which is equivalent to or smaller than the wavelength of the radiation which is being reflected. Reference herein to a "roughened reflective surface" is intended to mean a reflective surface having roughness features which are larger than the wavelength of the radiation which is being reflected and which introduce an angular spread into the radiation beam.

In general, it is desirable for the maximum angle ε to be less than half of a desired angular spread which is to be introduced by the roughened reflective surface. It is desirable for any roughness features which have steeper slopes than this (for example, small scale roughness features, e.g. on a nanometer scale) to have a height which is less than about 5-10 nanometers.

A roughness feature, such as an indentation 8009 as shown in FIG. 35 having a diameter d will lead to diffraction angles on the order of $\lambda/(\varepsilon \varphi)$ where $\lambda$ is the wavelength of the radiation to be reflected. It is desirable for the diffraction angles to be small when compared to the desired angular spread to be introduced by the roughened reflective surface. In order for this to be the case the following inequality may be satisfied $d > \lambda/(\varepsilon \varphi)$. In general, reference herein to a roughened reflective surface may be interpreted to mean a reflective surface having roughness features whose dimensions are greater than $\lambda/(\varepsilon \varphi)$. In an embodiment, in which the wavelength $\lambda$ of the radiation to be reflected is approximately 13 nm, the maximum angle ε is approximately 0.01 radians and the grazing incidence angle $\varphi$ is approximately 0.07 radians, then the roughness feature size d may be greater than about 20 microns.

In general, a roughened reflective surface may include roughness features having dimensions which are greater than about 10 microns. In some embodiments the roughness features may be larger than about 20 microns, larger than about 30 microns or larger than about 50 microns. For example, in some embodiments the roughness features may be of the order of 100 microns.

Figure 36:
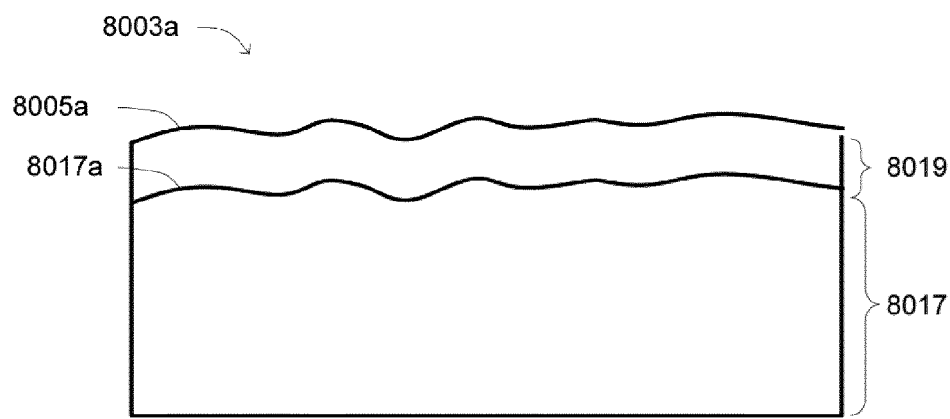
FIG. 36 is a schematic illustration of a diffusing element which forms part of the radiation alteration device of FIG. 34.

The roughened reflective surfaces 8005a, 8005b may be formed, for example by roughening a substrate on which a reflective coating is added. FIG. 36 is a schematic illustration of a cross-section through an embodiment of the first diffusing element 8003a. The first diffusing element 8003a comprises a substrate 8017 and a reflective coating 8019. The substrate 8017 includes an upper surface 8017a which is roughened such that it includes indentations relative to a flat plane. The reflective coating 8019 is disposed on the substrate 8017. The indentations in the uppers surface 8017a cause the reflective coating 8019 to also include indentations. Consequently a roughened reflective surface 8005a is provided.

The indentations in the upper surface 8017a of the substrate 8017 may be formed, for example, by abrasive blasting of the upper surface 8017a. The substrate 8017 may, for example, be metallic such that it deforms plastically upon impact from blasting particles. For example, the substrate may comprise nickel, copper and/or aluminum. Other methods of forming the indentations may also be used. For example, the upper surface 8017a may be impacted with smooth objects such as glass or steel beads. In some embodiments tumbling may be used to form the indentations in the upper surface 8017a.

Blasting or tumbling of the upper surface 8017a may cause the upper surfaces 8017a to have a desired macroscopic roughness. However, the upper surface 8017a may not be smooth enough on a nanometer length scale for efficient reflection of radiation (e.g. EUV radiation). The reflective coating 8019 is therefore disposed on the substrate in order to provide a reflective surface 8005a having a desired smoothness on a nanometer length scale so as to efficiently reflect radiation (e.g. EUV radiation). The reflective coating 8019 may, for example, be formed from ruthenium. In other embodiments the reflective coating 8019 may, for example, be formed from molybdenum.

In some embodiments an additional process may be performed in order increase the small-scale smoothness of the roughened reflective surface 8005a. For example, an electropolishing process may be performed in order to smooth the roughened reflective surface 8005a. Depending on the materials used to form the substrate and the reflective coating it may be easier to perform an electropolishing process on the substrate 8017, rather than on the reflective coating 8019. In some embodiments, the upper surface 8017a of the substrate 8017 may therefore be subjected to an electropolishing process prior to disposing the reflective layer 8019 on the substrate.

In an alternative embodiment, a mandrel having desired surface characteristics may initially be formed. The mandrel may, for example, be formed by abrasive blasting of a surface of the mandrel followed by electropolishing of the surface. The mandrel may be used in an electroforming process in order to shape an upper surface of a substrate (e.g. a nickel substrate). A reflective coating may then be disposed on the upper surface of the substrate in order to form a roughened reflective surface 8005a.

Figure 37A:
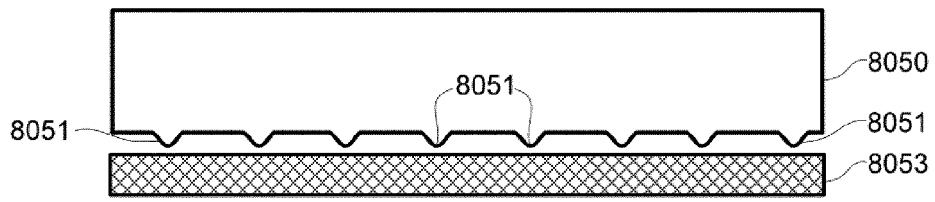
FIGS. 37A, 37B, 37C, 37D and 37E are schematic illustrations of steps of a method of forming a roughened reflective surface according to an embodiment of the invention.

FIGS. 37A-37E are schematic illustrations of steps of an alternative method for forming a diffusing element. FIG. 37A shows a patterned substrate 8050 and a metal sheet 8053. The patterned substrate 8050 includes protrusions 8051 which extend outwardly from an otherwise flat surface of the substrate. The protrusions 8051 may be formed, for example, by a milling process. Alternatively the protrusions may be formed by depositing a coating material onto the substrate 8050. For example, a coating material may be deposited onto the substrate using an ink-jet printer. The protrusions 8051 may be arranged in a regular pattern. Alternatively, the protrusions 8051 may be randomly distributed across the surface of the substrate 8050. The shape and/or size of each of the protrusions 8051 may be approximately the same. Alternatively, the shape and/or size of the protrusions 8051 may be different for different protrusions 8051.

Figure 37B:
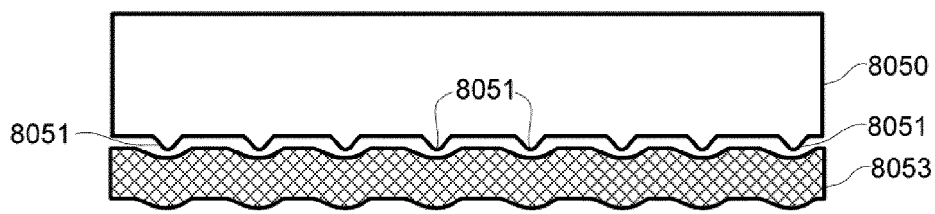

FIG. 37B shows the patterned substrate 8050 being using to deform the metal sheet 8053. For example, the metal sheet 8053 may be deformed by pressing the patterned substrate 8050 and the metal sheet 8053 together using a hydraulic forming process.

Figure 37C:
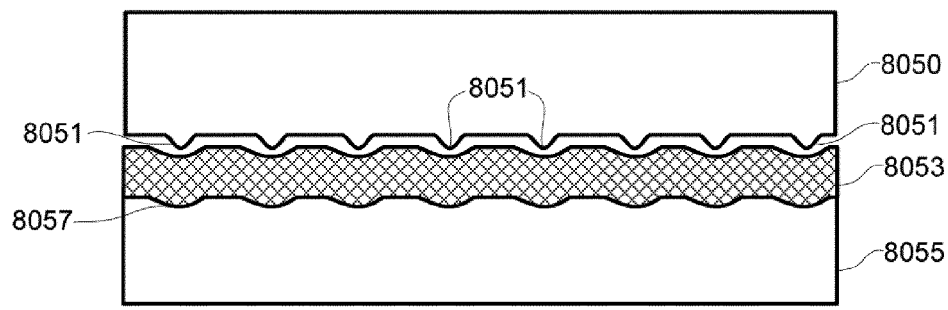

The deformed metal sheet 8053 may be used as a mandrel to shape the surface of a substrate 8055. FIG. 37C shows a substrate 8055 comprising an upper surface 8057 which is shaped using the deformed metal sheet 8053. The upper surface 8057 of the substrate 8055 may, for example, be shaped using an electroforming process.

Figure 37D:
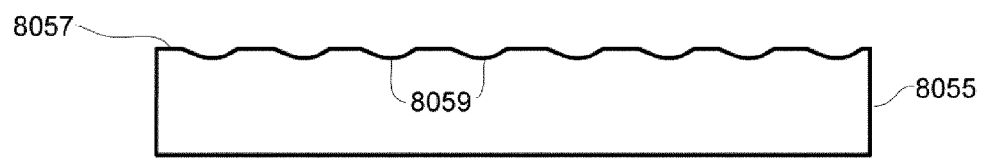
Figure 37E:
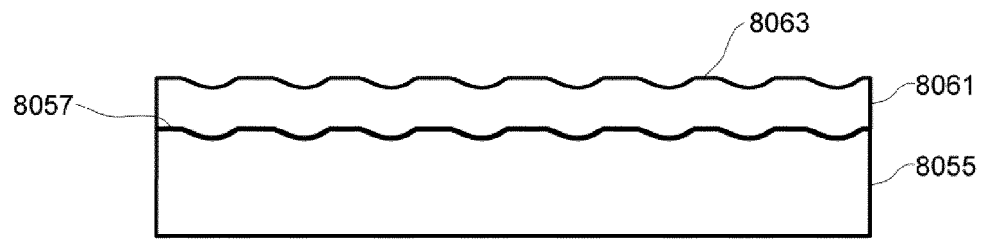

FIG. 37D shows the shaped substrate 8055 after separation from the deformed metal sheet 8053. The upper surface 8057 of the substrate includes indentations 8059. As is shown in FIG. 37E a reflective coating 8061 is subsequently added to the upper surface 8057 of the substrate 8055 so as to form a roughened reflective surface 8063. The reflective coating 8061 may, for example, be formed from ruthenium. Alternatively the reflective coating 8061 may be formed from molybdenum.

While various methods have been described above for forming a roughened reflective surface which may form part of a diffusing element, in other embodiments a roughened reflective surface may be formed using any suitable method.

A radiation alteration device 8001 of the type shown in FIG. 34 may be used as part of a lithographic system. For example, a radiation alteration device 8001 of the type shown in FIG. 34 may be used to modify a radiation beam prior to the radiation beam being provided to a beam splitting apparatus. Additionally or alternatively a radiation alteration device 8001 may be used to modify a branch radiation beam prior to the branch radiation beam being provided to a lithographic apparatus.

As was described above, the radiation alteration device 8001 may form a modified radiation beam 8007 having a continuous angular intensity profile. It may be desirable to image the angular intensity profile onto a far field plane, which is close to or at a plane at which the modified radiation beam is received. For example, it may be desirable to image the angular intensity profile onto plane which is close to or at a location where a beam splitting apparatus is situated, such that the beam splitting apparatus receives a radiation beam having a continuous spatial intensity profile. Additionally or alternatively it may be desirable to image the angular intensity profile onto a plane which is close to or at a location where an optical element of a lithographic apparatus (e.g. a field facet mirror) is situated, such that the optical element receives a radiation beam having a continuous spatial intensity profile.

Figure 38A:
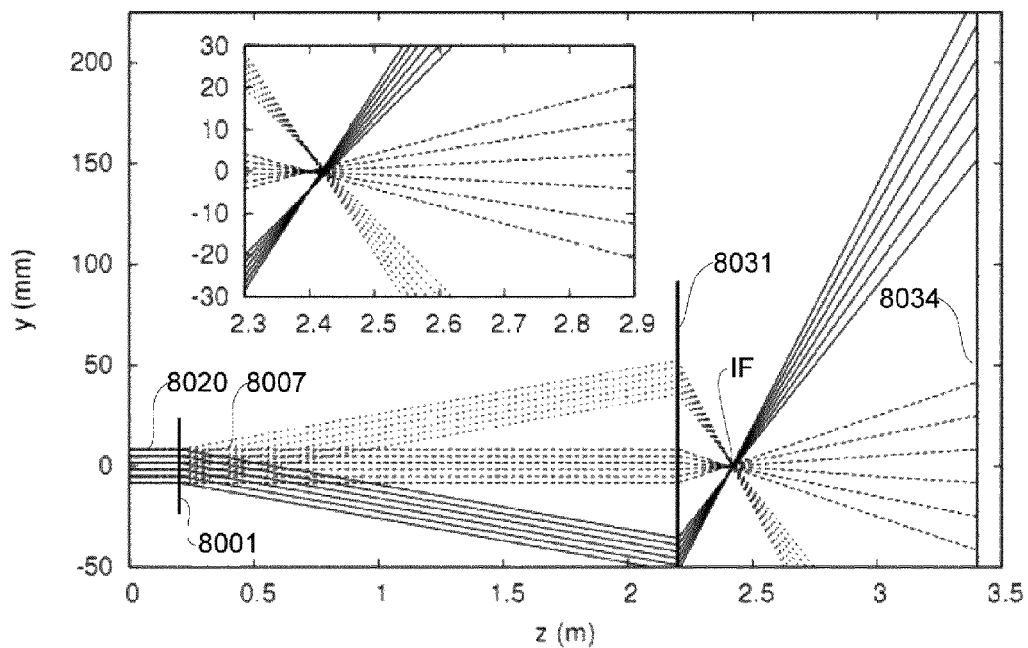
FIGS. 38A and 38B are schematic representations of focusing schemes which may be used to image an angular intensity profile of a modified radiation beam output from a radiation alteration device onto a far field plane.

FIG. 38A is a schematic representation of a focusing scheme which may be used to image the angular intensity profile of a modified radiation beam 8007 output from a radiation alteration device 8001 approximately onto a far field plane 8034. The modified radiation beam 8007 is received by a focusing optic 8031. The focusing optic 8031 focuses the modified radiation beam so as to pass through an intermediate focus IF. The intermediate focus IF may, for example, be situated at or near to an opening in an enclosing structure of a lithographic apparatus. The focusing optic 8031 also serves to image the modified radiation beam onto a far field plane 8034. The far field plane 8034 may, for example, be a plane in which a field facet mirror of a lithographic apparatus is situated.

Whilst the focusing scheme which is shown in FIG. 38A is represented as being formed of transmissive optics, in practice the focusing scheme may be implemented using reflective optics. The radiation alteration device 8001 may, for example, be of the form shown in FIG. 34. The focusing optic 8031 may, for example, comprise a Wolter telescope formed from a plurality of reflective shells.

In the embodiment which is shown in FIG. 38A, the diameter of the radiation which is incident on the far field plane 8034 may weakly depend on the beam diameter of the radiation beam 8020 which is received by the radiation alteration device 8001. The sensitivity of the diameter of the radiation which is incident on the far field plane 8034 to the diameter of the radiation beam 8020 which is received by the radiation alteration device 8001 may, for example, be reduced by introducing one or more further optical elements.

Figure 38B:
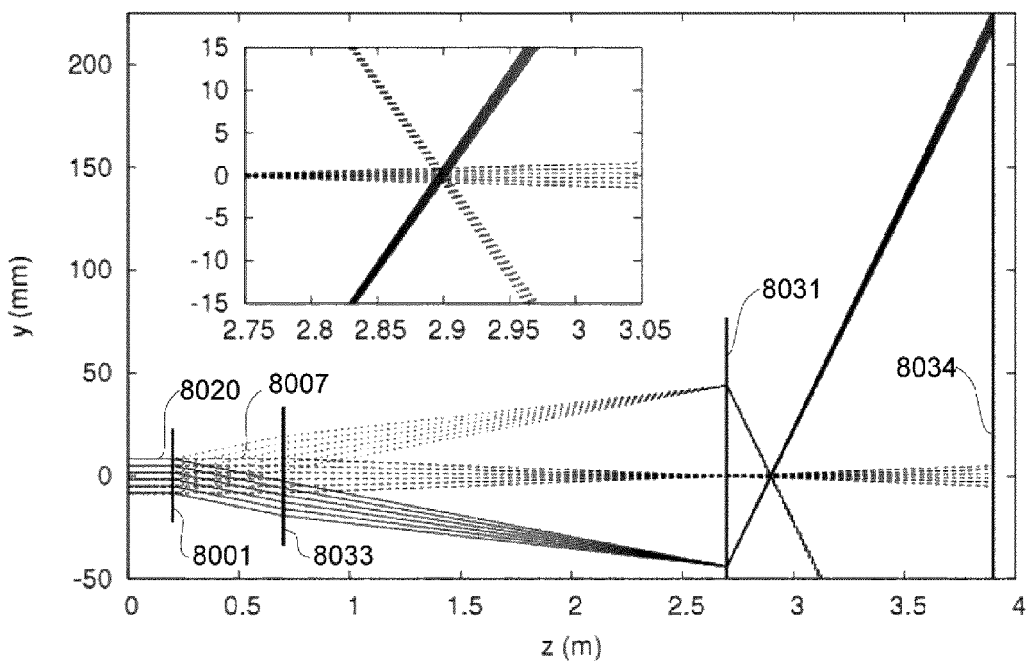

FIG. 38B is a schematic representation of an alternative embodiment of a focusing scheme which may be used to image the angular intensity profile of a modified radiation beam 8007 output from a radiation alteration device 8001 approximately onto a far field plane 8034. The focusing scheme which is shown in FIG. 38B is similar to the focusing scheme which is shown in FIG. 38A except that it includes a second focusing optic 8033 which focuses the modified radiation beam 8007 onto the focusing optic 8031. The second focusing optic 8033 may serve to reduce the sensitivity of the diameter of the radiation which is incident on the far field plane 8034 to the diameter of the radiation beam 8020 which is received by the radiation alteration device 8001.

In alternative embodiments, the sensitivity of the diameter of the radiation which is incident on the far field plane 8034 to the diameter of the radiation beam 8020 which is received by the radiation alteration device 8001, may be reduced by extending the distance between the radiation alteration device 8001 and the far field plane 8034 (for example, when compared to the distance shown in FIG. 38A). In such embodiments the size of the focusing optic 8031 may be increased (for example, when compared with the size of the focusing optic 8031 shown in FIG. 38A).

While the focusing scheme which is shown in FIG. 38B is represented as being formed of transmissive optics, in practice the focusing scheme may be implemented using reflective optics. The radiation alteration device 8001 may, for example, be of the form shown in FIG. 34. The focusing optic 8031 may, for example, comprise a Wolter telescope formed from a plurality of reflective shells.

Figure 39:
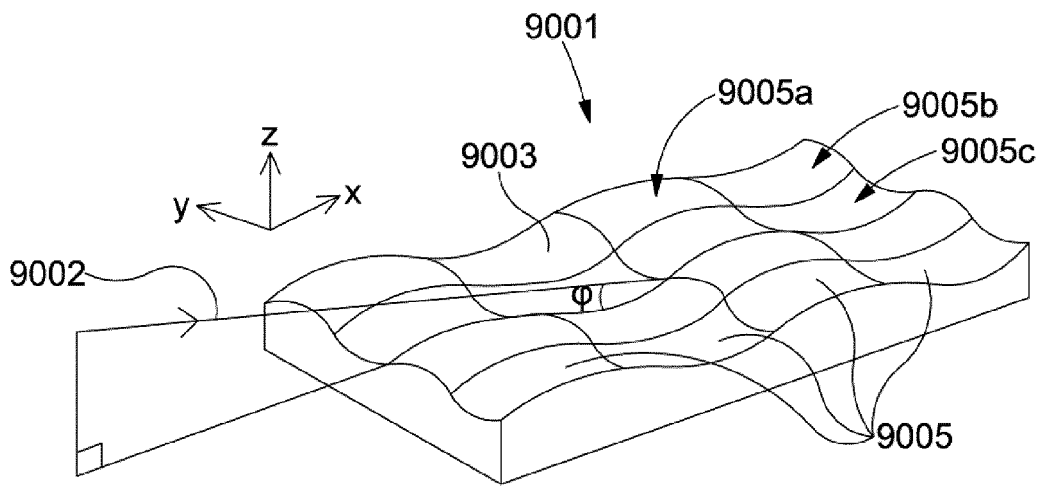
FIG. 39 is a schematic illustration of a radiation alteration device according to an alternative embodiment of the invention.

FIG. 39 is a schematic illustration of an alternative embodiment of a radiation alteration device 9001 according to an embodiment of the invention. The radiation alteration device 9001 comprises a continuously undulating reflective surface 9003. The radiation alteration device 9002 is illuminated with a radiation beam. The radiation beam 9002 is represented in FIG. 39 by a chief ray 9002 of the radiation beam. In the co-ordinate system used in FIG. 39, the chief ray 9002 is substantially parallel with the x-axis. The radiation beam is incident on the radiation alteration device 9001 at a grazing incidence angle φ. Due to the undulating nature of the surface 9003 different cross-sectional portions of the radiation beam will be incident on the surface 9003 at different grazing incidence angles. Furthermore the radiation beam may have some divergence which results in different rays which form the radiation beam being incident on the surface 9003 at different grazing incidence angles. The grazing incidence angle φ which is shown in FIG. 39 is intended to denote the average grazing incidence angle which rays of the radiation beam form with the surface 9003.

The shape of the continuously undulating reflective surface 9003 follows a substantially periodic pattern in both the x and y-directions indicated in FIG. 39. The continuously undulating reflective surface 9003 may be considered to comprise a plurality of reflective portions 9005. However, the reflective portions 9005 of a continuously undulating reflective surface as shown in FIG. 39 differ from, for example, the reflective facets 6103a-6103p shown in FIG. 25 or the reflective facets 6103'a-6103'm shown in FIG. 26.

The reflective facets 6103a-6103p shown in FIG. 25 and the reflective facets 6103'a-6103'm shown in FIG. 26 form a reflective surface which includes discontinuities. In practice the facets may, for example, be formed from separate elements which are manufactured separately and arranged adjacent to each other. The boundaries of the facets are defined by sharp edges which form discontinuities in the reflective surface provided by the combination of the facets. In contrast, the reflective surface 9003 which is provided by the combination of the reflective portions 9005 shown in FIG. 39 does not include any substantial discontinuities. The reflective surface 9003 does not therefore include any sharp boundaries between adjacent reflective portions 9005.

The radiation alteration device which is shown in FIG. 39 may modify a radiation beam in a similar fashion to other embodiments of radiation alteration devices which are described above. For example, the radiation alteration device 9001 may serve to increase the etendue of a radiation beam. Additionally or alternatively the radiation alteration device 9001 may serve to increase the homogeneity of an intensity profile of the radiation beam. The radiation alteration device 9001 may in particular modify a radiation beam in a similar manner to a radiation alteration device comprising a plurality of reflective facets.

In the representation which is shown in FIG. 39, boundaries between adjacent reflective portions join points of inflection on the surface. That is, if the extent of the reflective surface 9003 in the z-direction is described by a continuous mathematical function of x and y positions, points of inflection of the continuous function in the x and y-directions define the boundaries between adjacent portions 9005. Each portion 9005 has a length in the x direction which is substantially half of a single period of the periodic pattern in the x-direction. Each portion 9005 has a length in the y-direction which is substantially half of a single period of the periodic pattern in the y-direction.

The reflective portions 9005 shown in FIG. 39 may be divided into three different classes of reflective portion. A first class of reflective portion 9005a may be referred to as a convex portion 9005a. A convex portion 9005a has a positive curvature in both the x and y-directions. That is, the second derivative with respect to x and y of a continuous function describing the surface 9003 as a function of x and y remains positive throughout a convex portion 9005a. A second class of reflective portion 9005b may be referred to as a saddle portion 9005b. A saddle portion 9005b has a positive curvature in one of the x and y-directions and a negative curvature in the other of the x and y-directions. A third class of portion 9005c may be referred to as a concave portion 9005c. A concave portion 9005c has a negative curvature in both the x and y-directions.

The portions 9005 may be configured such that each portion 9005 receives a cross-sectional portion of the radiation beam which is substantially a square. Since the radiation beam propagates substantially parallel with the x-axis and is incident on the radiation alteration device 9001 at a relatively small grazing incidence angle φ, the extent of the portions 9005 in the x-direction is greater than the extent of the portions in the y-direction. In other embodiments the cross-sectional portion of the radiation beam which is incident on each portion 9005 may have a shape other than a square. For example, the cross-sectional shape may be substantially rectangular.

As was described above, the reflective portions 9005 shown in FIG. 39 may be formed from a single reflective surface 9003. Such a surface may be easier to manufacture than a plurality of reflective portions formed from separate elements, such as for example the reflective portions 6103a-6103p shown in FIG. 25 and the reflective portions 6103'a-6103'm shown in FIG. 26. Reflective portions which are manufactured separately from each other and then positioned adjacent one another may be difficult to position such that radiation is not lost at the boundaries between portions. For example, gaps may exist between adjacent portions which may lead to a loss of radiation at the gaps. The continuously undulating reflective surface 9003 shown in FIG. 39 may be manufactured without any gaps in between adjacent portions such that no radiation is lost at boundaries between portions.

Figure 40:
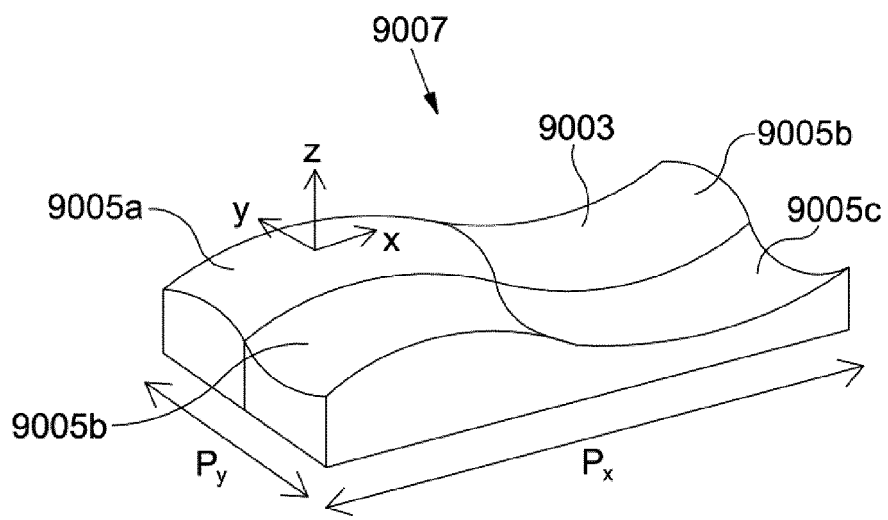
FIG. 40 is a schematic illustration of a unit cell of the radiation alteration device of FIG. 39.

FIG. 40 is a schematic illustration of a unit cell of a continuously undulating surface 9003 which may form a portion of a radiation alteration device 9001 according to an embodiment of the invention. The unit cell 9007 comprises a single period $P_x$ of the undulating surface 9003 in the x-direction and a single period $P_y$ of the undulating surface 9003 in the y-direction. The unit cell 9007 comprises a convex portion 9005a, a concave portion 9005c and two saddle portions 9005b.

The aspect ratio of the portions $$\frac{P_y}{P_x}$$

may be selected such that each portion 9005 receives an approximately square shaped cross-sectional portion of the incident radiation beam. For example, the aspect ratio may be approximately equal to $\sin(\varphi) \approx \varphi$, where φ is the average grazing incidence angle with which radiation is incident on the reflective surface 9003.

The extent of the surface 9003 in the z-direction (which may be referred to as the height of the surface) may be expressed as a continuous mathematical function of x and y. The function may be expressed as:

$$z(x,y) = f(x) + g(y) \tag{6}$$

where $f(x)$ is a periodic function of x having a period $P_x$ and $g(y)$ is a periodic function of y having a period $P_y$.

In the representation shown in FIG. 40, the origin of the x and y-axes (i.e. where x=0 and y=0) is chosen to correspond with the geometric center (on the x and y-axes) of a portion 9005 (in this case the convex portion 9005a). If the origin of the x and y-axes correspond with the center of a portion then the reflective surface may satisfy the following symmetry relations:

$$f(x+\tfrac{1}{2}P_x) = -f(x) \tag{7}$$

$$f(x) = f(-x) \tag{8}$$

$$g(x+\tfrac{1}{2}P_x) = -g(x) \quad (9)$$

$$g(x) = g(-x). \quad (10)$$

In some embodiments the surface 9003 may be defined such that within each portion 9005 z(x,y) is a second order function of both x and y. That is, the curvature of the surface 9003 may be substantially constant in both the x and y-directions within each portion 9005. In such an embodiment, when each portion is illuminated with radiation it will reflect the incident radiation so as to illuminate an approximately rectangular portion of a far field location. If a portion is illuminated with radiation having a substantially homogenous spatial intensity profile then the approximately rectangular portion of the far field location which is illuminated by radiation reflected from the portion 9005 will also have a substantially homogenous spatial intensity profile. A portion 9005 may, for example, be illuminated with radiation having a substantially homogenous spatial intensity profile if the size of the portion 9005 is small compared to any spatial variation in the intensity profile of a radiation beam incident on the radiation alteration device 9001.

In other embodiments, the surface 9003 may be defined such that the curvature of the surface 9003 is different at different positions within a portion. The cross-sectional shape and the spatial intensity profile of radiation reflected from the surface 9003 may, for example, be controlled by controlling the curvature of the surface 9003 within the portions 9005.

In some embodiments, in which each portion 9005 is arranged to receive a portion of the cross-section of a radiation beam having a substantially square shape of width and height a, the expressions f(x) and g(x) in equation (6) may be given by the following equations:

$$f(x) = \frac{a\sigma_m}{4\varphi} Z\left(\frac{2\sin(\varphi)x}{a}\right) \quad (11)$$

$$g(y) = \frac{a\sigma m}{4\varphi} Z\left(\frac{2y}{a}\right) \quad (12)$$

where Z is a dimensionless function of the term inside the brackets in equations (11) and (12), $\varphi$ is the average grazing incidence angle at which the radiation beam is incident on the surface 9003 and $\sigma_m$ is the maximum angle by which radiation is deflected by the reflective surface 9003. The angles $\varphi$ and $\sigma_m$ are in radians. The terms inside the brackets in equations (11) and (12) are dimensionless and vary between −1 and 1 over the extent of a single portion 9005.

Figure 41A:
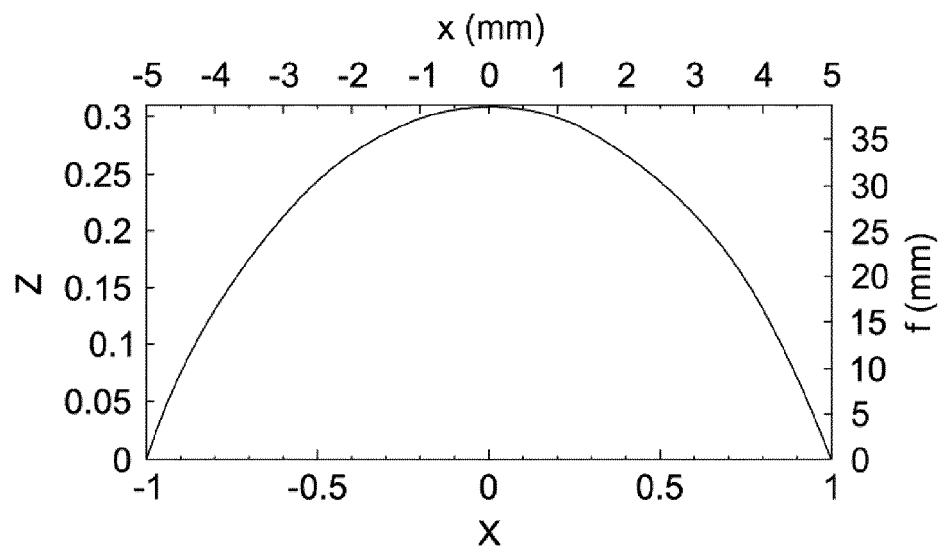
FIGS. 41A and 41B are schematic representations of functions which may define the surface of the radiation alteration device of FIG. 39.
Figure 41B:
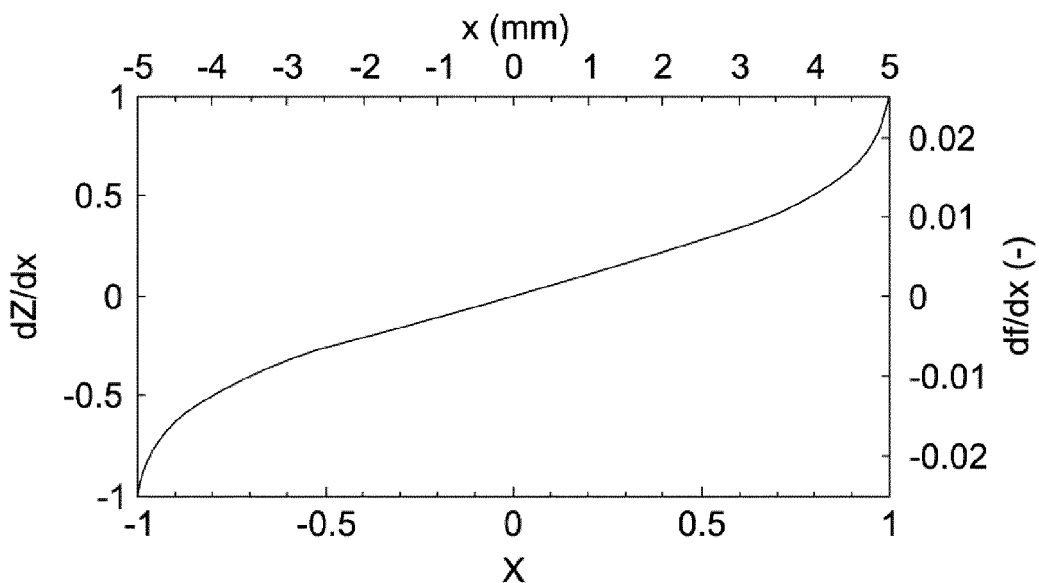

FIG. 41A is a schematic representation of an embodiment of the function Z as a function of X, where X is the term inside the brackets in equation (11). Also shown in FIG. 41A is the resulting function f(x) given by equation (11) as a function of x. FIG. 41B is a schematic representation of the first derivative of the functions shown in FIG. 41A. A similar form of the function Z may be used to define g(y) in equation (12).

The form of the function Z which is shown in FIGS. 41A and 41B is merely an example embodiment. In the example shown in FIGS. 41A and 41B radiation reflected from the reflective surface 9003 will have an approximately Gaussian angular intensity profile. In the depicted example, the Gaussian distribution is cut off at approximately ±2.5 standard deviations. In other embodiments other cut-off points may be chosen.

In other embodiments the shape of the reflective surface 9003 may be defined so as to produce other forms of angular intensity profile. For example, a desired intensity profile and shape in a far field location may be chosen and an appropriate shape of the reflective surface 9003 which achieves the desired intensity profile and shape may be determined and manufactured. In general choosing a wider angular distribution will lead to smaller curvature on the surface 9003 especially in the y-direction and may result in relatively large values of the second derivative of g(y). In general it may be desirable to use relatively small values of the grazing incidence angle $\varphi$ since this will lead to a reduced loss of EUV radiation at the reflective surface. However, the maximum angular deflection $\sigma_m$ is less than the grazing incidence angle $\varphi$. The grazing incidence angle $\varphi$ may therefore be chosen to be sufficiently large to achieve a desired maximum angular deflection $\sigma_m$.

Figure 42:
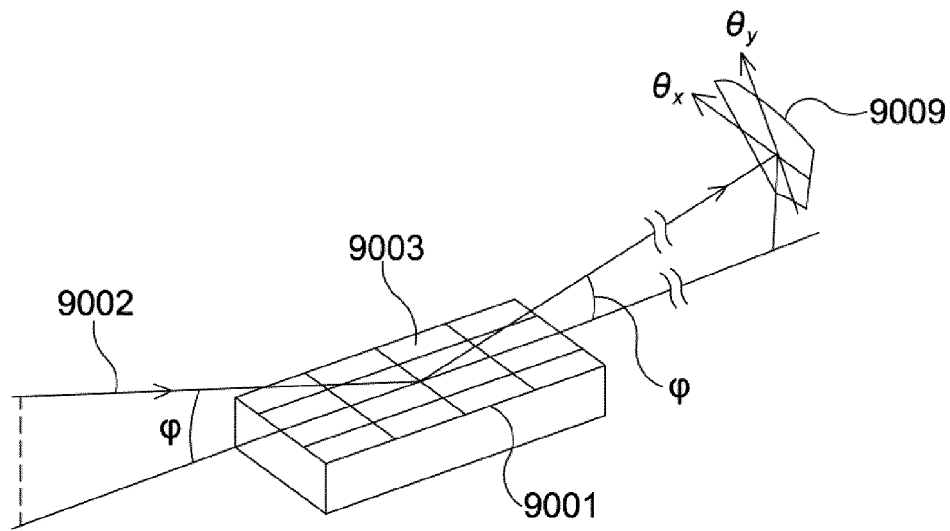
FIG. 42 is a schematic illustration of a radiation alteration device according to an embodiment of the invention.

FIG. 42 is a schematic illustration of a radiation alteration device 9001 of the type described above with reference to FIGS. 39-41. A chief ray 9002 of a radiation beam is shown being incident on a radiation alteration device 9001 at a grazing incidence angle $\varphi$. Whilst not visible in FIG. 42, the radiation alteration device 9001 has a continuously undulating reflective surface 9003 of the form described above with reference to FIGS. 41A and 41B. The resulting shape of the reflected radiation beam in a far field plane 9009 is also shown in FIG. 42.

FIG. 42 is a schematic representation of the normalized angular intensity distribution in the far field plane 9009 shown in FIG. 42. Contour lines shown in FIG. 43 indicate normalized intensity values between 0 and 1 in steps of 0.1. The highest intensity values are in the center of the representation and the intensity decreases with increasing distance from the center. In the example shown in FIG. 43, the grazing incidence angle $\varphi$ was chosen to be approximately 70 milliradians (mrad) and the maximum angular deflection $\sigma_m$ was chosen to be approximately 45 milliradians. In the depicted example the ratio $\varphi/\sigma_m$ is therefore approximately 0.64. In other embodiments the ratio $\varphi/\sigma_m$ may be selected to be greater than or less than 0.64.

Figure 43:
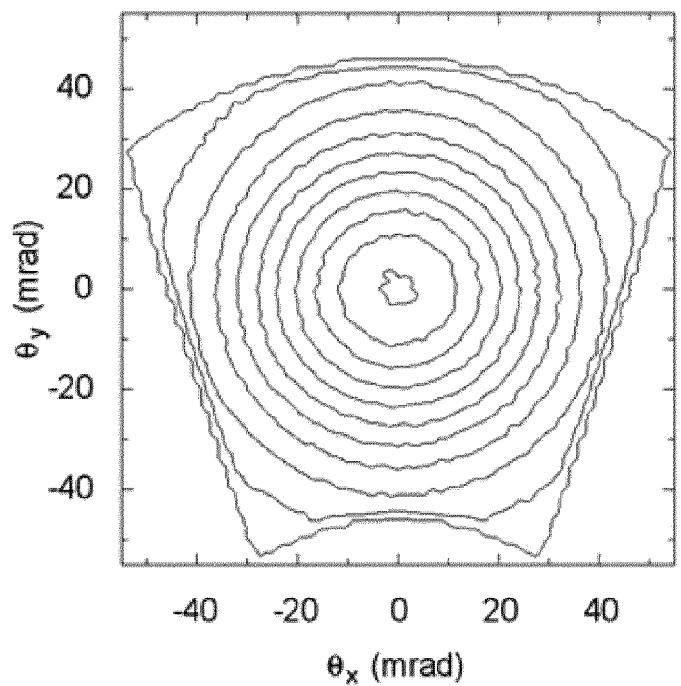
FIG. 43 is a schematic representation of an intensity profile which may be formed by the radiation alteration device of FIG. 42.

The angular intensity profile which is shown in FIG. 43 is merely an example of an angular intensity profile which may be formed by a radiation alteration device 9001 comprising a continuously undulating reflective surface 9003. In some embodiments it may be desirable to form an angular intensity profile of the type shown in FIG. 43 in which the intensity is at a maximum at a center of the profile and decreases with increasing radial distance from the center. However in other embodiments it may be desirable to form an angular intensity profile of a different type. The shape of the reflective surface 9003 (e.g. the curvature of the surface 9003) may be changed in order to change the angular intensity profile formed by radiation reflected from the surface 9003. A desired angular intensity profile may be dependent on the configuration of a lithographic apparatus LA which is arranged to receive the radiation beam which is modified by the radiation alteration device 9001.

In the embodiment which is shown in FIG. 43, the full extent of the angular intensity profile may not be used by a lithographic apparatus LA. For example, a lithographic apparatus may be arranged to receive a disc shaped intensity profile. It will be appreciated that a disc shaped intensity profile may be achieved simply be discarding corners of the intensity profile (for example, by blocking the propagation of corners of the intensity profile).

As was described above with reference to other embodiments of a radiation alteration device, it may be desirable to configure a radiation alteration device 9001 such that a resulting angular intensity profile is relatively insensitive to changes in the position and/or the diameter of the radiation beam which is incident on the radiation alteration device. In general, decreasing the size of the portions 9005 which form the radiation alteration device 9001 will generally decrease the sensitivity of the reflected intensity profile to changes in the position and/or the diameter of the radiation beam which is incident on the radiation alteration device 9001.

As was described above a lithographic apparatus may be configured to capture and use a disc shaped portion of the angular intensity profile which is provided by the radiation alteration device 9001. The power of radiation which is captured by the lithographic apparatus may vary with variations in the position and/or diameter of the radiation beam which is incident on the radiation alteration device 9001. Furthermore the centroid of the intensity distribution which is captured by the lithographic apparatus LA may vary. In general decreasing the size of the reflective portions 9005 and therefore increasing the number of reflective portions 9005 which form a radiation alteration device 9001, may decrease the variations in the captured power and/or the position of the centroid of the intensity distribution. The number of portions 9005 and the size of the portions 9005 may be chosen in order to provide a desired level of stability of the captured power and/or the centroid position.

In some embodiments the radiation beam which is incident on the radiation alteration device 9001 may have an intensity profile which approximately follows a Gaussian distribution. The diameter of the radiation beam may be considered to be the diameter of four standard deviations of the Gaussian distribution. Such a diameter may be denoted $D_{4\sigma}$. A ratio of the diameter $D_{4\sigma}$ to the portion period $P_y$ in the y-direction may be denoted $M=D_{4\sigma}/P_y$. In some embodiments it may be desirable for the shift in position of the centroid of the output intensity distribution to be less than about 10% of the radius of the disc which is captured by a lithographic apparatus. In some embodiments this may for example be achieved if M is greater than about 1.3. The shift in centroid may be less than about 1% of the radius of the disc if M is greater than about 2. The shift in centroid may be less than about 0.1% of the radius of the disc if M is greater than about 7. The above relations may, in some embodiments, be used in order to select the size of the portions 9005. The above relations may apply for mathematically perfect surfaces. For real surfaces which are subject to manufacturing tolerances the values of M may be increased in order to achieve the desired results.

Figure 44A:
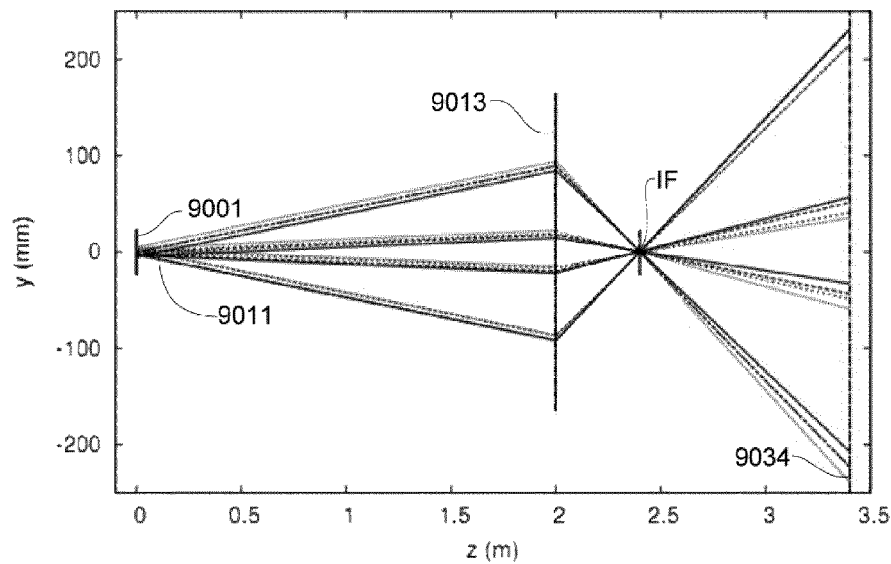
FIGS. 44A and 44B are schematic representations of focusing schemes which may be used to image a modified radiation beam output from a radiation alteration device.

As was described above with reference to other embodiments of radiation alteration devices, a modified radiation beam which is output from a radiation alteration device 9001 may be imaged by one or more focusing optics. FIG. 44A is a schematic representation of a focusing scheme which may be used to image a modified radiation beam which is output from a radiation alteration device 9001 approximately on to a far field plane 9034. The representation which is shown in FIG. 44A is a paraxial representation similar to the paraxial representations shown in FIGS. 12, 32 and 38.

The radiation alteration device 9001 outputs a modified radiation beam 9011. The modified radiation beam 9011 is received by a focusing optic 9013. The focusing optic 9013 focuses the modified radiation beam so as to pass through an intermediate focus IF. The intermediate focus IF may, for example, be situated at or near to an opening in an enclosing structure of a lithographic apparatus. The focusing optic 9013 also serves to image the modified radiation beam 9011 onto a far field plane 9034. The far field plane 9034 may, for example, be a plane in which a field facet mirror of a lithographic apparatus is situated.

Whilst the focusing scheme which is shown in FIG. 44A is represented as being formed of transmissive optics, in practice the focusing scheme may be implemented using reflective optics. The radiation alteration device 9001 may, for example, be of the form shown in FIG. 39. The focusing optic 9013 may, for example, comprise a Wolter telescope formed from a plurality of reflective shells. Alternatively the focusing optic 9013 may comprise a reflective surface having an approximately ellipsoidal shape. Alternatively the focusing optic 9013 may comprise a plurality of reflective elements. For example, the focusing optic 9013 may comprise a Wolter telescope formed from two reflective elements.

In the embodiment which is shown in FIG. 44A, the diameter of the radiation which is incident on the far field plane 9034 may weakly depend on the beam diameter of the radiation beam which is received by the radiation alteration device 9001. The sensitivity of the diameter of the radiation which is incident on the far field plane 9034 to the diameter of the radiation beam 8020 which is received by the radiation alteration device 8001 may, for example, be reduced by introducing one or more further optical elements.

In the embodiment of FIG. 44A, shifts in the position of the radiation beam which is incident on the radiation alteration device 9001 may lead to shifts in the position of the radiation incident on the far field plane 9034.

Figure 44B:
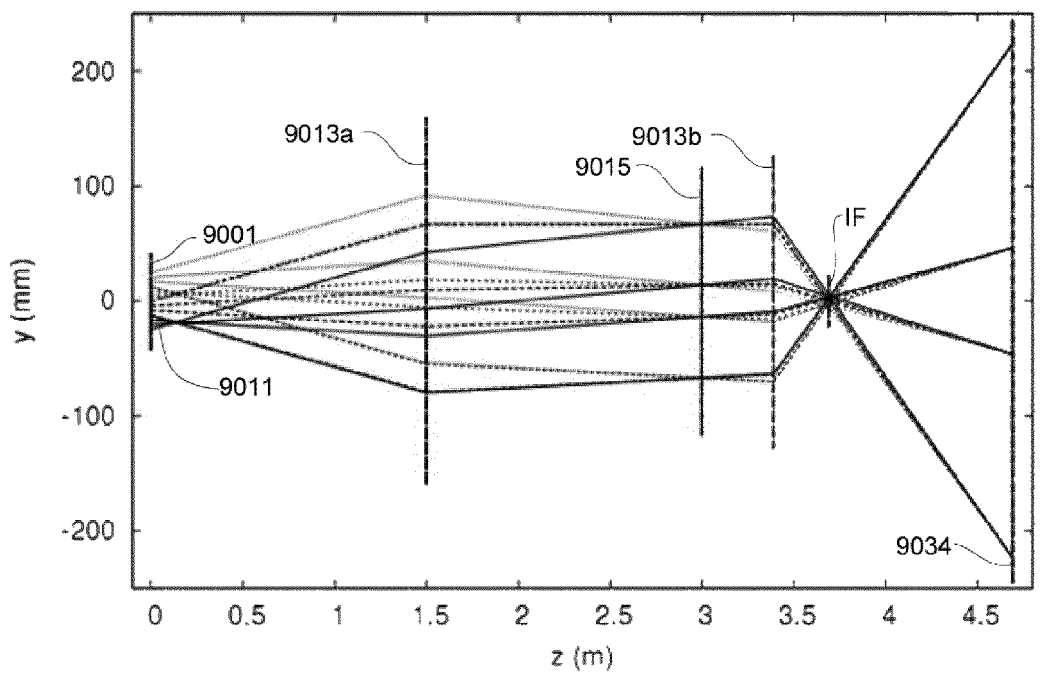

FIG. 44B is a schematic representation of an alternative embodiment of a focusing scheme which may be used to image the angular intensity profile of a modified radiation beam 9011 output from a radiation alteration device 9001 approximately onto a far field plane 9034. The focusing scheme which is shown in FIG. 44B includes a first focusing optic 9013a and a second focusing optic 9013b. The first focusing optic 9013a is arranged to focus the angular intensity profile of the modified radiation beam 9011 onto an image plane 9015. The second focusing optic 9013b is arranged to focus the image plane 9015 onto the far field plane 9034 via an intermediate focus IF. Since the image plane 9015 is imaged onto the far field plane 9034, the focusing scheme serves to image the angular profile of the modified radiation beam 9011 output from the radiation alteration device 9001 onto the far field plane 9034. The intermediate focus IF may, for example, be situated at or near to an opening in an enclosing structure of a lithographic apparatus. The far field plane 9034 may, for example, be a plane in which a field facet mirror of a lithographic apparatus is situated.

In the embodiment which is shown in FIG. 44B the image plane 9015 is situated in between the first focusing optic 9013a and the second focusing optic 9013b. In alternative embodiments the image plane 9015 may be a virtual image plane and may, for example, be situated in between the second focusing optic 9015 and the far field plane 9034. In the representation which is shown in FIG. 44B radiation in the image plane 9015 has roughly the same diameter as radiation incident on the first focusing optic 9013a. However, in other embodiments the diameter of radiation in the image plane 9015 may be smaller or larger than the diameter of the radiation incident on the first focusing optic 9013a.

Whilst the focusing scheme which is shown in FIG. 38B is represented as being formed of transmissive optics, in practice the focusing scheme may be implemented using reflective optics. The first and/or the second focusing optics 9013a, 9013b may, for example, comprise a Wolter telescope formed from a plurality of reflective shells. Alternatively the first and/or second focusing optics 9013a, 9013b may comprise a reflective surface having an approximately ellipsoidal shape. Alternatively the first and/or the second focusing optics 9013a, 9013b may comprise a plurality of reflective elements. For example, the first and/or second focusing optics 9013a, 9013b may comprise a Wolter telescope formed from two reflective elements.

The focusing schemes shown in FIGS. 44A and 44B may be used in conjunction with any of the other embodiments of radiation alteration devices described herein. Furthermore any of the other embodiments of focusing schemes described herein may be used in conjunction with a radiation alteration device of the type described with reference to FIGS. 39-43.

Figure 45:
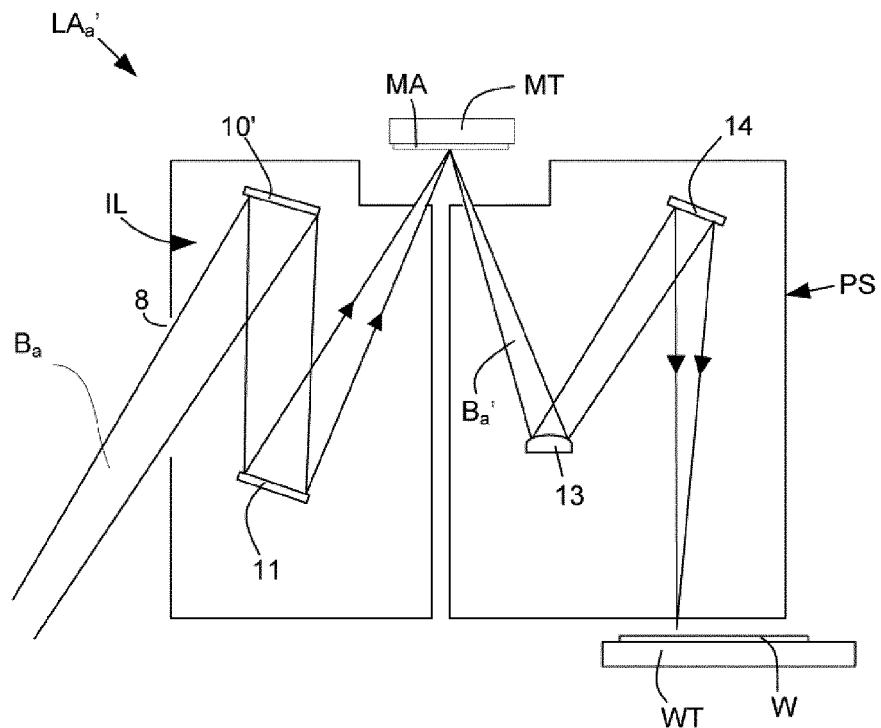
FIG. 45 is a schematic representation of an alternative embodiment of a lithographic apparatus.

Embodiments have been described throughout the description in which a modified branch radiation beam is imaged onto a far field plane through an intermediate focus IF. The intermediate focus IF may be situated at or near an opening 8 in an enclosing structure of a lithographic apparatus LA. However, in some embodiments a branch radiation beam may not be focused through an intermediate focus IF. FIG. 45 is a schematic illustration of an alternative embodiment of a lithographic apparatus $LA_a'$ which includes a relatively large opening 8 in an enclosing structure. The lithographic apparatus $LA_a'$ which is shown in FIG. 45 is similar to the lithographic apparatus $LA_a$ shown in FIG. 2. Like features in FIGS. 2 and 45 are provided with like reference numerals and the corresponding features will not be described in detail again with reference to FIG. 45.

The lithographic apparatus $LA_a'$ which is shown in FIG. 45 includes an opening 8 for accepting a branch radiation beam $B_a$ which is larger than the corresponding opening 8 which is shown in FIG. 2. Consequently, in the embodiment of FIG. 45 the branch radiation beam $B_a$ need not be focused to an intermediate focus IF in order for the branch radiation beam $B_a$ to be able to pass into the lithographic apparatus $LA_a'$. A focusing scheme which is used to image a modified branch radiation beam need not therefore focus a modified branch radiation beam $B_a$ through an intermediate focus IF.

A lithographic apparatus $LA_a'$ which is configured to accept a branch radiation beam $B_a$ which has not been focused through an intermediate focus IF, may include a field facet mirror 10' which is modified when compared to a field facet mirror 10 of a lithographic apparatus which is configured to accept a branch radiation beam $B_a$, which has not been focused through an intermediate focus IF (e.g. the field facet mirror 10 of the lithographic apparatus of FIG. 2). For example the modified field facet mirror 10' may include reflective facets having different focal lengths when compared to the field facet mirror 10 of the lithographic apparatus $LA_a$ of FIG. 2. Additionally or alternatively the orientation of the reflective facets may be different in the modified field facet mirror 10'.

Figure 46:
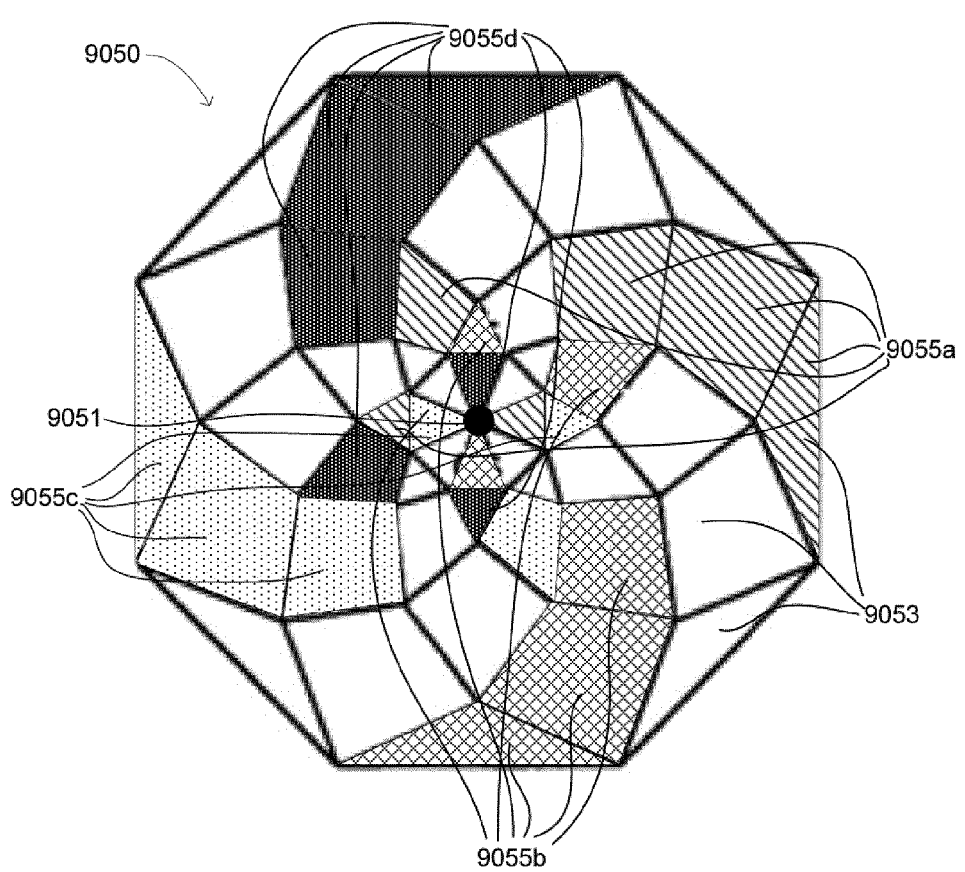
FIG. 46 is a schematic illustration of a beam splitting apparatus according to an embodiment of the invention.

As was described above, for example with reference to FIGS. 13-29 a radiation system may comprise a beam splitting apparatus configured to split a main radiation beam into a plurality of branch radiation beams. FIG. 46 is a schematic illustration of a beam splitting apparatus 9050 according to an embodiment of the invention. The beam splitting apparatus is configured to receive a main radiation beam and split the main radiation beam into a plurality of branch radiation beams. The beam splitting apparatus may be configured to receive the main radiation beam along a beam axis 9051. The beam axis extends into the page of FIG. 46. The beam splitting apparatus comprises a plurality of reflective facets 9053. A radiation beam which is incident on the beam splitting apparatus 9050 illuminates a plurality of reflective facets 9053 and may for example, illuminate substantially all of the reflective facets 9053 shown in FIG. 46.

The reflective facets 9053 form a plurality of groups 9055 of reflective facets 9053. For example, a first group of reflective facets 9055a is shown in FIG. 46 with blocks filled with diagonal lines. A second group 9055b of reflective facets 9053 is shown in FIG. 46 with blocks filled with cross-hatching. A third group 9055c of reflective facets 9053 is shown in FIG. 46 with blocks filled with black dots on a white background. A fourth group 9055d of reflective facets 9053 is shown in FIG. 46 with blocks filled with white dots on a black background. The other reflective facets 9053 which form the beam splitting apparatus 9050 form further groups of reflective facets. However, for ease of illustration the further groups of reflective facets are not specifically indicated in FIG. 46.

Each group of reflective facets 9055 comprises a plurality of reflective facets 9053 arranged to receive different portions of a radiation beam. The reflective facets 9053 which form a single group 9055 of reflective facets 9053 are arranged to reflect the different portions received by the different facets 9053 in a group 9055 so as to form a branch radiation beam comprising a combination of the different reflected portions. That is, each group 9055 of reflective facets forms a single branch radiation beam from radiation reflected from the facets 9053 which form that group 9055. For example, the first group of reflective facets 9055a reflects portions of a radiation beam so as to form a first branch radiation beam (not shown in FIG. 46). The branch radiation beam comprises a combination of the portions of the radiation beam reflected from the facets 9053 which make up the first group of facets 9055a.

Reflective facets 9053 which form a group of facets 9055 may all have substantially the same orientation. Consequently radiation which is reflected from the facets which from the group of facets 9055 propagates in substantially the same direction such that it forms a single branch radiation beam. Different groups of facets 9055 may be orientated differently such that different groups of facets 9055 reflect radiation in different directions so as to form different branch radiation beams.

As can be seen in FIG. 46, different reflective facets 9053 which form a group of reflective facets 9055 are situated in different positions in a cross-section of a radiation beam. That is a plurality of reflective facets 9053 which form a group of facets 9055 are separated from each other in a direction which is substantially perpendicular to the beam axis 9051. A branch radiation beam which is formed from reflections from reflective facets which form a group of reflective facets will therefore include different portions of the cross-section of the radiation beam which is incident on the beam splitting apparatus 9050.

It may be desirable for each branch radiation beam which is formed by a beam splitting apparatus 9050 to have substantially the same power. For example, each branch radiation beam may be supplied to a different lithographic apparatus and it may be desirable to provide each lithographic apparatus with radiation of substantially the same power. The division of the reflective facets 9053 into groups of reflective facets may be selected such that the total power of radiation which is incident on each group of reflective facets is substantially the same. Consequently each resulting branch radiation beam may have substantially the same power.

A radiation beam which is incident on the beam splitting apparatus 9050 may have a cross-sectional intensity profile which is rotationally symmetric about the beam axis 9051. For example, the cross-sectional intensity profile of the radiation beam may be approximated by a two-dimensional Gaussian. That is, the cross-sectional center of the radiation beam (which may coincide with the beam axis 9051) may have the highest intensity of radiation. The intensity of radiation may decrease with increasing radial distance from the cross-sectional center. The decrease of the intensity with increasing radial distance may substantially follow a Gaussian distribution.

As is shown in FIG. 46 the arrangement of reflective facets 9053 (in the plane of the page, which is perpendicular to the beam axis 9051) which form the second group of facets 9055b is substantially the same as a rotation (about the beam axis 9051) of the arrangement of the reflective facets 9053 which form the first group 9055a of reflective facets. The cross-sectional portion of the radiation beam which is reflected by the second group of reflective facets 9055b, and which forms a second branch radiation beam, is thus a rotation (about the beam axis 9051) of the cross-sectional portion of the radiation beam which is reflected by the first group of reflective facets 9055a, and which forms a first branch radiation beam. If the cross-sectional intensity profile of the radiation beam which is incident on the beam splitting apparatus 9050 is substantially rotationally symmetric (about the beam axis 9051), then the total power of radiation which is incident on the first group 9055a of facets will be substantially the same as the total power of radiation which is incident on the second group 9055b of facets. The power of the first branch radiation beam will therefore be substantially the same as the power of the second branch radiation beam.

In the embodiment of FIG. 46 each group of reflective facets 9055 comprises an arrangement of reflective facets 9053 which is substantially the same as a rotation of an arrangement of reflective facets 9053 which forms another group of reflective facets 9055. Furthermore, each group of reflective facets 9055 comprises an arrangement of reflective facets 9053 which is substantially the same as a different rotation of an arrangement of reflective facets 9053 which forms every other group of reflective facets 9055. The rotation is a rotation about the beam axis 9051. If the cross-sectional intensity profile of the radiation beam which is incident on the beam splitting apparatus 9050 is substantially rotationally symmetric (about the beam axis 9051), then the total power of radiation which is incident on each group of facets will be substantially the same. The power of each branch radiation beam will therefore be substantially the same.

References herein to an arrangement of reflective facets 9053 which form a group of reflective facets 9055 is intended to refer to a positioning of the reflective facets in the path of the radiation beam. For example, the arrangement of reflective facets 9053 which form a group of reflective facets 9055 may refer to a positioning of the reflective facets in a cross-section of the radiation beam. References to an arrangement of facets being substantially the same as a rotation of another arrangement of facets is merely intended to refer to the positioning of the facets and not to the orientation of the facets. That is, a rotation of a first group of facets may result in facets which have a different orientation to a second group of facets such that the rotation of the first group of facets may reflect radiation in a different direction to the second group of facets. However, if the rotation of the first group of facets results in facets in substantially the same position as the second group of facets then the arrangement of the second group of facets may still be considered to be substantially the same as a rotation of the arrangement of the first group of facets.

The facets 9053 which form a group of reflective facets 9055 may be situated at substantially the same location along the beam axis 9051. Furthermore the different groups of reflective facets 9055 may be situated at substantially the same location along the beam axis 9051. References herein to facets being situated at substantially the same location along the beam axis 9051 is not intended to mean that each of facets 9053 is situated in the same plane but merely that there is no large separation between the facets along the beam axis 9051.

As can be seen in FIG. 46, some of the reflective facets 9053 from different groups of reflective facets 9055 are situated adjacent to each other. Some of the reflective facets 9053 from different groups if reflective facets 9055 may be in contact with each other. The facets 9053 which form the beam splitting apparatus 9050 may, for example, form a single piece of apparatus. This may assist in manufacturing the beam splitting apparatus and may assist in aligning and orientating the reflective facets 9053 relative to the radiation beam. For example, the alignment and orientation of the reflective facets 9053 may be controlled by controlling the alignment and orientation of the beam splitting apparatus as a whole.

In some embodiments the relative positioning and orientation of the facets 9053 which form the beam splitting apparatus may be fixed. In other embodiments the relative orientation of the facets 9053 which form the beam splitting apparatus 9050 may be adjustable. For example, the beam splitting apparatus may comprise one or more actuators which are operable to alter the orientation of one or more of the facets 9053.

In the embodiment which is shown in FIG. 46, each group of reflective facets 9055 is formed from six different facets. The beam splitting apparatus 9050 comprises eight different groups of reflective facets 9055 which will therefore result in eight different branch radiation beams. In other embodiments a beam splitting apparatus may be formed from more or less than eight groups of reflective facets. Each group of reflective facets may comprise more or less than six different facets.

The arrangement of reflective facets which form different groups of reflective facets shown in FIG. 46 is merely an example of a possible arrangement. Other arrangements of facets which form groups of facets as described above may instead be used and may result in the same or similar advantageous effects described above in connection with the embodiment of FIG. 46.

Figure 47A:
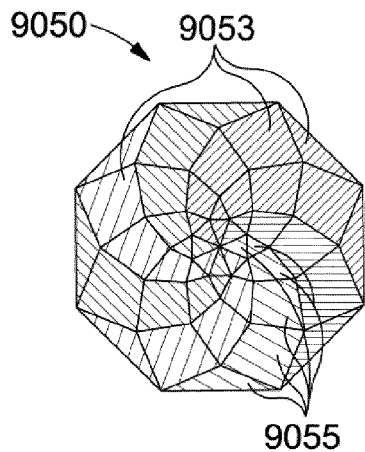
FIGS. 47A, 47B and 47C are schematic illustrations of alternative embodiments of a beam splitting apparatuses according to the invention.
Figure 47B:
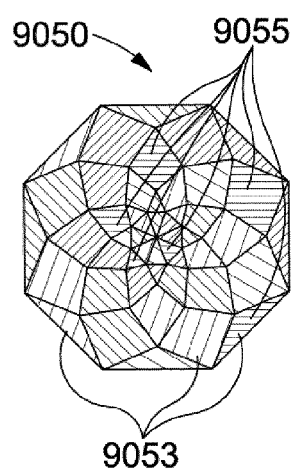
Figure 47C:
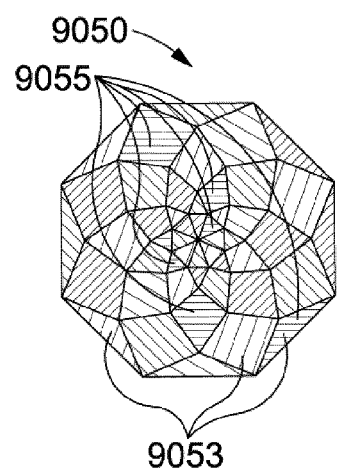

FIGS. 47A-47C are schematic illustrations of alternative embodiments of a beam splitting apparatus 9050. Each beam splitting apparatus 9050 comprises a plurality of reflective facets 9053 organized into groups of reflective facets 9055. The groups of reflective facets 9055 have the same properties which were described above with reference to FIG. 46 but a distributed about the beam splitting apparatuses 9050 differently. In the representations shown in FIGS. 47A-47C facets 9053 which belong to the same group of facets 9055 are provided with the same shading. For ease of illustration not all of the different groups of reflective facets in FIGS. 47A-47C are labelled.

Figure 48:
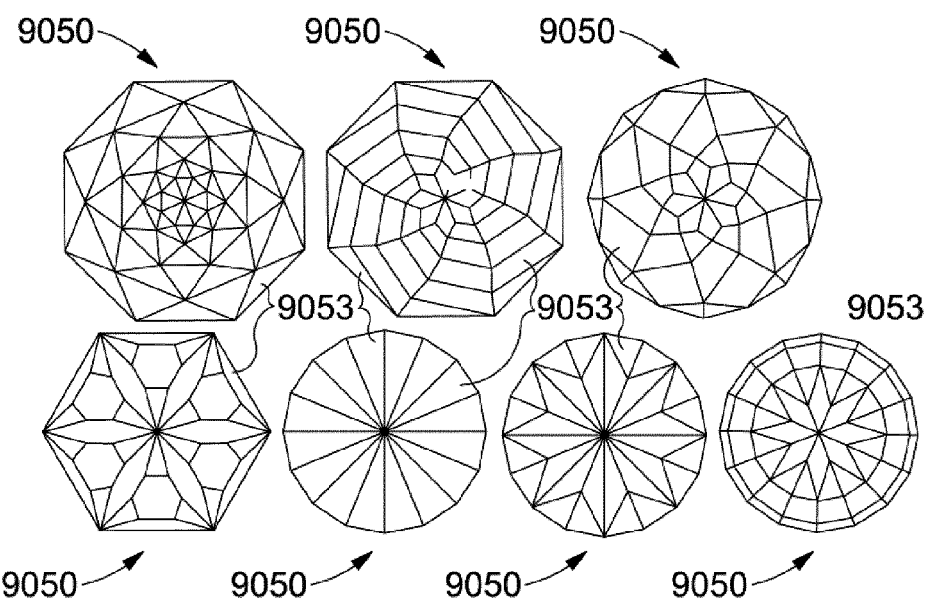
FIG. 48 is a schematic illustration of further alternative embodiments of a beam splitting apparatuses according to the invention.

FIG. 48 is a schematic illustration of a further seven possible layouts of reflective facets 9053 which may form a beam splitting apparatus 9050 comprising a plurality of groups of reflect facets 9053 as described above. In the embodiments which are shown in FIG. 48, the arrangement of facets 9053 into groups of facets 9055 is not shown.

However, it will be appreciated that the facets 9053 which form any of the embodiments shown in FIG. 48 may be arranged to form groups of facets as was described above with reference to FIG. 48.

A beam splitting apparatus 9050 of the form described above with reference to FIGS. 46-48 may be used in conjunction with a radiation alteration device described herein. For example, one or more of the branch radiation beams provided by the beam splitting apparatus 9050 may be modified with a radiation alteration device. Additionally or alternatively a main radiation beam may be modified with a radiation alteration device prior to the main radiation beam being incident on a beam splitting apparatus 9050.

Various embodiments of a radiation alteration device comprising a plurality of reflective facets have been described above. A radiation alteration device comprising a plurality of reflective facets may be used similarly to a radiation alteration device comprising a tube having first and second openings (as was described with reference to FIGS. 1-23). For example, a radiation alteration device comprising a plurality of reflective facets may be arranged to receive and modify a branch radiation beam $B_a$ prior to the branch radiation beam $B_a$ being provided to a lithographic apparatus LA. Additionally or alternatively a radiation alteration device comprising a plurality of reflective facets may be arranged to receive a main radiation beam B from a radiation source SO prior to the beam radiation beam B being provided to a beam splitting apparatus.

A radiation alteration device comprising a plurality of reflective facets may, in some applications, provide one or more advantages when compared to a radiation alteration device comprising a tube having a reflective internal surface. For example, a radiation alteration device comprising a plurality of reflective facets may occupy less space than a radiation alteration device comprising a tube. This may in particular simplify the arrangement of a lithographic system in which a radiation alteration device is provided to modify each of a plurality of branch radiation beams, since the total space which is occupied by radiation alteration devices may be significantly reduced.

Additionally or alternatively a radiation alteration device which comprises a plurality of reflective facets may be easier and/or cheaper to manufacture and/or clean than a radiation alteration device comprising a tube having a reflective internal surface. For example, the total surface area of reflective facets which form a radiation alteration device may be less than the total surface area of a reflective internal surface which forms a radiation alteration device. Consequently it may be easier and/or cheaper to manufacture and/or clean a radiation alteration device comprising a tube having a reflective internal surface.

The reflective facets which form a radiation alteration device may, for example, be manufactured separately and combined into a single element. The reflective facets may be manufactured by electroforming a reflective material onto a substrate. For example, the reflective facets may be manufactured by electroforming nickel onto a substrate.

Whilst embodiments of a radiation source SO have been described and depicted as comprising a free electron laser FEL, a radiation source SO may include a source of radiation other than a free electron laser FEL.

It should be appreciated that a radiation source which comprises a free electron laser FEL may comprise any number of free electron lasers FEL. For example, a radiation source may comprise more than one free electron laser FEL. For example, two free electron lasers may be arranged to provide EUV radiation to a plurality of lithographic apparatus. This is to allow for some redundancy. This may allow one free electron laser to be used when the other free electron laser is being repaired or undergoing maintenance.

A lithographic system LS may comprise any number of lithographic apparatus. The number of lithographic apparatus which form a lithographic system LS may, for example, depend on the amount of radiation which is output from a radiation source SO and on the amount of radiation which is lost in a beam delivery system BDS. The number of lithographic apparatus which form a lithographic system LS may additionally or alternatively depend on the layout of a lithographic system LS and/or the layout of a plurality of lithographic systems LS.

Embodiments of a lithographic system LS may also include one or more mask inspection apparatus MIA and/or one or more Aerial Inspection Measurement Systems (AIMS). In some embodiments, the lithographic system LS may comprise a plurality of mask inspection apparatuses to allow for some redundancy. This may allow one mask inspection apparatus to be used when another mask inspection apparatus is being repaired or undergoing maintenance. Thus, one mask inspection apparatus is always available for use. A mask inspection apparatus may use a lower power radiation beam than a lithographic apparatus. Further, it will be appreciated that radiation generated using a free electron laser FEL of the type described herein may be used for applications other than lithography or lithography related applications.

It will be further appreciated that a free electron laser comprising an undulator as described above may be used as a radiation source for a number of uses, including, but not limited to, lithography.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

The lithographic apparatus which have been described herein may be used in the manufacture of ICs. Alternatively, the lithographic apparatuses described herein may have other applications. Possible other applications include the manufacture of integrated optical systems, guidance and detection patterns for magnetic domain memories, flat-panel displays, liquid-crystal displays (LCDs), thin-film magnetic heads, etc.

Different embodiments may be combined with each other. Features of embodiments may be combined with features of other embodiments.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A radiation alteration device comprising:
   a first diffusing element comprising a first roughened reflective surface;
   a second diffusing element comprising a second roughened reflective surface having surface roughness; and
   one or more actuators configured to move the first and/or second diffusing elements so as to cause movement of the first and/or the second roughened reflective surfaces, wherein the first roughened reflective surface is configured to receive a radiation beam and reflect the radiation beam along a propagation direction so as to be incident on the second roughened reflective surface, wherein the second roughened reflective surface is arranged to reflect the radiation beam received from the first roughened reflective surface so as to form a modified radiation beam, and wherein the surface roughness of at least the second roughened reflective surface is arranged to cause optical diffusion of the radiation beam and the surface roughness comprises a plurality of protrusions and/or indentations arranged at different locations along the propagation direction.

2. The radiation alteration device of claim 1, wherein one or more actuators are configured to rotate the first and/or second diffusing element so as to cause rotation of the first and/or the second roughened reflective surface.

3. The radiation alteration device of claim 1, wherein the one or more actuators are configured to cause the first and/or second roughened reflective surface to move at a speed of about 1 meter per second or more.

4. The radiation alteration device of claim 1, wherein the second roughened reflective surface is arranged approximately perpendicular to the first roughened reflective surface.

5. The radiation alteration device of claim 1, wherein the first and/or second roughened reflective surface is arranged to receive radiation at a grazing incidence angle of about 5 degrees or less.

6. The radiation alteration device of claim 1, wherein the first and/or second roughened reflective surface includes indentations which cause the respective roughened reflective surface to deviate from a flat plane.

7. The radiation alteration device of claim 6, wherein a maximum angle which the first and/or the second roughened reflective surface forms with the flat plane, is less than or equal to about 10 milliradians.

8. The radiation alteration device of claim 1, wherein the first and/or second roughened reflective surface each serve to introduce an angular spread into the radiation beam.

9. The radiation alteration device of claim 1, wherein the first and/or second roughened reflective surface comprises ruthenium and/or molybdenum.

10. A radiation system comprising:
a radiation source configured to emit radiation; and
the radiation alteration device of claim 1 configured to receive a radiation beam comprising at least a portion of the radiation emitted by the radiation source.

11. A lithographic system comprising:
a radiation system according to claim 10; and
a lithographic apparatus arranged to receive at least a portion of a radiation beam which exits the radiation alteration device.

12. The lithographic system of claim 11, wherein the lithographic apparatus includes an illumination system configured to condition at least a portion of the radiation beam which exits the radiation alteration device, the illumination system including a facet mirror and wherein the radiation system comprises at least one focusing optic configured to focus the radiation beam which is provided to the lithographic apparatus so as to form an image of the radiation beam output from the radiation alteration device onto the facet mirror, and wherein the facet mirror comprises a plurality of reflective facets.

13. A method comprising:
reflecting a radiation beam along a propagation direction at a first element comprising a first roughened reflective surface;
reflecting the radiation beam, which is reflected at the first element, at a second element comprising a second roughened reflective surface having surface roughness; and
moving the first and/or second element so as to cause movement of the respective first and/or the second roughened reflective surface so as to form a modified radiation beam,
wherein the surface roughness of at least the second roughened reflective surface is arranged to cause optical diffusion of the radiation beam and the surface roughness comprises a plurality of protrusions and/or indentations arranged at different locations along the propagation direction.

14. The method of claim 13, wherein the moving comprises rotating the first and/or second element so as to cause rotation of the first and/or the second roughened reflective surface.

15. The method of claim 13, wherein the moving comprises moving the first and/or second roughened reflective surface at a speed of about 1 meter per second or more.

16. The method of claim 13, wherein the second roughened reflective surface is arranged approximately perpendicular to the first roughened reflective surface.

17. The method of claim 13, comprising receiving radiation at a grazing incidence angle of about 5 degrees or less at the first and/or second roughened reflective surface.

18. The method of claim 13, wherein the first and/or second roughened reflective surface includes indentations which cause the respective roughened reflective surface to deviate from a flat plane.

19. The method of claim 18, wherein a maximum angle which the first and/or the second roughened reflective surface forms with the flat plane, is less than or equal to about 10 milliradians.

20. The method of claim 13, wherein the first and/or second roughened reflective surface each serve to introduce an angular spread into the radiation beam.

* * * * *

UNITED STATES PATENT AND TRADEMARK OFFICE
CERTIFICATE OF CORRECTION

| | | |
|---|---|---|
| PATENT NO. | : 11,984,236 B2 | Page 1 of 1 |
| APPLICATION NO. | : 16/743025 | |
| DATED | : May 14, 2024 | |
| INVENTOR(S) | : Han-Kwang Nienhuys et al. | |

It is certified that error appears in the above-identified patent and that said Letters Patent is hereby corrected as shown below:

On the Title Page

Item (72) Inventors:
Please correct "Han-Kwang NIENHUYS, Veldhoven (NL)" to "Han-Kwang NIENHUYS, Utrecht (NL)"

Signed and Sealed this
Twenty-fifth Day of June, 2024

Katherine Kelly Vidal
*Director of the United States Patent and Trademark Office*